United States Patent
He et al.

(10) Patent No.: US 11,796,472 B2
(45) Date of Patent: Oct. 24, 2023

(54) CONTROL OF THE ELECTROSTATIC POTENTIAL OF NANOPARTICLES

(71) Applicant: Northwestern University, Evanston, IL (US)

(72) Inventors: Chen He, Chicago, IL (US); David J. Weinberg, San Diego, CA (US); Emily A. Weiss, Evanston, IL (US); Jeremiah Yoonsung Kim, Glenview, IL (US); Chen Wang, Evanston, IL (US); Andrew Lee, Evanston, IL (US)

(73) Assignee: Northwestern University, Evanston, IL (US)

( * ) Notice: Subject to any disclaimer, the term of this patent is extended or adjusted under 35 U.S.C. 154(b) by 178 days.

(21) Appl. No.: 17/505,392

(22) Filed: Oct. 19, 2021

(65) Prior Publication Data

US 2022/0042911 A1    Feb. 10, 2022

Related U.S. Application Data

(62) Division of application No. 16/017,766, filed on Jun. 25, 2018, now Pat. No. 11,150,185.
(Continued)

(51) Int. Cl.
| | |
|---|---|
| G01N 21/64 | (2006.01) |
| C01G 21/21 | (2006.01) |
| H10K 50/115 | (2023.01) |
| B82Y 40/00 | (2011.01) |
| B82Y 20/00 | (2011.01) |
| B82Y 15/00 | (2011.01) |

(52) U.S. Cl.
CPC ......... *G01N 21/6428* (2013.01); *C01G 21/21* (2013.01); *G01N 21/6489* (2013.01); *H10K 50/115* (2023.02); *B82Y 15/00* (2013.01); *B82Y 20/00* (2013.01); *B82Y 40/00* (2013.01); *C01P 2004/64* (2013.01); *G01N 2021/6432* (2013.01)

(58) Field of Classification Search
CPC ....... G01N 21/6428; G01N 2021/6432; G01N 21/6489; H10K 50/115; B82Y 15/00; B82Y 20/00; C01P 2004/64
See application file for complete search history.

(56) References Cited

U.S. PATENT DOCUMENTS

| | | | |
|---|---|---|---|
| 11,150,185 B2 * | 10/2021 | He | G01N 21/6428 |
| 2009/0270269 A1 * | 10/2009 | Kumar | G01N 33/542 |
| | | | 506/9 |

(Continued)

OTHER PUBLICATIONS

Walker, D. A. et al. "Electrostatics at the nanoscale." Nanoscale 3.4 (2011): 1316-1344.
(Continued)

*Primary Examiner* — Brian J. Sines
(74) *Attorney, Agent, or Firm* — QUARLES & BRADY LLP

(57) ABSTRACT

The present technology is directed to the nanoparticles for use as molecular environmental sensors. The nanoparticles comprise a photoluminescence core and a plurality of ligands bound to the core and forming a quencher permeable ligand shell. The ligands comprise a reactive or charged moiety capable of being modulated between a first stand and a second state, and the proportion of ligands in each state determine the permeability of the ligand shell to a photoluminescence quencher.

18 Claims, 20 Drawing Sheets

Related U.S. Application Data

(60) Provisional application No. 62/523,980, filed on Jun. 23, 2017.

(56) References Cited

U.S. PATENT DOCUMENTS

| | | | |
|---|---|---|---|
| 2010/0264333 A1 | 10/2010 | Offermans | |
| 2011/0049442 A1* | 3/2011 | Schreuder | C09K 11/025 252/519.2 |
| 2011/0177619 A1 | 7/2011 | Metters | |
| 2011/0207232 A1* | 8/2011 | Ostafin | G01N 33/587 977/773 |
| 2017/0189879 A1* | 7/2017 | Simsek | B01J 13/04 |
| 2019/0250101 A1* | 8/2019 | Li | C23C 16/305 |

OTHER PUBLICATIONS

Wang, D, et al. "How and Why Nanoparticle's Curvature Regulates the Apparent p K a of the Coating Ligands." Journal of the American Chemical Society 133.7 (2011): 2192-2197.

Weinberg, D. J. et al. "Control of the redox activity of quantum dots through introduction of fluoroalkanethiolates into their ligand shells." Journal of the American Chemical Society 138.7 (2016): 2319-2326.

Weiss, E. A., "Designing the surfaces of semiconductor quantum dots for colloidal photocatalysis." ACS Energy Letters 2.5 (2017): 1005-1013.

Yao, J. et al. "Chemistry, biology, and medicine of fluorescent nanomaterials and related systems: new insights into biosensing, bioimaging, genomics, diagnostics, and therapy." Chemical reviews 114.12 (2014): 6130-6178.

Zhan, N., et al. "Multidentate zwitterionic ligands provide compact and highly biocompatible quantum dots." Journal of the American Chemical Society 135.37 (2013): 13786-13795.

Zhu, H. et al "Controlling charge separation and recombination rates in CdSe/ZnS type I core—shell quantum dots by shell thicknesses." Journal of the American Chemical Society 132.42 (2010): 15038-15045.

Zhu, H. et al. "Charge transfer dynamics from photoexcited semiconductor quantum dots." Annual review of physical chemistry 67 (2016): 259-281.

Zhu, H., et al. "Wave function engineering for efficient extraction of up to nineteen electrons from one CdSe/CdS quasi-type II quantum dot." Journal of the American Chemical Society 134.9 (2012): 4250-4257.

Aruda, K. O., et al. "Temperature-dependent permeability of the ligand shell of PbS quantum dots probed by electron transfer to benzoquinone." The journal of physical chemistry letters 6.14 (2015): 2841-2846.

Bishop, KJM, et al. ""Nanoions": fundamental properties and analytical applications of charged nanoparticles." ChemPhysChem 8.15 (2007): 2171-2176.

Bishop, KJM, et al. "Nanoscale forces and their uses in self-assembly." small 5.14 (2009): 1600-1630.

Borukhov, I. et al. "Steric effects in electrolytes: A modified Poisson-Boltzmann equation." Physical review letters 79.3 (1997): 435.

Bruchez, M., et al. "Semiconductor nanocrystals as fluorescent biological labels." science 281.5385 (1998): 2013-2016.

Campiña, J. M., et al. "Selective permeation of a liquidlike self-assembled monolayer of 11-amino-1-undecanethiol on polycrystalline gold by highly charged electroactive probes." The Journal of Physical Chemistry C 111.14 (2007): 5351-5362.

Chan, WCW, et al. "Quantum dot bioconjugates for ultrasensitive nonisotopic detection." Science 281.5385 (1998): 2016-2018.

Degefa, T. H., et al. "Elucidation of the electron transfer mechanism of marker ions at SAMs with charged head groups." Journal of Electroanalytical Chemistry 574.1 (2004): 49-62.

Ding, T. X., et al. "Efficiency of hole transfer from photoexcited quantum dots to covalently linked molecular species." Journal of the American Chemical Society 137.5 (2015): 2021-2029.

Donakowski, M. D., et al. "A quantitative description of the binding equilibria of para-substituted aniline ligands and CdSe quantum dots." The Journal of Physical Chemistry C 114.51 (2010): 22526-22534.

Faraudo, J. et al. "The many origins of charge inversion in electrolyte solutions: effects of discrete interfacial charges." The Journal of Physical Chemistry C 111.2 (2007): 987-994.

Guerrero-García, GI, et al. "Effects of the ionic size-asymmetry around a charged nanoparticle: unequal charge neutralization and electrostatic screening." Soft Matter 6.9 (2010): 2056-2065.

Guo, P. et al. "Electrostatic-driven ridge formation on nanoparticles coated with charged end-group ligands." The Journal of Physical Chemistry C 115.14 (2011): 6484-6490.

Han, H. S. et al. "Spatial charge configuration regulates nanoparticle transport and binding behavior in vivo." Angewandte Chemie International Edition 52.5 (2013): 1414-1419.

Harris, R. D. et al. "Electronic processes within quantum dot-molecule complexes." Chemical reviews 116.21 (2016): 12865-12919.

He, Chen, et al. "Control of the redox activity of PbS quantum dots by tuning electrostatic interactions at the quantum dot/solvent interface." Journal of the American Chemical Society 138.28 (2016): 8847-8854.

He, Chen, et al. "Noncovalent Control of the Electrostatic Potential of Quantum Dots through the Formation of Interfacial Ion Pairs." Journal of the American Chemical Society 139.29 (2017): 10126-10132.

He, Chen, et al. "Reversible Modulation of the Electrostatic Potential of a Colloidal Quantum Dot through the Protonation Equilibrium of Its Ligands." The journal of physical chemistry letters 8.20 (2017): 4981-4987.

Hines, Ma et al. "Colloidal PbS nanocrystals with size-tunable near-infrared emission: observation of post-synthesis self-narrowing of the particle size distribution." Advanced Materials 15.21 (2003): 1844-1849.

Hong, R., et al. "Monolayer-controlled substrate selectivity using noncovalent enzyme—nanoparticle conjugates." Journal of the American Chemical Society 126.42 (2004): 13572-13573.

Howes, PD.,et al. "Colloidal nanoparticles as advanced biological sensors." Science 346.6205 (2014): 1247390.

Hyun, B.-R. et al. "Near-infrared fluorescence imaging with water-soluble lead salt quantum dots." The Journal of Physical Chemistry B 111.20 (2007): 5726-5730.

IP, A. H. et al. "Hybrid passivated colloidal quantum dot solids." Nature nanotechnology 7.9 (2012): 577.

Jensen, SC., et al. "Photocatalytic conversion of nitrobenzene to aniline through sequential proton-coupled one-electron transfers from a cadmium sulfide quantum dot." Journal of the American Chemical Society 138.5 (2016): 1591-1600.

Ji, X et al. "Ligand bonding and dynamics on colloidal nanocrystals at room temperature: the case of alkylamines on CdSe nanocrystals." Journal of the American Chemical Society 130.17 (2008): 5726-5735.

Jiang, Y.; et al. "The interplay of size and surface functionality on the cellular uptake of sub-10 nm gold nanoparticles." ACS nano 9.10 (2015): 9986-9993.

Kalsin, A. M., et al. "Studying the thermodynamics of surface reactions on nanoparticles by electrostatic titrations." Journal of the American Chemical Society 129.21 (2007): 6664-6665.

Knowles, K. E. et al. "Electron transfer as a probe of the permeability of organic monolayers on the surfaces of colloidal PbS quantum dots." The Journal of Physical Chemistry C 117.30 (2013): 15849-15857.

Knowles, K. E. et al. "Exciton dissociation within quantum dot-organic complexes: Mechanisms, use as a probe of interfacial structure, and applications." The Journal of Physical Chemistry C 117.20 (2013): 10229-10243.

Knowles, Ke et al. "Dual-time scale photoinduced electron transfer from PbS quantum dots to a molecular acceptor." Journal of the American Chemical Society 134.30 (2012): 12470-12473.

Lee, A., et al. "Denaturation of proteins by SDS and tetraalkylammonium dodecyl sulfates." Langmuir 27.18 (2011): 11560-11574.

(56) References Cited

OTHER PUBLICATIONS

Liu et al., Compact Biocompatible Quantum Dots Functionalized for Cellular Imaging. J. Am. Chem. Soc. 2008, 130, 1274-1284.
Love, J. C. et al. "Self-assembled monolayers of thiolates on metals as a form of nanotechnology." Chemical reviews 105.4 (2005): 1103-1170.
Malicki, M. et al "Gating of hole transfer from photoexcited PbS quantum dots to aminoferrocene by the ligand shell of the dots." Chemical Communications 49.39 (2013): 4400-4402.
Mattoussi, H et al. "Self-assembly of CdSe—ZnS quantum dot bioconjugates using an engineered recombinant protein." Journal of the American Chemical Society 122.49 (2000): 12142-12150.
Medintz, I. L. et al. "Quantum dot bioconjugates for imaging, labelling and sensing." Nature materials 4.6 (2005): 435.
Mizuhara, T. et al. "Acylsulfonamide-Functionalized Zwitterionic Gold Nanoparticles for Enhanced Cellular Uptake at Tumor pH." Angewandte Chemie International Edition 54.22 (2015): 6567-6570.
Moreels, I et al. "Size-dependent optical properties of colloidal PbS quantum dots." ACS nano 3.10 (2009): 3023-3030.
Morris-Cohen, A. J. et al. ""Chemical, structural, and quantitative analysis of the ligand shells of colloidal quantum dots."" Chemistry of Materials 25.8 (2012): 1155-1165.
Morris-Cohen, A. J. et al. "Model for adsorption of ligands to colloidal quantum dots with concentration-dependent surface structure." ACS nano 6.1 (2011): 557-565.
Morris-Cohen, A. J. et al. "Simultaneous determination of the adsorption constant and the photoinduced electron transfer rate for a CdS quantum dot-viologen complex." Journal of the American Chemical Society 133.26 (2011): 10146-10154.
Muro et al., et al. "Small and stable sulfobetaine zwitterionic quantum dots for functional live-cell imaging." Journal of the American Chemical Society 132.13 (2010): 4556-4557.
Pasche, S. et al. "Effects of ionic strength and surface charge on protein adsorption at PEGylated surfaces." The Journal of Physical Chemistry B 109.37 (2005): 17545-17552.
Peterson, M. D. et al. "Mechanisms for adsorption of methyl viologen on CdS quantum dots." ACS nano 8.3 (2014): 2826-2837.
Pillai, P. P. et al. "Controlled pH stability and adjustable cellular uptake of mixed-charge nanoparticles." Journal of the American Chemical Society 135.17 (2013): 6392-6395.
Pillai, P. P. et al. "Electrostatic titrations reveal surface compositions of mixed, on-nanoparticle monolayers comprising positively and negatively charged ligands." The Journal of Physical Chemistry C 120.7 (2016): 4139-4144.
Pillai, P. P. et al. "Engineering Gram Selectivity of Mixed-Charge Gold Nanoparticles by Tuning the Balance of Surface Charges." Angewandte Chemie International Edition 55.30 (2016): 8610-8614.
Rao, A. et al. "Regulation of interparticle forces reveals controlled aggregation in charged nanoparticles." Chemistry of Materials 28.7 (2016): 2348-2355.
Tagliazucchi, M. et al. "Ligand-controlled rates of photoinduced electron transfer in hybrid CdSe nanocrystal/poly (viologen) films." ACS nano 5.12 (2011): 9907-9917.
Uyeda et al., Synthesis of Compact Multidentate Ligands to Prepare Stable Hydrophilic Quantum Dot Fluorophores. J. Am. Chem. Soc. 2005, 127, 3870-3878.

\* cited by examiner

CONTROL OF THE ELECTROSTATIC POTENTIAL OF NANOPARTICLES

CROSS-REFERENCE TO RELATED APPLICATIONS

This application is a divisional application of U.S. application Ser. No. 16/017,766, filed 25 Jun. 2018 and issued as U.S. Pat. No. 11,150,185 on 19 Oct. 2021, that claims benefit of priority to U.S. Provisional Application No. 62/523,980, filed 23 Jun. 2017, the contents of each are incorporated herein by reference in their entireties.

STATEMENT OF GOVERNMENT SUPPORT

This invention was made with government support under R21 GM127919 awarded by the National Institutes of Health (NIH) and CHE 1664184, CHE 1400596, and DMR 1121262 awarded by the National Science Foundation (NSF). The government has certain rights in the invention.

FIELD OF INVENTION

The present technology is related to nanoparticles having a controllable electrostatic potential and methods of preparation and use. More specifically the present technology is related to environmental sensors comprising nanoparticles that have a permeable ligand shell composed of reactive or charged moieties that may be modulated between states in response to its molecular environment.

BACKGROUND

Colloidal quantum dots (QDs), synthesized with wet chemical methods, form a class of highly versatile, solution-processable nanoscale building blocks for bottom-up fabrication of hierarchical structures with wide-spread potential applications, such as solid state electronics, solar cells, photocatalysts and biological tags. The performance of QDs in any of these applications depends on controlling their interactions with small molecules and ions that, for example, quench their photoluminescence (PL) through charge or energy transfer, corrode their surfaces through reactions with surface ions or ligands, or induce aggregation of particles. One method for maximizing the interaction of QDs with specified molecules and minimizing non-specific interactions is to use the self-assembled monolayer (SAM) that serves as the ligand shell for the QD as a semi-permeable membrane, and, ultimately, a molecular recognition layer. An important technique to create selectively permeable membranes is to make them electrically charged. The density and type of these charges control the electrostatic potential at the membrane-solvent interface. As a result, there is a need for new and improved methods for controlling the electrostatic potential of nanoparticles at the surface.

SUMMARY OF THE INVENTION

Disclosed herein sensors for monitoring chemical and biological process. The sensors detect changes in the molecular environment by modulating between reactive or charged states. The sensors comprise a photoluminescence quencher and a nanoparticle. The nanoparticle comprises a photoluminescent core and plurality of reactive ligands bound to the core and forming a quencher permeable ligand shell surrounding the core. Each of the reactive ligands comprise a reactive moiety capable of being modulated between a first state and a second state and an anchoring group for binding the ligand to the core, and the permeability of the ligand shell is determined by the proportion of the ligands in a first state and a second state. The nanoparticle may further comprise a diluent ligand, a solubilizing ligand, or both the diluent ligand and the solubilizing ligand.

In some embodiments, the reactive moiety comprises an anionic charge in the first state and a neutral charge in the second state. In other embodiments, the reactive moiety comprises a cationic charge in the first state and a neutral charge in the second state.

In some embodiments, the reactive ligand comprises a radical of formula A-T-R. A may comprises the anchoring group and the anchoring group is selected from the group consisting of a alkylmonothiolate, a alkyldithiolate, or an alkyl trithiolate. R may comprise a reactive moiety selected from the group consisting of a carboxyl, a hydroxyl, a sulfo, a sulfhydryl, a phosphoryl, a phosphate and a conjugate base thereof or a reactive moiety selected from the group consisting of a substituted or unsubstituted amine or alkylamine, a substituted or unsubstituted imidazole, a substituted or unsubstituted benzimidazole, a substituted or unsubstituted pyrimidine, a substituted or unsubstituted purine, a substituted or unsubstituted pyridine, a substituted or unsubstituted pyrrolidine, and a conjugate acid thereof. T may comprise a tether comprising —$(CH_2)_n$— where n is an integer and n=1-15, —$(CH_2)_n(CONH)(CH_2)_m$— where n and m are integers and n+m=1-15, or —$(OCH_2CH_2)_n$— where n is an integer and n=1-100.

In some embodiments, the quencher comprises an anionic charge or cationic charge. In some embodiments, the quencher comprises 9,10-anthraquinone-2-sulfonate, rhodamine B, or methyl propyl viologen.

In some embodiments, the sensor further comprises a flexible tether for tethering the quencher to the nanoparticle. In certain embodiments, the quencher comprises a radical of formula A-T-Q. A may comprises the anchoring group and the anchoring group is selected from the group consisting of a alkylmonothiolate, a alkyldithiolate, or an alkyl trithiolate. Q may comprise an aromatic moiety capable of accepting an electron from the core. T may comprises a tether comprising —$(CH_2)_n$— where n is an integer and n=1-15 —$(CH_2)_n(CONH)(CH_2)_m$— where n and m are integers and n+m=1-15, or —$(OCH_2CH_2)_n$— where n is an integer and n=1-100. I certain embodiments, the aromatic moiety comprises 9,10-anthraquinone-2-sulfonate, rhodamine B, or methyl propyl viologen.

In some embodiments, the first state is a first protonation state and the second state is a second protonation state. In other embodiments, the first state is an acetylated state and the second state is a deacetylated state.

Another aspect of the invention provides for environmental sensor comprising a photoluminescence quencher and a nanoparticle comprising a photoluminescent core and plurality of charged ligands bound to the core and forming a quencher permeable ligand shell surrounding the core. Each of the charged ligands comprises a charged moiety capable of being modulated between a first state and a second state and an anchoring group for binding the ligand to the core, and the permeability of the ligand shell is determined by the proportion of the ligands in a first state and a second state. In some embodiments, the first state is a first protonation state and the second state is a second protonation state. In other embodiments, the first state is an acetylated state and the second state is a deacetylated state. In yet other embodiments, the first state is an ion-paired state and the second state ion-unpaired state.

Another aspect of the invention provides for a method for environmental monitoring, the method comprising contacting ay of the environmental sensors described herein with a molecular environment, irradiating the sensor, and detecting a photoluminescent signal. In some embodiments, the molecular environment comprises a reactant capable of generating a product and wherein the product is capable of reacting with the reactive moiety to modulate the reactive moiety between the first state and the second state. The product may be $H^+$, $OH^-$, an acid, or a base.

In some embodiments, the molecular environment comprises a reactant capable of generating a product and wherein the reactant is capable of reacting with the reactive moiety to modulate the reactive moiety between the first state and the second state. The reactant may comprise $H^+$, $OH^-$, an acid, a base, an acetyl, a methyl, a phosphoryl, carboxyl, hydroxyl, or amine.

In some embodiments, the molecular environment comprises an ion capable of pairing with the charged moiety to modulate the charged moiety between the first state and the second state. The ion may comprise a member selected from the group consisting of ammonium, imidazolium, pyridinium, pyrrolidinium, phosphonium, sulfonium, and any combination thereof.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention.

$C_{10}H_{20}NOS_2$. The small peak at ~7.3 ppm, marked by asterisk (*), corresponds to an unknown impurity in QDs introduced during the ligand exchange process.

Figure 9A:
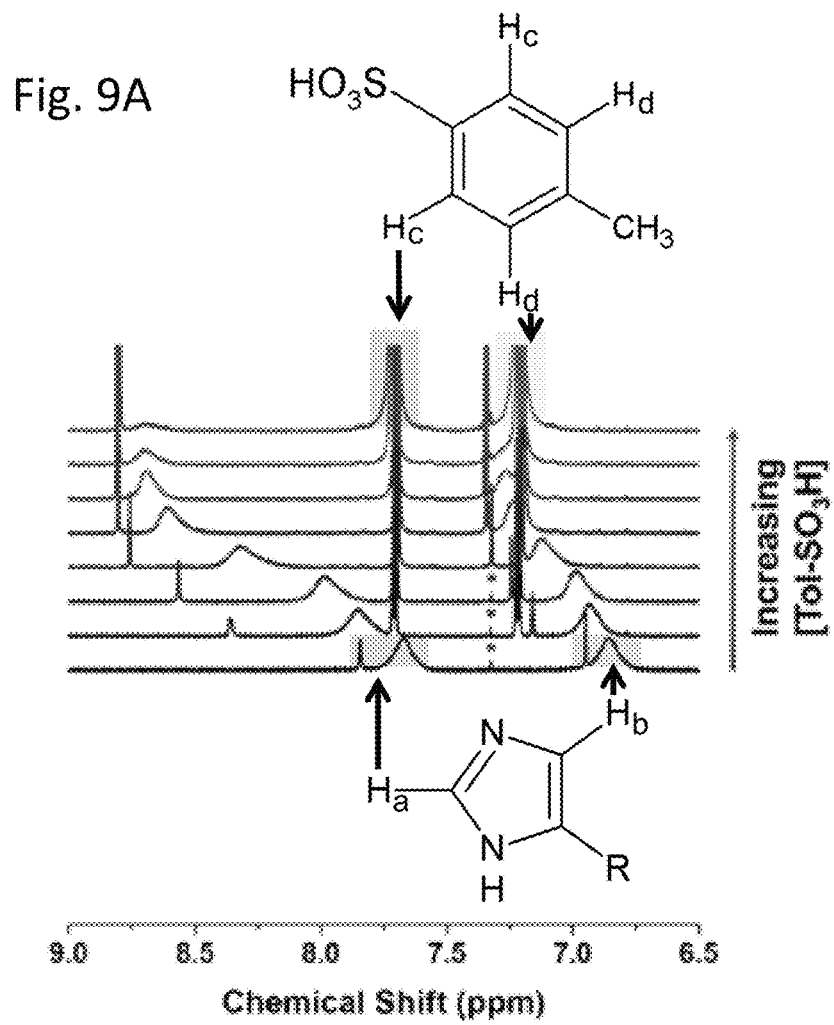
FIG. 9A shows representative NMR spectra of a series of 0.132 mM methanol-d4 solutions of DHLA-His-capped PbS QDs mixed with increasing (from black to red) molar equivalents (0-200 per QD) of Tol-$SO_3H$. —R=—
Figure 9B:
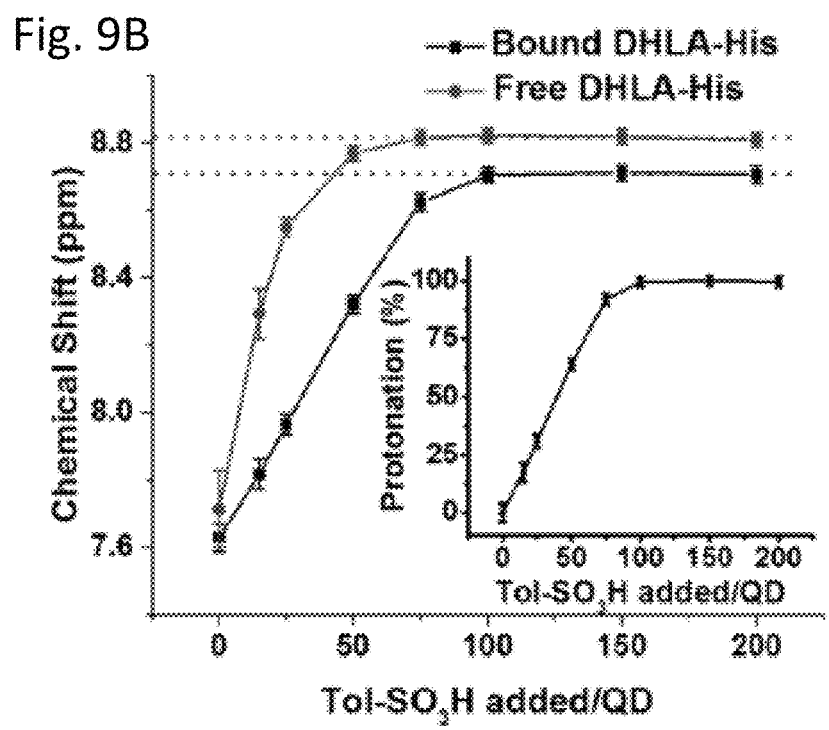

FIG. 9B shows the chemical shift of Hα for DHLA-His ligands that are bound to the surface of the QD (black; lower) or freely diffusing in solution (red; upper), plotted vs the equiv of Tol-SO3H added per QD. The errors bars are the standard deviation of three measurements on separately prepared QD samples. The inset contains the same data for bound DHLA-His only, where the chemical shift is converted to the degree of protonation.

Figure 10A:
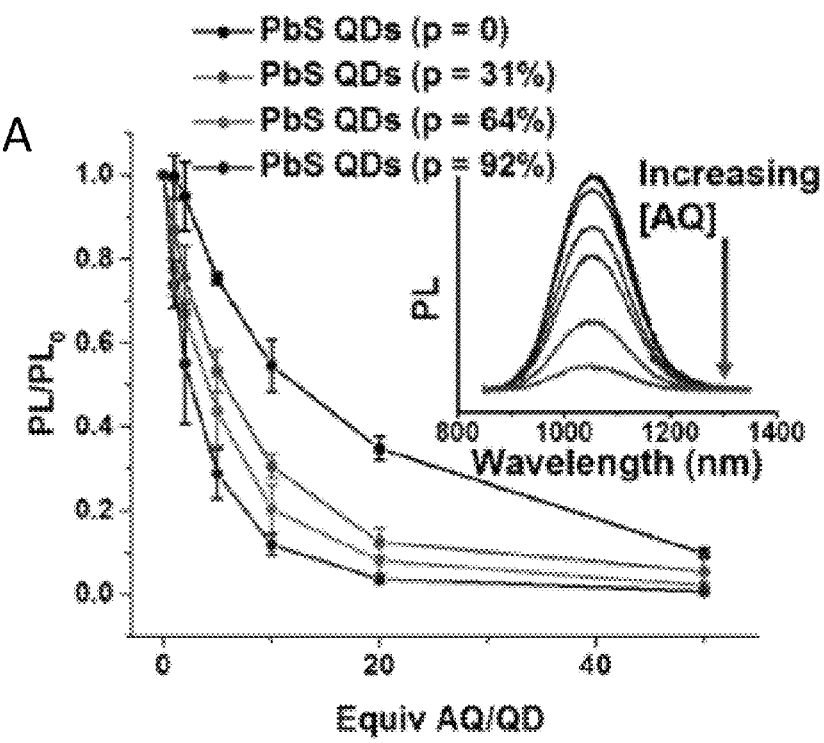

FIG. 10A shows fraction of emissive PbS QDs (6.58 μM) within mixtures with average protonation p=0 (black; upper), 31 (red), 64 (fucia), or 92% (blue; bottom) that remain emissive upon addition of increasing molar equivalents (0-50 per QD) of AQ. Three measurements on separately prepared samples were averaged to obtain each data point, and the error bars are the standard deviation of these measurements. The inset shows representative PL spectra of DHLA-His-capped PbS QDs (p=0) mixed with increasing equiv of AQ.

Figure 10B:
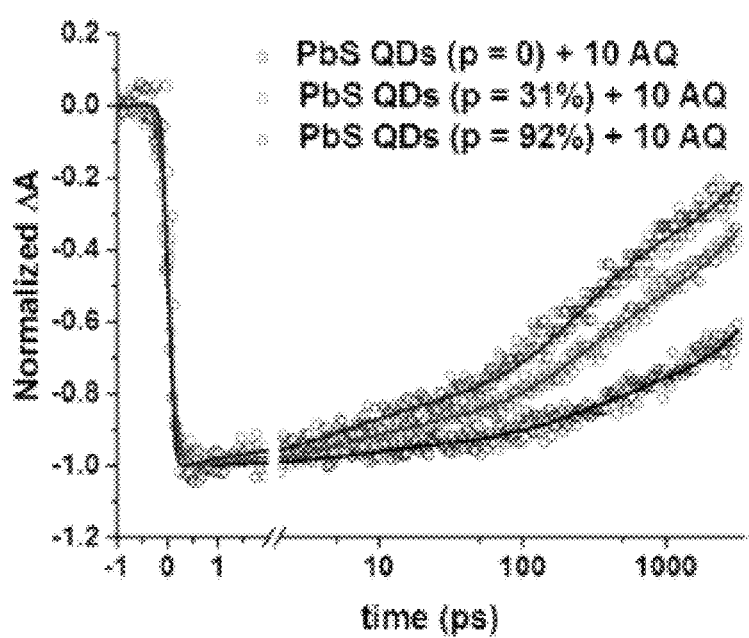

FIG. 10B shows normalized kinetic traces extracted (at the ground-state bleach, 878 nm) from the ps-to-ns TA spectrum of a 13.2 μM sample of DHLA-His-capped PbS QDs, mixed with 10 equiv of AQ (black; lower), 25 equiv of Tol-SO$_3$H and 10 equiv of AQ (red), or 75 equiv of Tol-SO$_3$H and 10 equiv of AQ (blue; upper), and photoexcited with a 100-μW laser at 810 nm. The solid lines are global fits with fitting parameters summarized in Table 13.

Figure 10C:
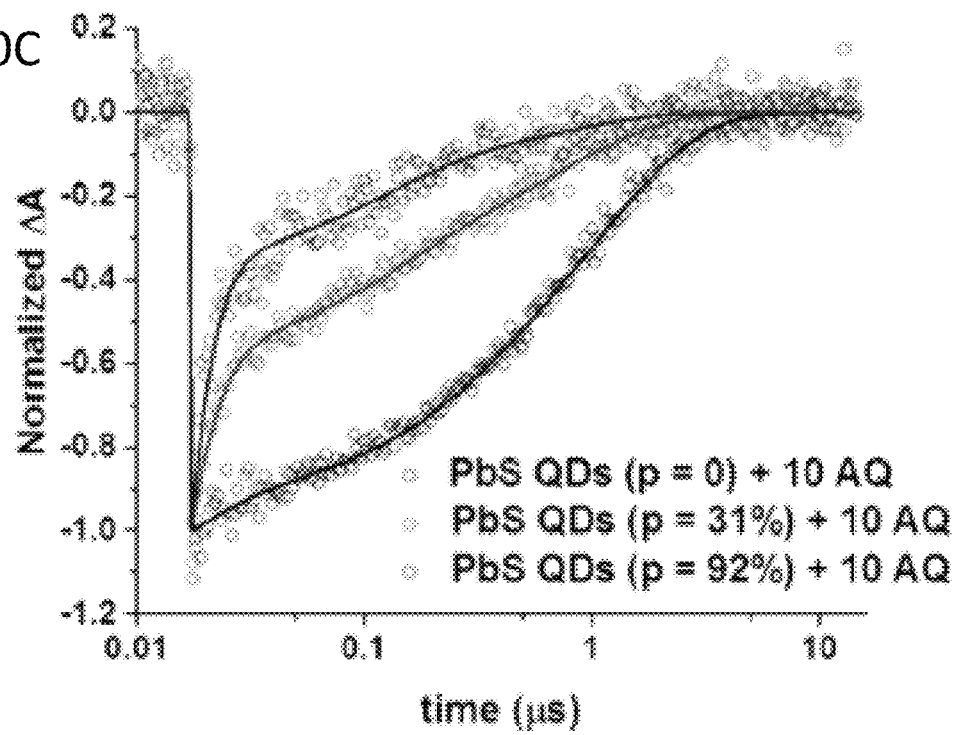

FIG. 10C shows normalized kinetic traces extracted (at the ground-state bleach, 901 nm) from the ns-to-μs TA spectra of the same sample series in FIG. 10B, photoexcited with a 2 mW laser at 810 nm. The solid lines are fits with fitting parameters summarized in Table 13.

Figure 11:
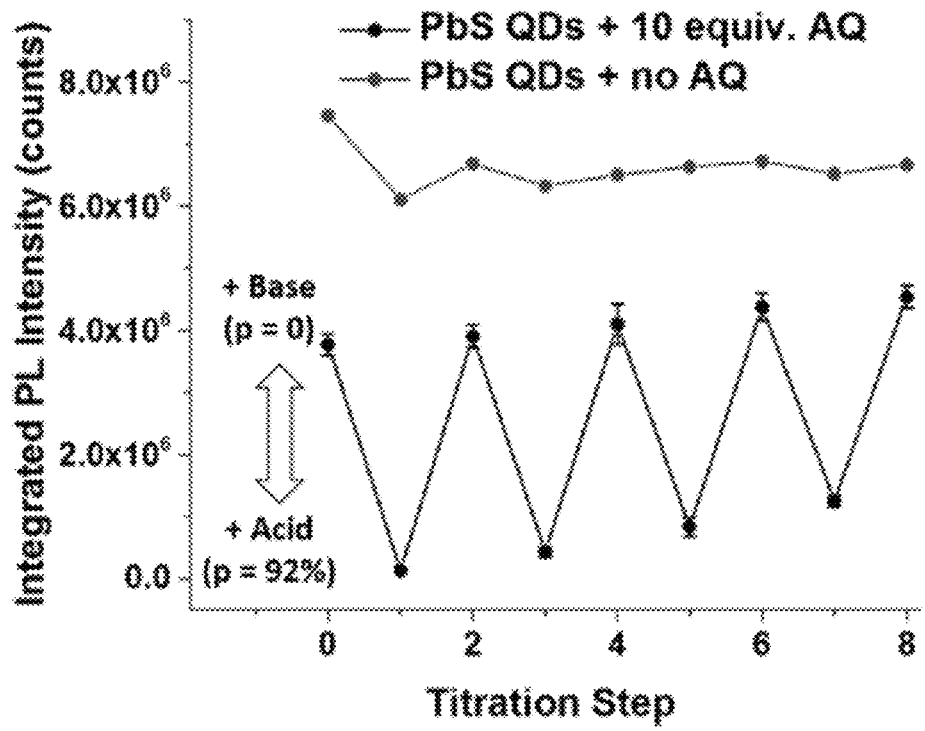

FIG. 11 shows the integrated PL intensity of a 3 mL, 10.0 μM solution of DHLA-His-capped PbS QDs, (red; upper), or QDs plus 10 equiv AQ (black; lower), upon alternate additions of 75 equiv of Tol-SO$_3$H and 75 equiv of NMe$_4$OH, which we added in 10 μL aliquots. No acid or base was added at titration step "0" (all of the ligands are initially deprotonated upon ligand exchange), and all spectra were taken within 2 min of adding acid or base into the sample. In the black trace, three measurements on separately prepared samples were averaged to obtain each data point, and the error bars are the standard deviation of these measurements.

Figure 12:
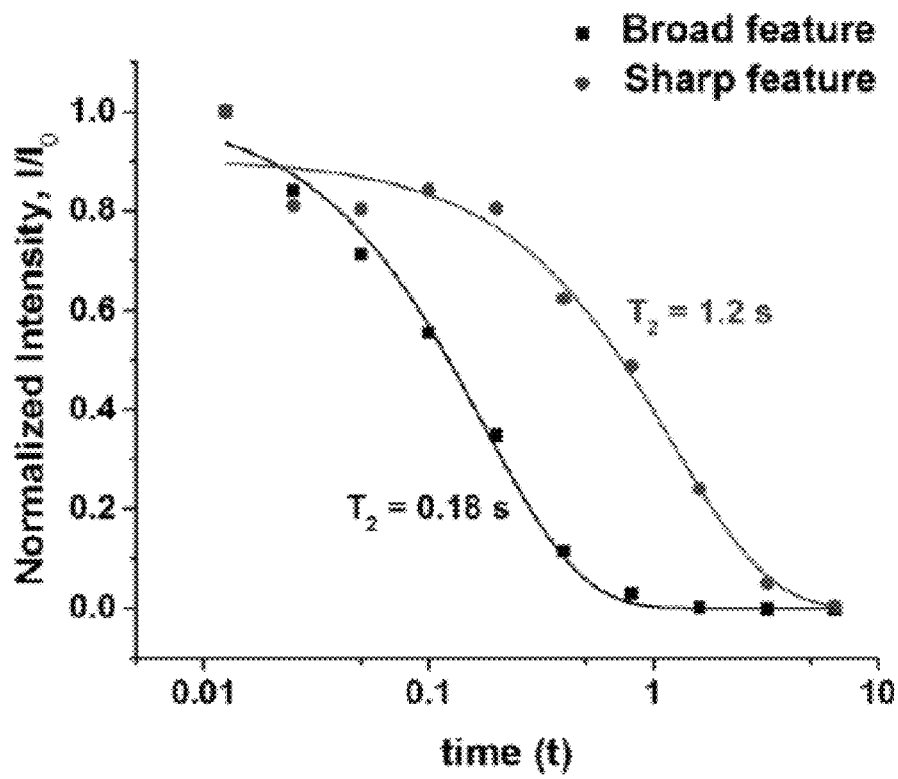

FIG. 12 shows kinetic traces of $T_2$ decay of the Hα proton signal for the broad (black; lower) and sharp (red; upper) features in the $_1$NMR spectrum (see FIG. 9A) of 0.132 mM DHLA-His-capped PbS QDs, mixed with 75 equiv. of Tol-SO$_3$H.

Figure 13:
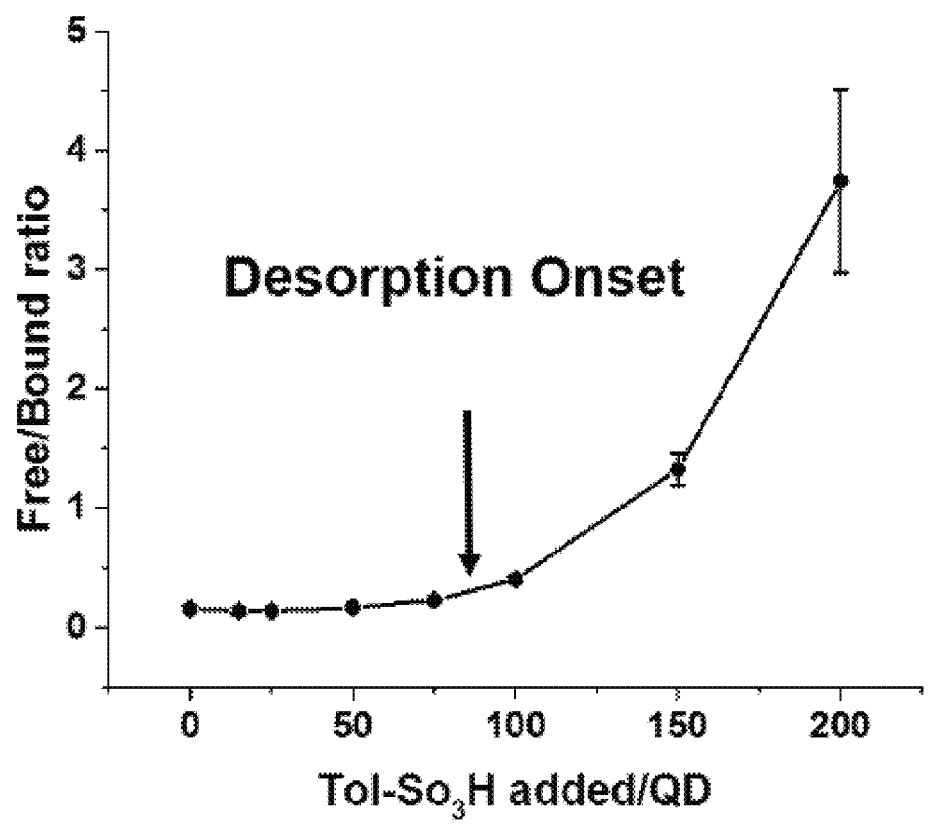

FIG. 13 shows the ratio between freely diffusing and surface-bound DHLA-His ligands as a function of Tol-SO$_3$H added.

Figure 14:
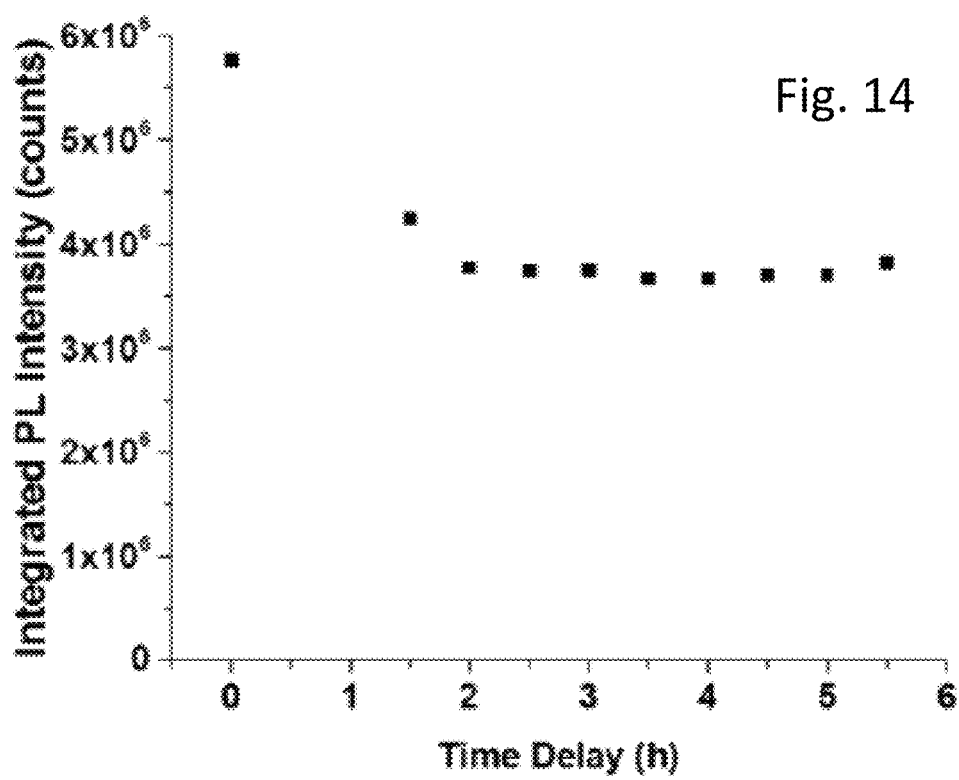

FIG. 14 shows a time-dependent PL study on DHLA-His-capped PbS QDs mixed with 10 equiv. AQ in ethylene glycol. The integrated PL intensity saturates two hours after the addition of AQ.

Figure 15:
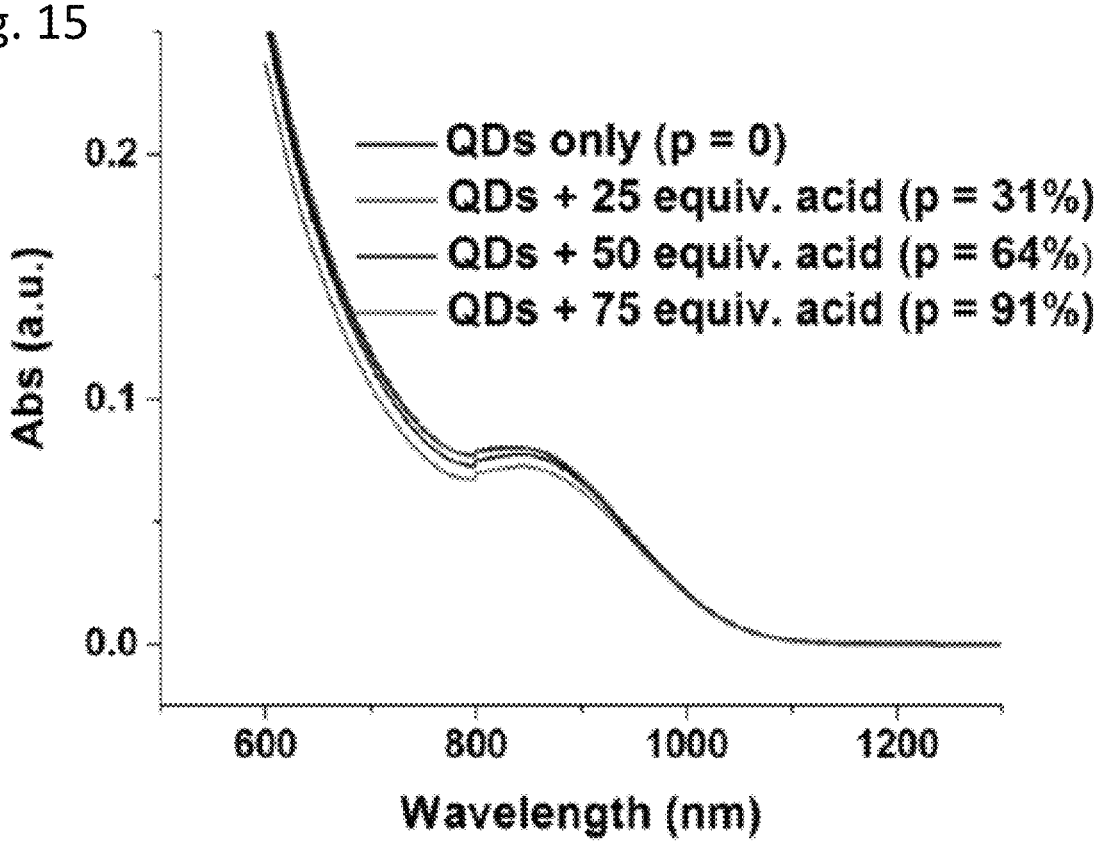

FIG. 15 shows a ground-state absorption spectra of DHLA-His-capped PbS QDs with increasing degree of protonation in their ligand shells.

Figure 16A:
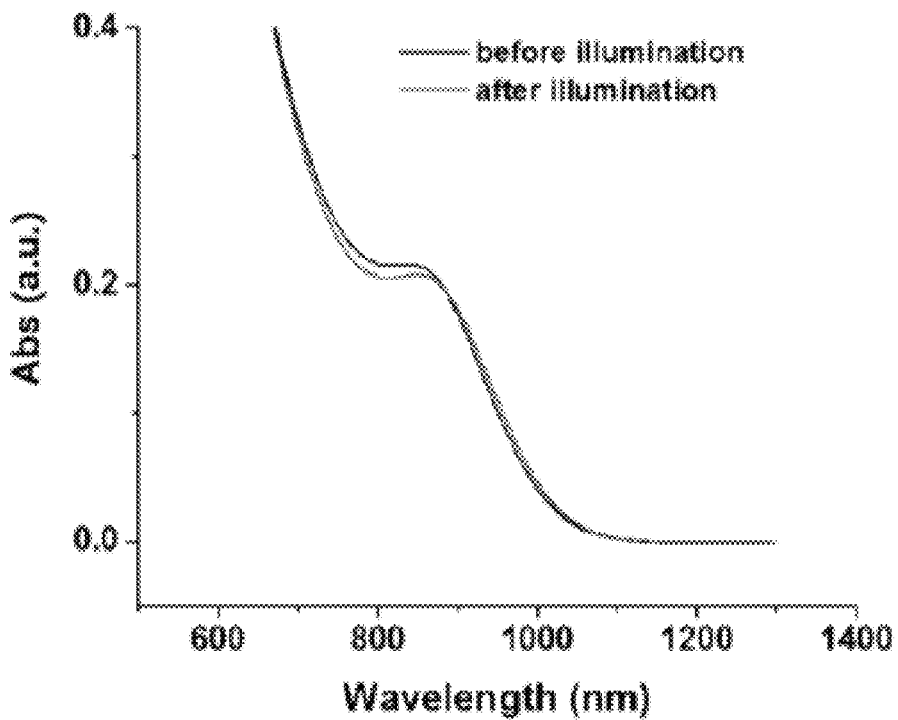

FIG. 16A show ground-state absorption spectra of a 10.0 μM sample of DHLA-His-capped PbS QDs, pretreated with 75 equiv. Tol-SO$_3$H and 5 equiv. AQ, before (black; upper) and after (red; lower) overnight illumination.

Figure 16B:
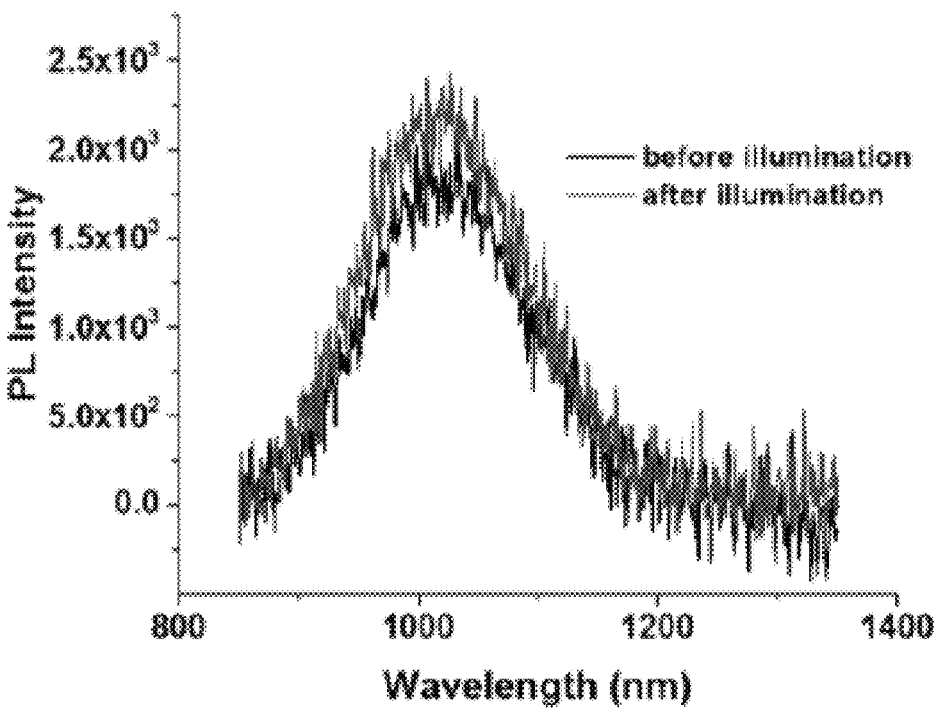

FIG. 16B show steady-state PL (FIG. 16B) spectra of a 10.0 μM sample of DHLA-His-capped PbS QDs, pretreated with 75 equiv. Tol-SO$_3$H and 5 equiv. AQ, before (black; lower) and after (red; upper) overnight illumination.

Figure 17:
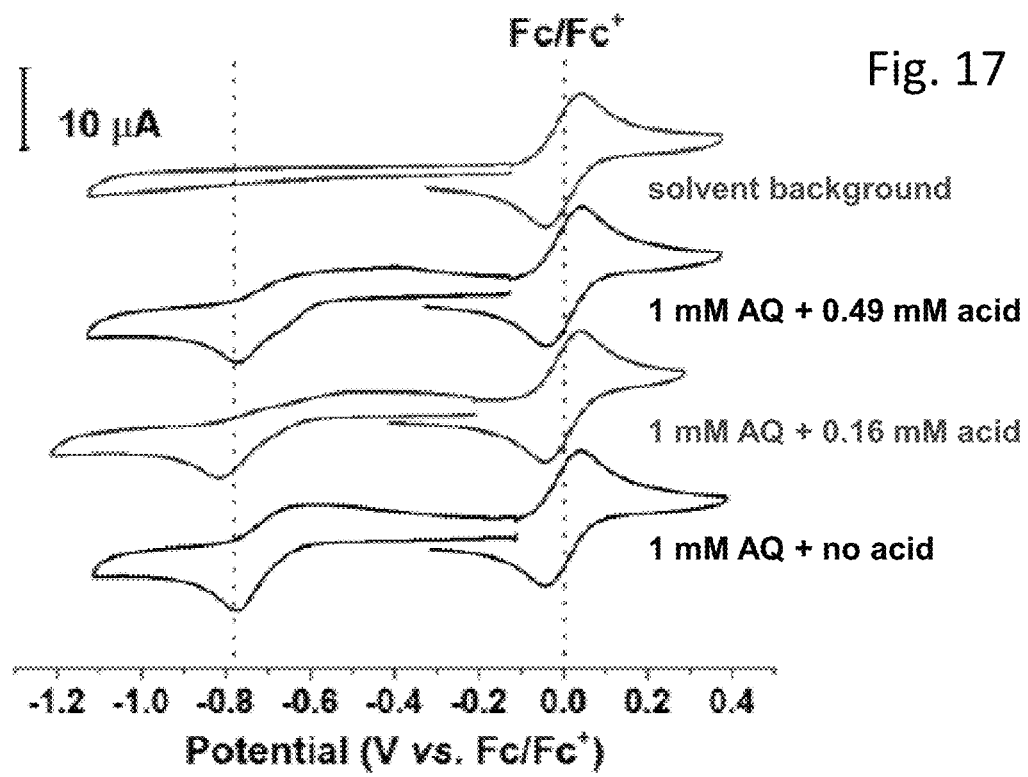

FIG. 17 Cyclic voltammograms of AQ in ethylene glycol solutions of increasing acidity.

Figure 18A:
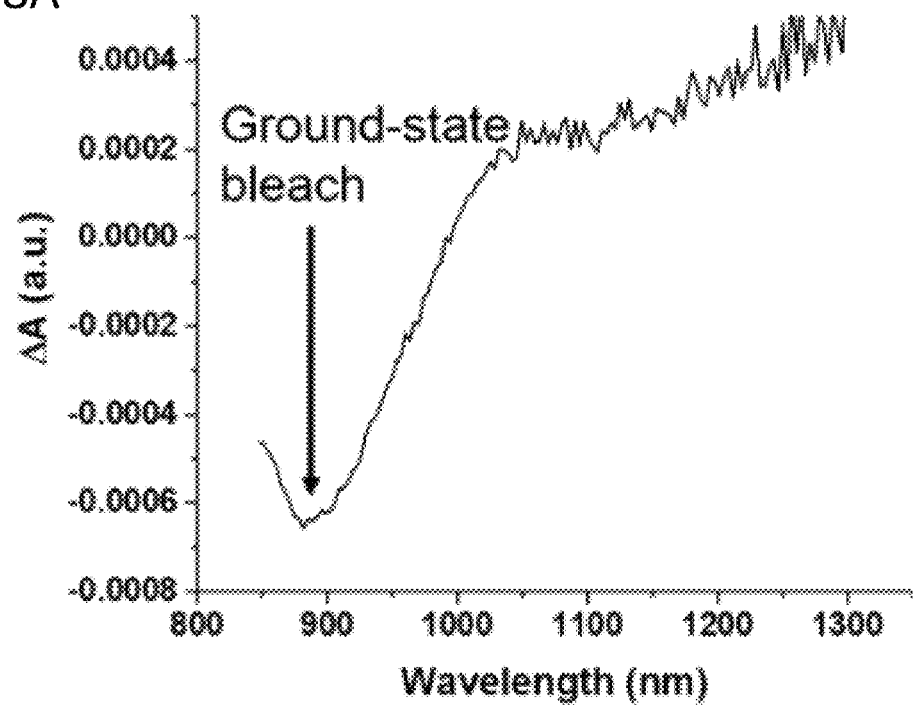

FIG. 18A shows a representative TA spectrum (extracted at a time delay of 2 ps) of a 13.2 μM ethylene glycol solution of DHLA-His-capped PbS QDs. The negative feature, indicated by the arrow, is the ground-state bleach.

Figure 18B:
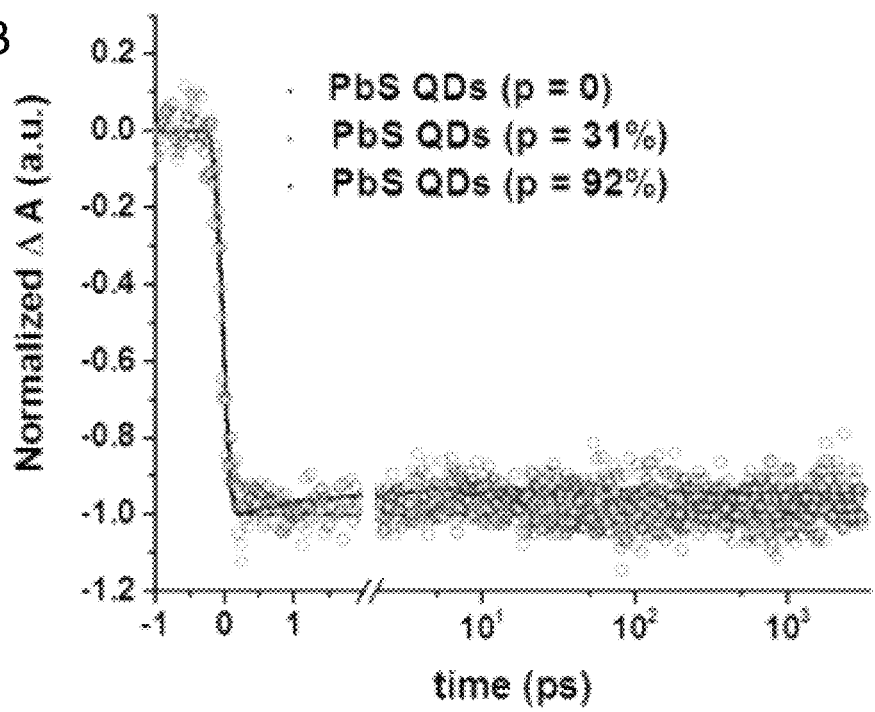

FIG. 18B shows kinetic traces extracted (at the ground-state bleach, 871 nm) from the ps-to-ns TA spectra of QDs with different degrees of protonation at their ligand shells. The fitting parameters are tabulated in Table 14.

Figure 18C:
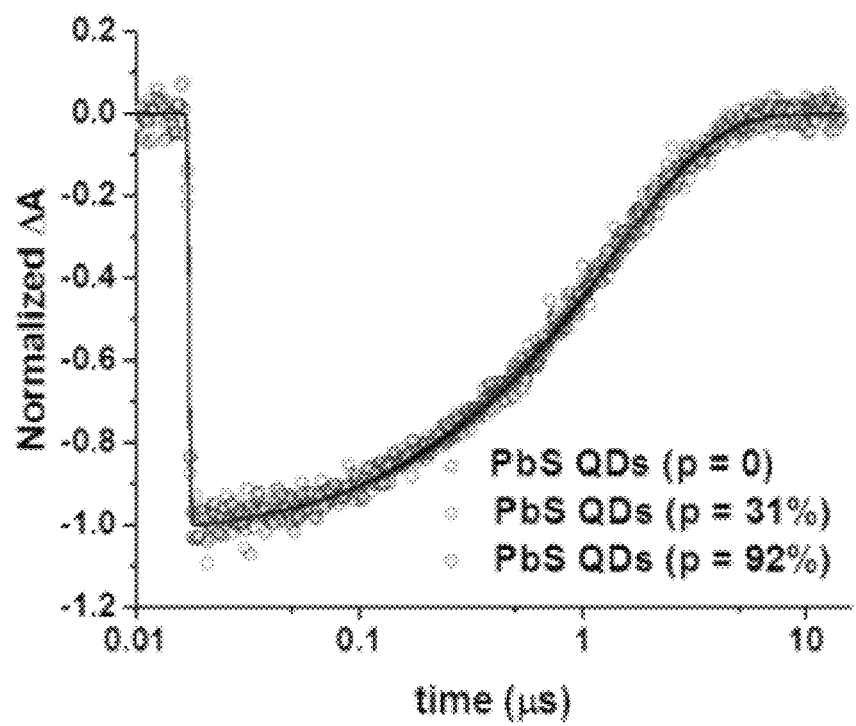

FIG. 18C shows kinetic traces extracted (at the ground-state bleach, 901 nm) from the ns-to-μs TA spectra of the same sample series. The fitting parameters are tabulated in Table 14.

Figure 19:
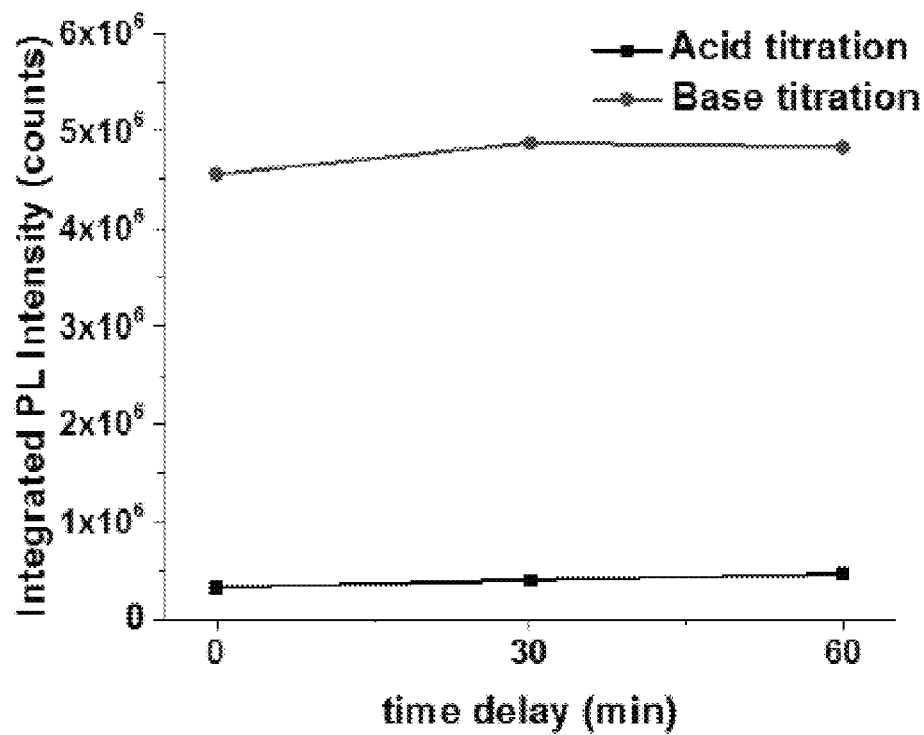

FIG. 19 shows time-dependent PL intensity of DHLA-His-capped PbS QDs upon addition of acid (lower) or base (upper).

Figure 20:
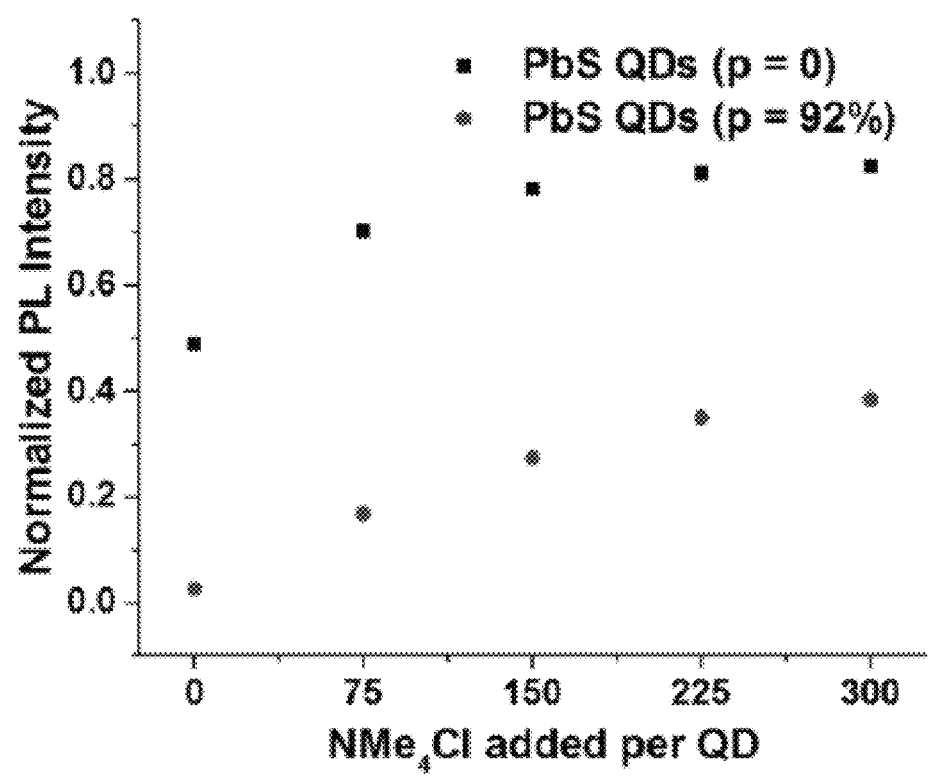

FIG. 20 shows normalized PL Intensity of 10.0 μM PbS QD solutions mixed with increasing molar equivalents of NMe$_4$Cl. PbS QDs (p=0) upper trace. PbS QDs (p=92%) lower trace.

Figure 21:
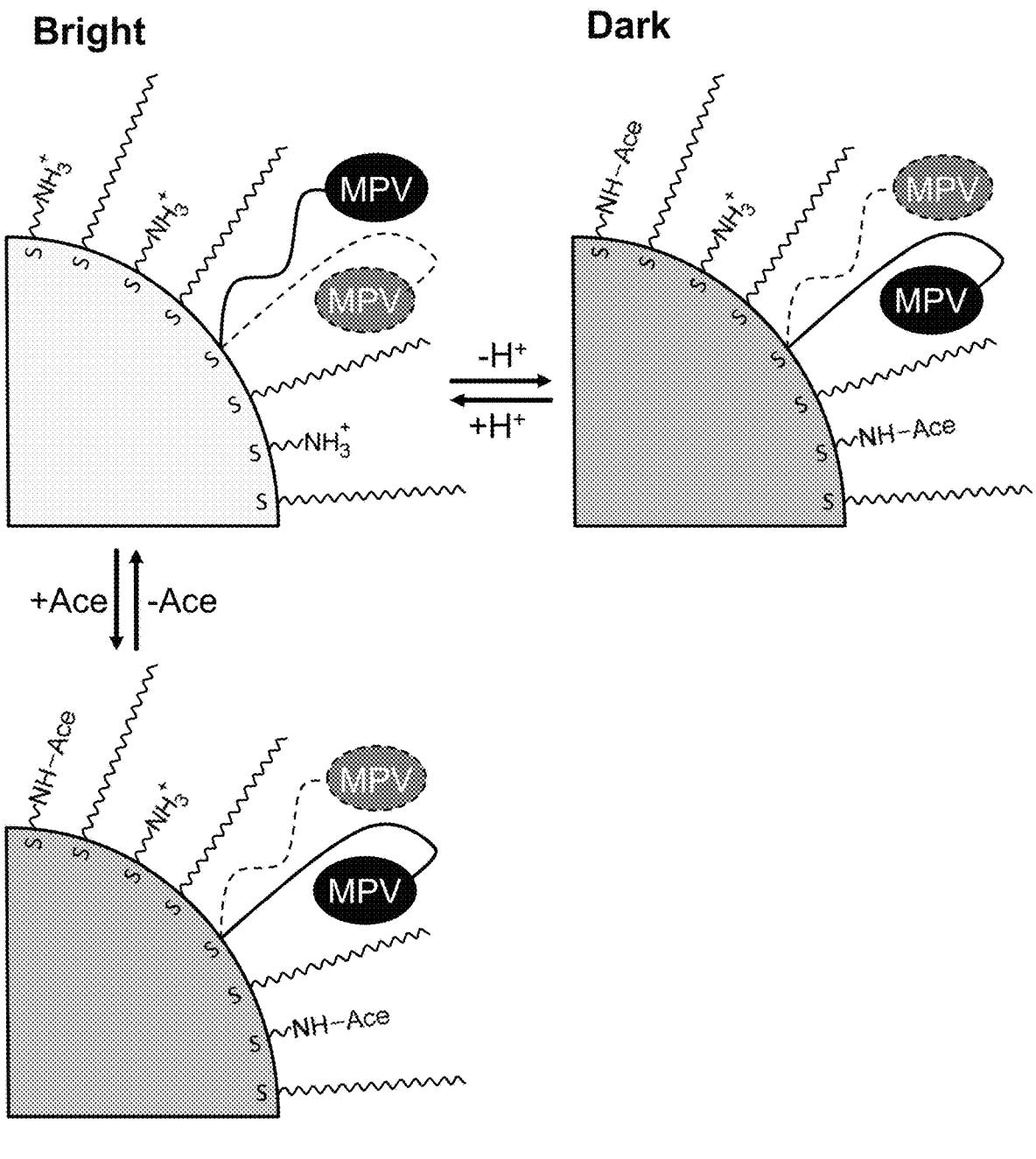

FIG. 21 shows a schematic design and the mechanism of the electrostatic sensor.

Figure 22:
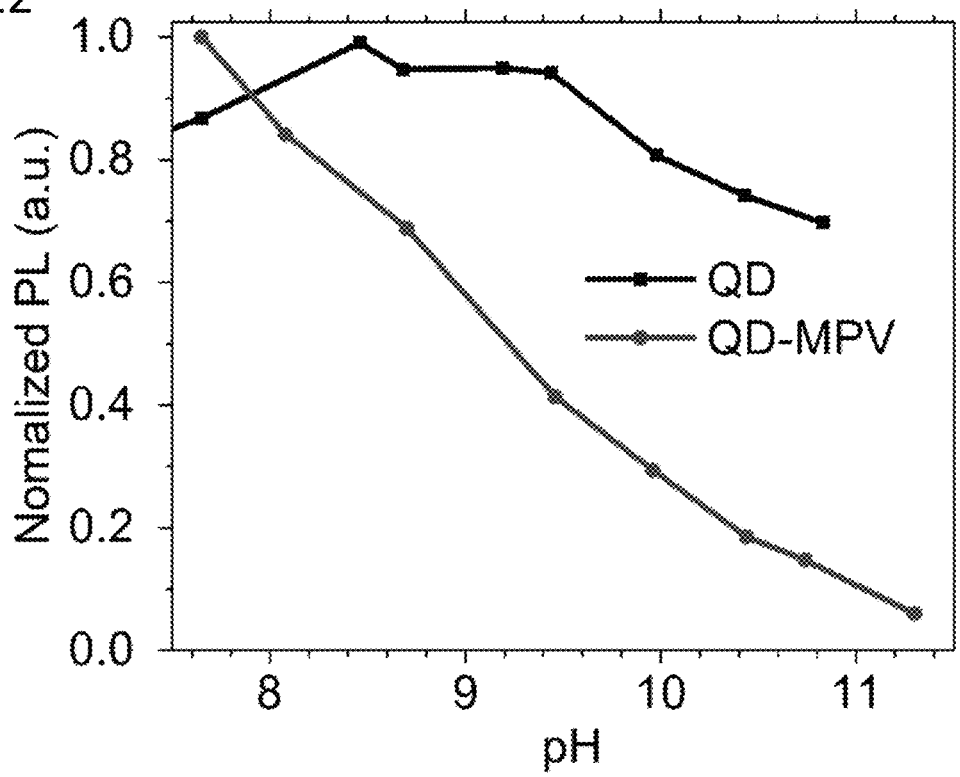

FIG. 22 shows the dependence of the PL intensity of QDs with (red; lower) or without (black; upper) tethered MPV acceptors on pH of the solution.

Figure 23:
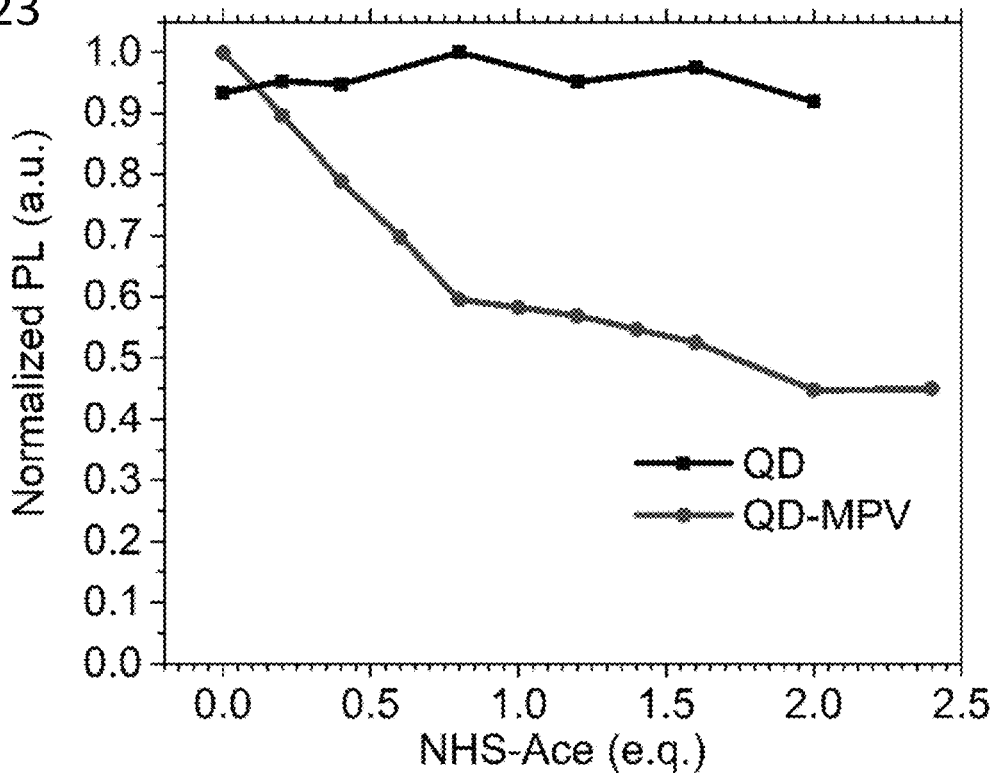

FIG. 23 shows the change of PL intensity of QDs with (red; lower) and without (black; upper) tethered MPV acceptors on the titration of acetylating agent NHS-Ace.

Figure 24:
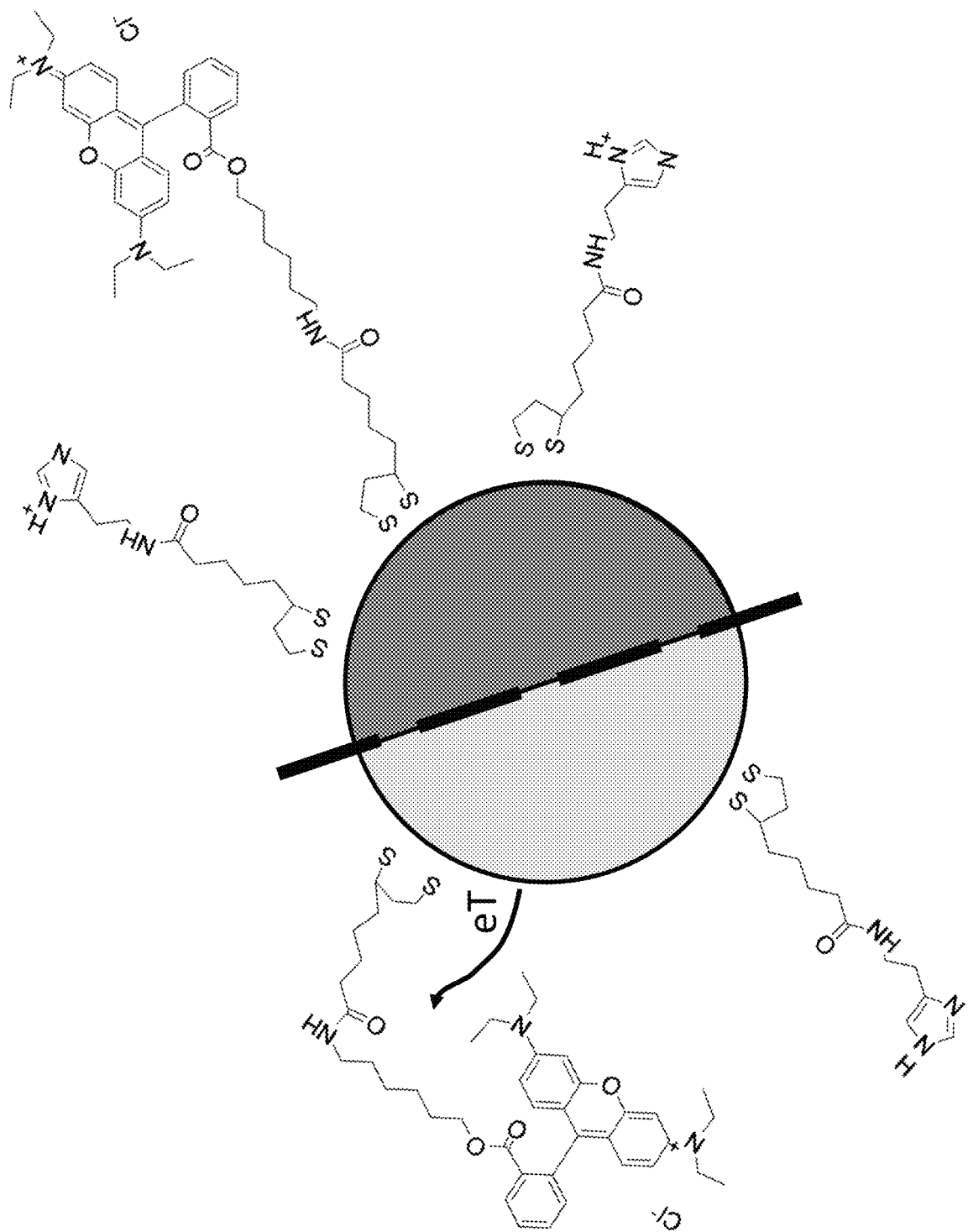

FIG. 24 shows a schematic of a proton sensor. When the tethered quencher is in proximity to the core, eT occurs quenching photoluminescence (left side). When the tethered quencher is extends outwardly from the core, the nanoparticle photoluminescences (right side)

DETAILED DESCRIPTION OF THE INVENTION

The present technology is directed to the control of the electrostatic potential of a nanoparticle. The polarity and magnitude of this potential dictate how the colloid will interact with its chemical environment. This potential is a critical factor in regulating (i) permeation of small molecules to the inorganic surface of the particle and (ii) nonspecific adsorption of larger biomolecules to the nanoparticle, e.g., protein coronas that degrade the particle's ability to tag or permeate a membrane. Introduction of a charged molecular quencher to the system renders the photoluminescence (PL) intensity of the nanoparticle sensitive to this potential and allows for monitoring the yield of reactions, such as changes in the pH or acetylation, that result in a change in the charge or charge distribution of the nanoparticles.

The present technology monitors chemical and biological processes by tracing the change in the state of electrostatic charges. The general methodology relies on a ligand shell surrounding a photoluminescent core that is permeable to a photoluminescence quencher. Changes in the molecular environmental result in a modulation between states for reactive or charged moieties within the ligand shell. For example, the moieties may modulate between a protonated and deprotonated state, an acetylated and a deacetylated state, or an ion-paired and ion-despaired state. The change in the equilibrium distribution of states within the ligand shell results in a change in the permeability of the ligand shell for the quencher to come into proximity with the core. As a result, the detectable photoluminescence will change and allow one to monitor the molecular environment in real-time in vitro and in vivo.

The environmental sensors comprise nanoparticles and photoluminescence quenchers. The nanoparticle comprises a photoluminescent core. A "photoluminescent core" is a material capable of emitting photons after the absorption of photons. Depending on the molecular environment, the core may be selected to absorb photos or emit photons in a desired optical window. An example of an optical window is the near-infrared (NIR) window, which may otherwise be known as the biological window, between 650 to 1350 nm where photons have their maximum penetration depth in biological tissues.

The nanoparticle core may comprise any suitable material capable of photoluminescence. In some embodiments, the core comprises a transition metal, a basic metal, a semi-metal, a nonmetal, or any combination thereof. This includes, but is not limited to materials comprising elements from Groups 11-16. The nanoparticle core may be crystalline or amorphous. In some embodiments, the nanoparticle core may be a semiconductor. Exemplary materials include, but are not limited to, CdS, CdSe, CdTe, PbS, PbSe, InP, InAs, $CuInS_2$, ZnSe, or ZnTe. Moreover, the term "core" is not limited to a single material and, for example, encompasses core-shell nanoparticles.

The core may be of any suitable size that allows for photoluminesce. In some embodiments, the nanoparticle has a core radius of less than 100 nm, including nanoparticles having a core radius less than 50 nm, 25 nm, 20, nm, 15 nm, 10, nm, 5 nm, or 2 nm. In some embodiments, the nanoparticle is a quantum dot.

By selecting the material and/or size of the core, the photon absorption and photo emission widow by be tuned for a desired optical window.

Surrounding the core is a ligand shell. The ligand shell comprises a plurality of ligands bound to the core. The ligands comprise an anchoring group for binding the ligand to the core. The anchoring group may be any chemical moiety capable of associating the ligand to the core by physisorption or chemisorption. Exemplary anchoring groups include thiols, such as monothiolate, dithiolate, or trithiolate groups, but other anchoring groups may be used.

In some embodiments, the ligands comprise a reactive moiety. A "reactive moiety" may comprise any functional group capable of reacting to form a bond between itself and a compound or ion in the molecular environment or dissociating to break a bond to form a compound or ion. The bond forming or breaking reaction should alter the electrostatic potential of the ligand shell and/or the permeability of the shell to a photoluminescence quencher. The bond forming or bond breaking reaction may be reversible, but need not be. In some embodiments, the bond forming or breaking reaction may be reversible within a window from about 0° C. to about 50° C., including from about 0° C. to about 40° C., 10° C. to about 40° C., or 20° C. to about 40° C. In particular the bond forming or breaking reaction may include any reversible reaction at a physiological temperature of a biochemical compound, such as a reversible protein, lipid, or saccharide modification. Examples of such reactions include, without limitation, protonation, deprotonation, phosphorylation, methylation, acetylation, hydrolysis, or condensation.

Suitably the reactive moiety may be able to modulate an acidic moiety between its protonated state and its corresponding deprotonated conjugate base. Reactions of this type can result in a neutral, protonated moiety switching to its anionically-charged, deprotonated state or a anionically-charge, deprotonated state switching to its neutral, protonated state. A change in the environmental pH will result in a change to the protonation equilibrium between the neutral, protonated state and the anionic, deprotonated state. This results in a change to the electrostatic potential of the nanoparticle and change in permeability of the ligand shell. A decrease in the pH increases the relative proportion of moieties in the neutral, protonated state. Whereas an increase in the pH decreases the relative proportion of moieties in the neutral, protonated state. Exemplary reactive moieties, include, without limitation, a carboxyl, a hydroxyl, a sulfo, a sulfhydryl, a phosphoryl, or a phosphate or a conjugate base thereof.

Suitably the reactive moiety may be able to modulate a basic moiety between its deprotonated state and its corresponding conjugate acid. Reactions of this type can result in a neutral, deprotonated moiety switching to its cationically-charged, protonated state or a cationically-charged, protonated state switching to its neutral, deprotonated state. A change in the environmental pH will result in a change to the protonation equilibrium between the neutral, deprotonated state and the cationic, protonated state. This results in a change to the electrostatic potential of the nanoparticle and change in permeability of the ligand shell. A decrease in the pH increases the relative proportion of moieties in the cationic, protonated state. Whereas an increase in the pH decreases the relative proportion of moieties in the neutral, deprotonated state. Exemplary reactive moieties include, without limitation, a substituted or unsubstituted amine or alkylamine, a substituted or unsubstituted imidazole, a substituted or unsubstituted benzimidazole, a substituted or unsubstituted pyrimidine, a substituted or unsubstituted purine, a substituted or unsubstituted pyridine, a substituted or unsubstituted pyrrolidine, or a conjugate acid thereof. As demonstrated in the Examples that follow, the electrostatic potential and permeability of the ligand shell to the quencher may be controlled by the protonation equilibrium of imidazole reactive moieties and amine reactive moieties.

Suitably the reactive moiety may be able to modulate a moiety associated with a post-translation protein modification. Various post-translation modification are known and may include, without limitation, phosphorylation, methylation, or acetylation. Amino acid and peptide sites that often undergo post-translational modification are those that have a functional group that can serve as a nucleophile in the reaction: the hydroxyl groups of serine, threonine, and tyrosine; the amine forms of lysine, arginine, and histidine; the thiolate anion of cysteine; the carboxylates of aspartate and glutamate; and the N- and C-termini. Reversible phosphorylation occurs at the side chains of three amino acids, serine, threonine and tyrosine. These amino acids have a nucleophilic hydroxyl group that attacks the terminal phosphate group on the universal phosphoryl donor adenosine triphosphate (ATP), resulting in the transfer of the phosphate group to the amino acid side chain. Methylation transfers a one-carbon methyl group to nitrogen or oxygen (N- and O-methylation, respectively) to amino acid side chains increases the hydrophobicity of the protein and can neutralize a negative amino acid charge when bound to carboxylic acids. Acetylation transfers an acetyl group to an amine, such as the amine of lysine, increasing the hydrophobicity and can neutralize a positive amino acid charge of a protonated amine.

Suitably the reactive moiety may be able to modulate a moiety associated with condensation or hydrolysis. Condensation reactions occur when two or more reactants yield a single main product with accompanying formation of water. Examples include the reaction of carboxyl groups with hydroxyl groups to form esters or amines to form amides, increasing the hydrophobicity. Hydrolysis reactions cleave a reactant with the consumption of water to yield two products. Examples include the reaction of esters or amides with water forming a carboxyl group and a hydroxyl or amine, respectively.

In some embodiments, the ligands comprise a charged moiety. A "charged moiety" may comprise any functional group capable of having a persistent anionic or cationic charge in the molecular environment. The presence of ions having an opposition charge as the charged moiety may result in ion pairs that modulate the electrostatic potential of the ligand shell and/or the permeability of the shell to a photoluminescence quencher. As demonstrated in the Examples that follow, the electrostatic potential and permeability of the ligand shell to the quencher may be controlled by the ion-pairing of charged carboxylate moieties with tetraalkylamines.

The ligand may have any suitable tether connecting the anchoring group and the reactive or charged moiety. The tether may be linear or branched, substituted or unsubstituted $C_1$-$C_{15}$ alkyl, an oligoethylene glycol having 1, 2, 3, 4, or 5 ethylene glycol monomers, or polyethylene glycol having 5 to 100 monomers, e.g., PEG-200, PEG-300, PEG-400, PEG-600, PEG-1000, PEG-1500, or PEG-2000. In some embodiments, the $C_1$-$C_{15}$ alkyl comprises —$(CH_2)_n$— where n is greater than or equal to 1 and less than or equal to 15 or —$(OCH_2CH)_n$— where n is an integer and greater than or equal to 1 and less than or equal to 100.

In some embodiments, the tether comprises a coupling moiety that allows for the modular coupling of the anchor group to a variety of reactive or charged moieties. In some embodiments, the coupling moiety is an amide formed from the reaction of a carboxyl acid and a amine, but other chemistries are suitable for coupling such reactions of amines with NETS-esters, isocyanates, isothiocyantes, or benzoyl fluorides; thiolates with maleimides, iodoacetamides, 2-thiopyridine, or 3-arylproplolonitrile; or azides with alkynes or other click chemistries. In some embodiments, the tether comprises —$(CH_2)_n(CONH)(CH_2)_m$— where n and m are integers and n+m is greater than or equal to 1 and less than or equal to 15.

The ligand shell may also comprise a diluent ligand and/or a solubilizing ligand. For some applications, covering the nanoparticle core entirely with ligands comprising a reactive or charged moiety may be undesirable. A "diluent ligand" is a ligand that allows for the controlling the number of ligands comprising a reactive or charge moiety selected for the application of interest within the ligand shell, resulting in a mixed adlayer of ligands. The diluent ligand may comprise any of the anchoring groups, tethers, or coupling groups described above. As described in the Examples that follow, the number of carboxylate terminated charged groups may be controlled within the ligand shell by the inclusion of hydroxyl terminated ligands.

A "solubilizing ligand" is a ligand selected to improve the solubility of the nanoparticle in the molecular environment. The solubilizing ligand comprises one or more functional groups capable of improving solubility. In the case of an aqueous environment, the solubilizing ligand may comprise polar functional groups or a water soluble polymer or oligomer such as polyethylene glycol.

The relative number of ligands of different types in the ligand may be varied over wide ranges depending on the application of interest. The ligand shell may comprise between about 20% (as a number percentage of the total number of ligands) and about 100% of the reactive ligand or the charged ligand. In certain embodiments, the ligand shell comprises between about 50% to about 95% or about 50% to about 90%. The ligand shell may comprise between about 0% and about 80% of the diluent ligand. In certain embodiments, the ligand shell comprises between about 5% and about 50% diluent ligand or about 10% to about 50% of the diluent ligand. The ligand shell may comprises between about 0% and about 25% of the solubilizing ligand. In certain embodiments, the ligand shell comprises between about 1% and 10% or about 1% and about 5% of the solubilizing ligand.

The environmental sensors further comprise a photoluminescence quencher. A "photoluminescence quencher" is any molecule or functional group capable of inhibiting the photoluminescence of the core. Inhibition of the photoluminescence may occur by any suitable mechanism, including electron transfer. Because the probability of electron transfer is dependent on the separation distance between the quencher and the core, modulation of the permeability of the ligand shell will modulate the quenching of the photoluminescence. Many molecules or functional groups are suitable to accept an electron from the photoluminescent core to quench photoluminescence, including, without limitation, aromatic compounds having one or more ring structures. The quenchers may be charged, but need not be. Examples of such quenchers used in this work include, 9,10-anthraquinone-2-sulfone, methyl propyl viologen, and rhodamine B.

The quencher may be optionally tethered to the photoluminescent core. The tether should be flexible to allow the relative distance between the quencher and the core to vary so that the amount of photoluminescence inhibition can vary in response to changes in the molecular environment. An advantage of tether quenchers is that the response time of a tethered quencher can potentially bypass the limit of diffusion (which is on the order of tens of nanosecond to microsecond). The tether may comprise any of the anchoring groups or coupling groups described above for attaching the quencher moiety to the core.

The sensors described herein may be used to monitor in real-time the molecular environment. Methods of using the sensors for monitoring a molecular environment comprise contacting the sensor with a molecular environment, irradiating the sensor in contact with the molecular environment, and detecting a photoluminescent signal. The sensor with the molecular environment may be contacted by any suitable means, including, without limitation, by preparing a solution or colloidal system comprising the sensor or by wetting a surface having the sensor attached thereto. For a dynamically evolving molecular environment, the photoluminescent signal may change depending of the interaction of molecular species with the reactive or charged ligands present in the ligand shell of the nanoparticle.

The molecular environment may comprise an ion capable of paring with a charge moiety to modulate the charged moiety between an ion-paired and ion-unpaired state or an ion or compound capable of reacting with a reactive moiety. The ion should be oppositely charged than the surface distal to the core of the nanoparticle. Exemplary cationic organic ions include ammonium, imidazolium, pyridinium, pyrrolidinium, phosphonium, and sulfonium. One or more of these organic ions may be paired with the nanoparticle. For aqueous phase applications, it is preferably for the organic ion to be at least partially soluble in water. In some cases the organic ion comprises a $C_{1-4}$ substituent, including $C_{1-4}$ alkyl substituents such as methyl, ethyl, propyl, and butyl substituents. Although all of the substituents of the organic ion may be the same, the organic ion may comprise combinations of different substituents. In particular embodiments, the organic ion is tetramethylammonium, tetraethylammonium, tetrapropylammonium, tetrabutylammonium, or any combination thereof.

In some cases, the dynamically evolving molecular environment involves the formation of a reaction product. In cases where the reactive ligand in the ligand shell is capable of reversibly or irreversibly reacting with the product to modulate the permeability of the ligand shell, the sensor is capable of directly detecting the formation of the product. As the reaction progresses and product is being formed, the higher concentration of product will change the reaction equilibrium between the first and second states. Depending on how the permeability of the ligand shell is modulated, an increase or decrease of the photoluminescent signal can be detected. By way of example, if the reaction product is $H^+$ and the reactive moiety, such as imidazole, is capable of binding the $H^+$ to form the conjugate acid, the permeability of the ligand shell to a 9,10-anthraquinone-2-sulfonate quencher will increase as the equilibrium concentration for the protonated moiety increases. This in turn will affect the detectable photoluminescent signal as the probability of electron transfer between the quencher and the photoluminescence core increases with increasing permeability.

In some cases, the dynamically evolving molecular environment involves the depletion of a reactant. In cases where the reactive ligand in the ligand shell is capable of reacting with a reactant to modulate the permeability of the ligand shell, the sensor is capable of indirectly detecting the formation of a product. As the reaction progresses and product is being formed, reactants are being consumed. The lower concentration of reactants will change the reaction equilibrium between the first and second states. Depending on how the permeability of the ligand shell is modulated, an increase or decrease of the photoluminescent signal can be detected. By way of example, if the reactant is $H^+$ and the reactive moiety, such as imidazole, is capable of reversibly binding the $H^+$ to form the conjugate acid, the permeability of the ligand shell to a 9,10-anthraquinone-2-sulfonate quencher will decrease as the equilibrium concentration for the deprotonated moiety increases. This in turn will affect the detectable photoluminescent signal as the probability of electron transfer between the quencher and the photoluminescence core decreases with decreasing permeability.

In some embodiments, the reactant or product may comprise $H^+$, $OH^-$, an acid, or a base. In some embodiments, the reactant may comprise an acetyl, a methyl, a phosphoryl, carboxyl, hydroxyl, or amine moiety. When the sensor comprises a reactive moiety capable of reacting with any of $H^+$, $OH^-$, an acid, a base, an acetyl, a methyl, a phosphoryl, carboxyl, hydroxyl, or amine, the reaction between the Miscellaneous Unless otherwise specified or indicated by context, the terms "a", "an", and "the" mean "one or more." For example, "a molecule" should be interpreted to mean "one or more molecules."

As used herein, "about", "approximately," "substantially," and "significantly" will be understood by persons of ordinary skill in the art and will vary to some extent on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus >10% of the particular term.

As used herein, the terms "include" and "including" have the same meaning as the terms "comprise" and "comprising." The terms "comprise" and "comprising" should be interpreted as being "open" transitional terms that permit the inclusion of additional components further to those components recited in the claims. The terms "consist" and "consisting of" should be interpreted as being "closed" transitional terms that do not permit the inclusion additional components other than the components recited in the claims. The term "consisting essentially of" should be interpreted to be partially closed and allowing the inclusion only of additional components that do not fundamentally alter the nature of the claimed subject matter.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

All references, including publications, patent applications, and patents, cited herein are hereby incorporated by reference to the same extent as if each reference were individually and specifically indicated to be incorporated by reference and were set forth in its entirety herein. Preferred aspects of this invention are described herein, including the best mode known to the inventors for carrying out the invention. Variations of those preferred aspects may become apparent to those of ordinary skill in the art upon reading the foregoing description. The inventors expect a person having ordinary skill in the art to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Examples

Non-Covalent Control of the Electrostatic Potential of Nanoparticles Through the Formation of Interfacial Ion Pairs Herein we describe the control of the electrostatic potential at the interface between a colloidal semiconductor quantum dot (QD) and the solvent, water, by tuning non-covalent interactions between the ligand shell of the QD and screening counterions. The electrostatic potential of a nanoparticle, governed by charges of the ionizable tail groups of the particle's passivating organic ligands and electrostatic screening from surrounding electrolyte, controls (i) the particle's solubility within polar media such as water, (ii) the particle's tendency to self-assemble into superlattices and functional materials, (iii) the wettability, permeability and binding affinity of the particle's surface with respect to charged small molecules or macromolecular species (and therefore the ability of its passivation layer to act as a selective molecular recognition platform for charged analytes and potential adsorbates), and (iv) the particle's interaction with biomembranes. The concentration and distribution of non-covalently bound counterions around a particle's surface additionally influence the apparent dissociation constant of ionizable ligands immobilized on the surface by screening inter-ligand interactions.

The electrical double layer model, widely applied through both analytical and simulation approaches, has provided quantitative predictions of how the size, valence and concentration of surrounding ions contribute to the inversion and/or amplification of surface charges surrounding a macroion like a nanoparticle. This model does not, however, adequately describe the electrostatic screening of such ions when that screening has contributions from molecular-level interactions such as van der Waals interactions, which depend on the specific chemical structure and the hydrophilicity/hydrophobicity of both the surface-bound ligands and the electrolytes.

Quantum dots, in addition to their practical applications as biological probes, are excellent model systems to investigate the role of such complex screening effects because of the sensitive response of their exciton dynamics, which we can readily map with steady-state and time-resolved optical spectroscopy, to the surrounding dielectric environment or to proximate small molecules. Here, we demonstrate control over the local electrostatic environment of near-infrared-absorbing and -emitting PbS QDs through non-covalent interactions of their 6-mercaptohexanoate (MHA) ligand shell with proximate tetraalkylammonium ($NR_4^+$) cations, FIGS. 1A and 1B. These interactions consist of electrostatic and van der Waals components, and regulate the permeability of the anionic ligand shell of the QDs to a negatively-charged small molecule, 9,10-anthraquinone-2-sulfonate (AQ, FIG. 1B), as measured by the yield of photoinduced electron transfer from the QD to AQ. We show, through photoluminescence (PL) experiments, free energy scaling analysis, and molecular dynamics simulations that, even though the cations are in fast exchange between the fully solvated state and the ion pair state, they effectively screen the repulsive interactions between the MHA and AQ and increase the probability that AQ will permeate the ligand shell. The efficacy of this screening increases as the length of the alkyl chains of the cation (R) increases, because accumulative van der Waals interactions between the backbones of MHA ligands and the alkyl chains of $NR_4^+$ increase the probability of ion pairing at the ligand/water interface.

This demonstration of the use of non-covalent interactions to control the electrostatic potential of a QD is important because non-covalent chemistry imparts great tunability to the properties of QDs in aqueous dispersions without the need for additional covalent functionalization of their surfaces. Furthermore, this work demonstrates the sensitivity of our photoinduced charge transfer method to quantitatively probe the properties of the QD/solvent interface: here, that technique successfully measures even the very weak, transient interactions between QDs and counterions, a challenge for structural and chemical characterization tools like NMR.

Synthesis of MHA-capped PbS QDs and Quantification of Their Ligand Shells. We synthesized oleate-capped PbS QDs with a first excitonic peak at 968 nm, which corresponds to a core radius of 1.6 nm. We prepared water-soluble PbS QDs capped with an adlayer of MHA by adding 400 molar equivalents of MHA to displace the native oleate ligands and subsequently transfer the QDs to water, a procedure detailed in our previous work [He, C.; Weinberg, D. J.; Nepomnyashchii, A. B.; Lian, S.; Weiss, E. A., *J. Am. Chem. Soc.* 2016, 138, 8847-54.]. We used $^1$H NMR to quantify the composition of the ligand shell of the MHA-capped QDs, and, based on five measurements on separately prepared samples, each PbS QD has an average of 102±11 MHA ligands bound to its surface. No bound oleate was detected on the surfaces of the water-soluble QDs.

The ability of $NR_4^+$ counterions to screen QD-molecule repulsion increases with bulkier R. We prepared a series of 2.63 μM samples of MHA-capped QDs mixed with 1000 equiv. of AQ and increasing molar equiv. (0-2.0×10$^5$ per QD) of $NR_4^+$, where R=—$CH_3$, tetramethylammonium (TMA); R=—$CH_2CH_3$, tetraethylammonium (TEA); R=—$(CH_2)_2CH_3$, tetrapropylammonium (TPA); or R=—$(CH_2)_3CH_3$, tetrabutylammonium (TBA). We allowed all the samples to equilibrate in the dark for four hours before performing any optical measurements. AQ is an electron acceptor with respect to photoexcited PbS QDs. The probability of electron transfer (eT) from the photoexcited QD to a proximate AQ is a measure of the permeability of the MHA ligand shell to the AQ. We measure this probability directly from the degree of photoluminescence (PL) quenching of the QD ensemble upon addition of AQ, since eT from the QD to AQ results in a charge-separated state that recombines non-radiatively. With no $NR_4^+$ present, the free energy of transfer of the charged AQ from the bulk solution to the inorganic surface of the QD increases by 154 J/mol upon introduction of each additional charged MHA ligand to the ligand shell.

Figure 2A:
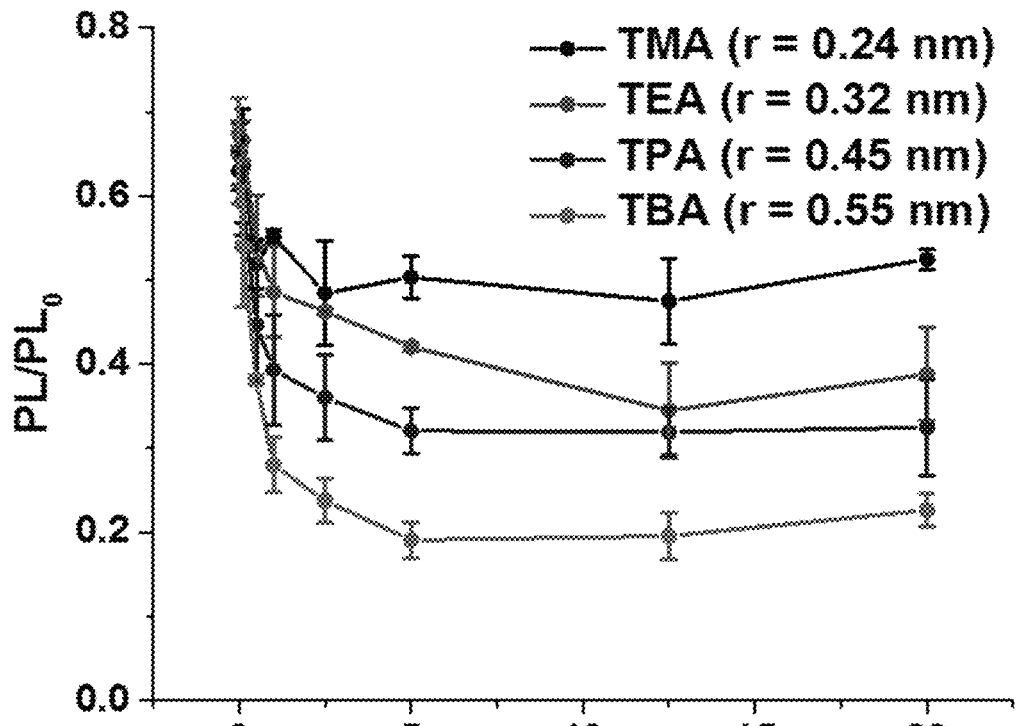
FIG. 2A shows the fraction of emissive PbS QDs (2.63 µM) in the ensemble that remain emissive upon addition of 1000 equiv. of AQ quencher ($PL/PL_0$) vs. the molar equivalents of $NR_4^+$ added to the QD sample. Three measurements on separately prepared samples were averaged to obtain each data point, and the error bars are the standard deviation of those measurements. The sizes in the legend are the hydrodynamic radii, r, of the $NR_4^+$ cations, measured by diffusion-ordered NMR spectroscopy (DOSY) in $D_2O$. Traces are TMA, TEA, TPA, and TBA from top to bottom.

In FIG. 2A, we plot "PL/PL$_0$" vs. the concentration of $NR_4^+$ in the QD solution, where "PL" is the integrated photoluminescence intensity of each sample containing 1000 equiv. of AQ and a given concentration of $NR_4^+$, and "PL$_0$" is the intensity of each sample with the same $NR_4^+$ concentration but with no added AQ. The ratio "PL/PL$_0$" is therefore the fraction of the emissive population of QDs that remain emissive after addition of the quencher AQ. For all the cation structures studied, the AQ quenches the PL of the QDs more effectively—that is, the yield of eT increases—as the concentration of the screening counterion $NR_4^+$ increases; $NR_4^+$ therefore increases the permeability of the ligand shell to AQ. The effectiveness of this screening depends on the size and structure of the counterion: the maximum yield of eT, i.e., (1—the minimum PL/PL$_0$), increases from ~50% to ~80% as we increase the number of carbons in the R groups of the cation from 1 to 4. The screening by the counterion is therefore more effective as the steric bulk of the counterion increases (while holding the charge constant).

Figure 2B:
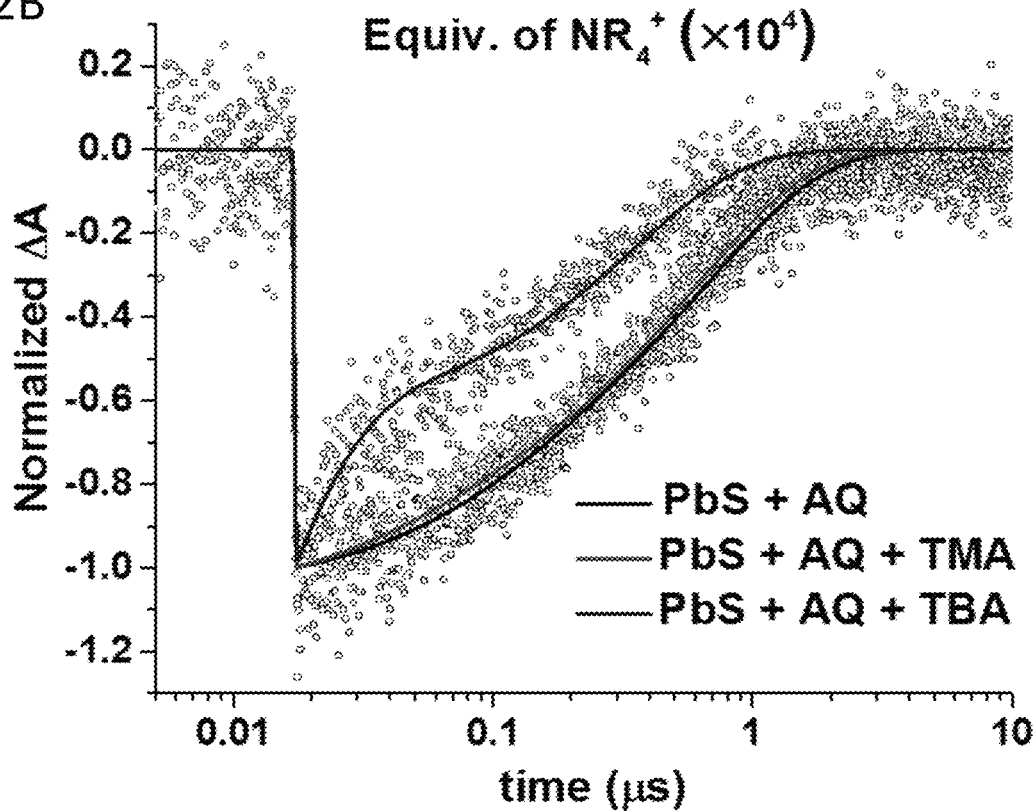
FIG. 2B shows normalized kinetic traces extracted (at the ground state bleach minimum, 1014 nm) from the nanosecond-to-microsecond TA spectrum of a 6.58 µM sample of MHA-capped PbS QDs, mixed with 1000 equiv. of AQ and no $NR_4^+$ cations (black), 1000 equiv. of AQ and 50,000 equiv. TMA (red), or 1000 equiv. of AQ and 50,000 equiv. TBA (blue). The solid lines are fits using a sum of two exponentials convoluted with an instrument response function. Traces are PbS+AQ+TBA, PbS+AQ+TMA, and PbS+AQ from top to bottom.

Transient absorption (TA) experiments on QD-AQ mixtures allow us to identify two general mechanisms of eT in this system, and to determine which is more sensitive to screening by $NR_4^+$. Addition of 1000 equiv. of AQ to PbS QDs accelerates the decay of the QD exciton, monitored as the recovery of the ground state bleach feature of the QD at 1014 nm, on both the nanosecond timescale and the microsecond timescale when no $NR_4^+$ is present. We assign the extracted single-ns decay process introduced by addition of the AQ to eT from the photoexcited QD to statically bound AQ molecules on its surface. We assign the increase in the rate of exciton decay from $(1 \text{ μs})^{-1}$ to $(0.7 \text{ μs})^{-1}$ shown in FIG. 2B to diffusion-controlled eT from the QD to AQ.

The rate and fractional amplitude of the single-ns eT process is only slightly affected by the presence of $NR_4^+$ counterions and shows negligible dependence on the bulkiness of these species, For instance, upon addition of 50,000 equiv. of TMA to the QD-AQ mixture, this time constant is 1.4 ns, and upon addition of the same amount of TBA to the QD-AQ mixture, this time constant is 1.3 ns.

The eT from the QDs to AQ on the μs timescale is, in contrast, very sensitive to the presence and identity of the $NR_4^+$ counterions. While addition of TMA seems to have negligible effect on the rate of eT on this timescale (compare black and red traces in FIG. 2B), addition of 50,000 equiv. of TBA reduces the exciton lifetime of QDs within QD-AQ mixtures by a factor of three, compare black and blue traces in FIG. 2B, and see Table 1. This result is consistent with the dramatic increase (from ~35% to ~80%) in the yield of eT from QDs to AQ upon addition of TBA measured from PL quenching experiments. It appears then, that the addition of $NR_4^+$ predominantly affects the rate and yield of diffusion-controlled eT from the QD to AQ, rather than that of eT within static QD-AQ complexes. This result is reasonable since, while static QD-AQ complexes form from occupation of AQ in gaps within the ligand shell, the rates of diffusion-controlled eT processes depend on the rate of transport of the charged AQ across the ligand/solvent interface, and this transport depends on the electrostatic interactions at this interface.

Importantly, the presence $NR_4^+$ does not affect the excited state dynamics of QDs in the absence of AQ, so the acceleration of their exciton decay in the presence of AQ can be attributed exclusively to the acceleration of the eT processes from QDs to AQ.

TABLE 1

Time Constants for Decay of the QD Exciton in the Presence of 1000 equiv. AQ, on the Nano-to-Microsecond Timescale.

| Sample | $\tau 1$ (ns)[a] (A1) | $\tau 2$ ($\mu$s)[a] (A2) | Amplitude-weighted Average Time Constant, $\tau$ ($\mu$s)[b] |
|---|---|---|---|
| PbS QD + AQ | 96 ± 26 (−0.19) | 0.70 ± 0.03 (−0.81) | 0.59 |
| PbS QD + AQ + 50,000 equiv. TMA | 51 ± 12 (−0.15) | 0.61 ± 0.07 (−0.85) | 0.53 |
| PbS QD + AQ + 50,000 equiv. TBA | 10 ± 1 (−0.39) | 0.35 ± 0.01 (−0.61) | 0.22 |

[a]Error bars are fitting errors from the kinetic traces extracted (at 1014 nm) from the nanosecond-to-microsecond TA spectrum of each sample.
[b]Calculated.

Both steady-state PL and TA measurements indicate that the ability of the cation to screen the electrostatic repulsion between the QD's ligands and AQ increases with increasing size of the cation. Here, screening is more effective for bulkier counterions. The counterions have some hydrophobic portion that can drive ion-pairing with the hydrophobic portion of the ion it screens through favorable van der Waals interactions.

Without wishing to be bound by theory, we believe that the trend we observe—that TBA screens repulsion between QD and AQ more effectively than TMA—is due to these interactions. Several factors potentially contribute to the enhanced electrostatic screening effects observed with the increasing size of $NR_4^+$. As R increases in length, $NR_4^+$ forms a thicker condensation layer on the QD surface. The bigger condensed cations, TEA, TPA and TBA, penetrate the MHA ligand shell and form multiple layers on the QD surface. Second, as the attraction strength, E, between the —$CH_2$— groups in $NR_4^+$ and MHA increases, the number of hydrophobic contacts, $n_c$, between the methylene groups of MHA and $NR_4^+$ increases for all the cations. Third, the location of the slipping plane (i.e., the location where the number density of $NR_4^+$ cations decays to its bulk value) shifts away from the QD surface as the size of $NR_4^+$ increases and their condensation layer increases in thickness. Fourth, the integrated net charge per unit area, Q(z), at the slipping plane decreases in magnitude as the alkyl chains of $NR_4^+$ increase in length, which suggests that bulkier $NR_4^+$ cations are more effective in screening the electrostatic potential of a negatively charged QD. Fifth, density of the charged ligands on the surface may allow for the cations to penetrate the ligand shell. Sixth, the length of the charged ligand may affect the degree of ordering within the ligand corona.

In summary, the electrostatic potential at the surfaces of PbS QDs, passivated by an anionic ligand shell of 6-mercaptohexanoate, can be readily adjusted by non-covalent interactions with non-coordinating tetraalkylammonium cations ($NR_4^+$) though the formation of interfacial ion pairs. By changing the length of the alkyl chains on these cations and adjusting their concentrations, we regulate the permeability of the anionic ligand shell of QDs to a negatively charged molecular redox probe, 9,10-anthraquinone-2-sulfonate. The ability of $NR_4^+$ to screen the repulsive interaction between the negatively charged QDs and the molecular probe increases as either the concentration or the steric bulkiness of $NR_4^+$ increases. The probability of forming an interfacial ion pair is regulated by not only the number of available counterions in bulk solution, but also the intrinsic binding affinity of each ligand-counterion pair. This binding affinity is influenced by both electrostatic and van der Waals contributions toward the total free energy of the system. As a result, non-covalent interactions expands the current toolset of nanoparticle surface chemistry, and suggests strategies for implementing a combination of nanoscale forces, such as electrostatic/van der Waals interactions and entropic effects, in the development of nanoparticle-based platforms in self-assembly, molecular recognition, and photocatalysis.

Synthetic Procedures for Oleate-Capped PbS QDs. We synthesized 1.6 nm oleate-capped PbS QDs using a procedure adapted from that of Hines and Scholes [Hines, M. A.; Scholes, G. D., Adv. Mater. 2003, 15, 1844-1849]. We mixed 0.36 g PbO and 2.0 mL oleic acid (OA) with 18.0 mL 1-octadecene (ODE) in a 50-mL three-neck round bottom flask at room temperature. Heating the mixture up to 150° C. with constant stirring under $N_2$ flow for an hour produced a clear and colorless solution. We cooled the mixture to 110° C., and injected 0.17 mL of hexamethyldisilathiane dissolved in 8 mL of ODE. The solution turned from orange to brown within 3 seconds. After 10 minutes, we used an ice bath to cool the reaction mixture to room temperature. The product was separated into four 50-mL centrifuge tubes for further purification. We purified the QDs by first washing the reaction mixture with acetone (6:1 by volume), and centrifuging it at 3500 rpm for 20 min. We then decanted the supernatant, dried the QD pellet, redispersed the QDs in 7.5 mL hexanes, and precipitated the QDs two additional times, as described above, using 12.5 mL methanol and acetone, respectively, as the non-solvents. The cleaned PbS QDs were finally dispersed in a minimal amount of hexanes to form the stock solution.

Synthesis of MHA-capped PbS QDs and Quantification of Their Ligand Shells. We synthesized oleate-capped PbS QDs with a first excitonic peak at 968 nm, which corresponds to a core radius of 1.6 nm based on the empirical formula reported by Moreels et al., ACS Nano 2009, 3, 3023-30, using a procedure adapted from that of Hines and Scholes, Adv. Mater. 2003, 15, 1844-1849. We prepared water-soluble PbS QDs capped with an adlayer of MHA by adding 400 molar equivalents of MHA to displace the native oleate ligands and subsequently transfer the QDs to water, a procedure detailed in our previous work[34] and in the Supporting Information. We used $^1$H NMR to quantify the composition of the ligand shell of the MHA-capped QDs, and, based on five measurements on separately prepared samples, each PbS QD has an average of 102±11 MHA ligands bound to its surface. No bound oleate was detected on the surfaces of the water-soluble QDs.

Sizing of PbS QDs via Ground State Absorption and Transmission Electron Microscopy. The ground state absorption spectrum of a 4.1 μM solution of oleate-capped PbS QDs was obtained on a Varian Cary 5000 spectrometer using a 2 mm/10 mm dual pathlength quartz cuvette. We corrected the baseline of the spectrum with hexanes prior to measurement, and determined the size of the synthesized PbS QDs (and their respective extinction coefficient) from the position of the first excitonic peak (~968 nm) using the calibration curve published by Moreels et al., *ACS Nano* 2009, 3, 3023-30. All concentrations of QDs were calculated from the absorbance of QDs at 400 nm.

In order to verify the accuracy of this calibration technique, we performed transmission electron microscopy experiments using a JEOL JEM-2100F FAST TEM. We prepared TEM samples by drop-casting a solution of PbS QDs in hexanes onto a Carbon Type B film (Ted Pella, Inc). We analyzed 81 PbS QDs using the ImageJ software package, and determined that the average diameter of these particles is 2.9±0.3 nm. The 1.6 nm radius for oleate-capped QDs that we calculated from absorption spectroscopy is within the error of our TEM measurements.

Preparation of 6-mercaptohexanoate (MHA)-capped PbS QDs by Ligand Exchange. We prepared water-soluble PbS QDs capped with MHA through ligand exchange. [He, C. et al., *J. Am. Chem. Soc.* 2016, 138, 8847-54.] We added 400 equiv. of MHA to a 5 mL sample of 40 oleate-capped PbS QDs dispersed in CHCl$_3$, and shook the mixture rigorously for 1 min until the QDs flocculated. We then added 480 equivalents of NaOH per QD (NaOH/MHA=1.2:1) to the mixture to deprotonate the —COOH groups (pK$_a$≈4.8), and make the QDs negatively charged and water-soluble. The QDs precipitated out of solution as we added NaOH, and transferred to the aqueous layer as we added 4 mL of water on top of the chloroform and gently shook the mixture. We then centrifuged this mixture at 7000 rpm for 10 min to facilitate the separation between aqueous and organic layers, which are sometimes emulsified due to the presence of surfactants. The optically clear aqueous layer was separated and washed with 10 mL chloroform to eliminate displaced oleate species, and this aqueous layer served as a stock solution of MHA-capped PbS QDs.

Quantification of MHA Ligands within the Ligand Shell of PbS QDs. We prepared MHA-capped, water-soluble PbS QDs using the procedures described above, determined their concentration from the intensity of their ground state absorption spectra at 400 nm, and applied $^1$H NMR to quantify the number of bound MHA ligands per QD. The NMR samples were 39.5 solutions of the QDs with 800 equiv. of sodium formate as an internal integration standard (singlet at 8.36 ppm, 1H). We set the acquisition time to 30 s and the relaxation time to 90 s, respectively, to allow for complete collection of the free induction decay signal and sufficient relaxation of proton nuclei between measurements, and performed 32 scans to get a spectrum with satisfactory signal-to-noise ratio. The 2.01-2.28 ppm region of the resulting spectra (which contains signal from the methylene protons alpha to the carboxylate group in MHA) is fit with a sum of Lorentzian functions, and the broad feature centered at ~2.13 ppm, which corresponds to those protons of MHA ligands that are bound to the surface of QDs, is integrated against the sodium formate internal standard. The quantitative NMR analyses are tabulated in Table 2.

TABLE 2

Compositions of the Ligand Shells of MHA-Capped PbS QDs.

| No. of Sample | No. of Bound MHA per QD |
|---|---|
| 1 | 95 |
| 2 | 90 |
| 3 | 112 |
| 4 | 97 |
| 5 | 117 |
| Average/Standard Deviation | 102 ± 11 |

Addition of NR$_4^+$ chloride salts has negligible impact on the electronic structure and colloidal stability of MHA-capped PbS QDs. Ground-state absorption spectra collected from a 2.63 μM aqueous solution of MHA-capped PbS QDs, mixed with 200,000 equiv. of TMA, TEA, TPA or TBA were superimposed. The backgrounds of these spectra were subtracted using the absorbance of an aqueous solution of the respective NR$_4^+$ chloride salt with the same concentration. The four spectra overlay satisfactorily with each other with no sign of scattering in either visible or the near infrared region, which indicates that the addition of NR$_4^+$ chloride salts has negligible effects on the electronic structure and colloidal stability of MHA-capped PbS QDs.

Figure 8:
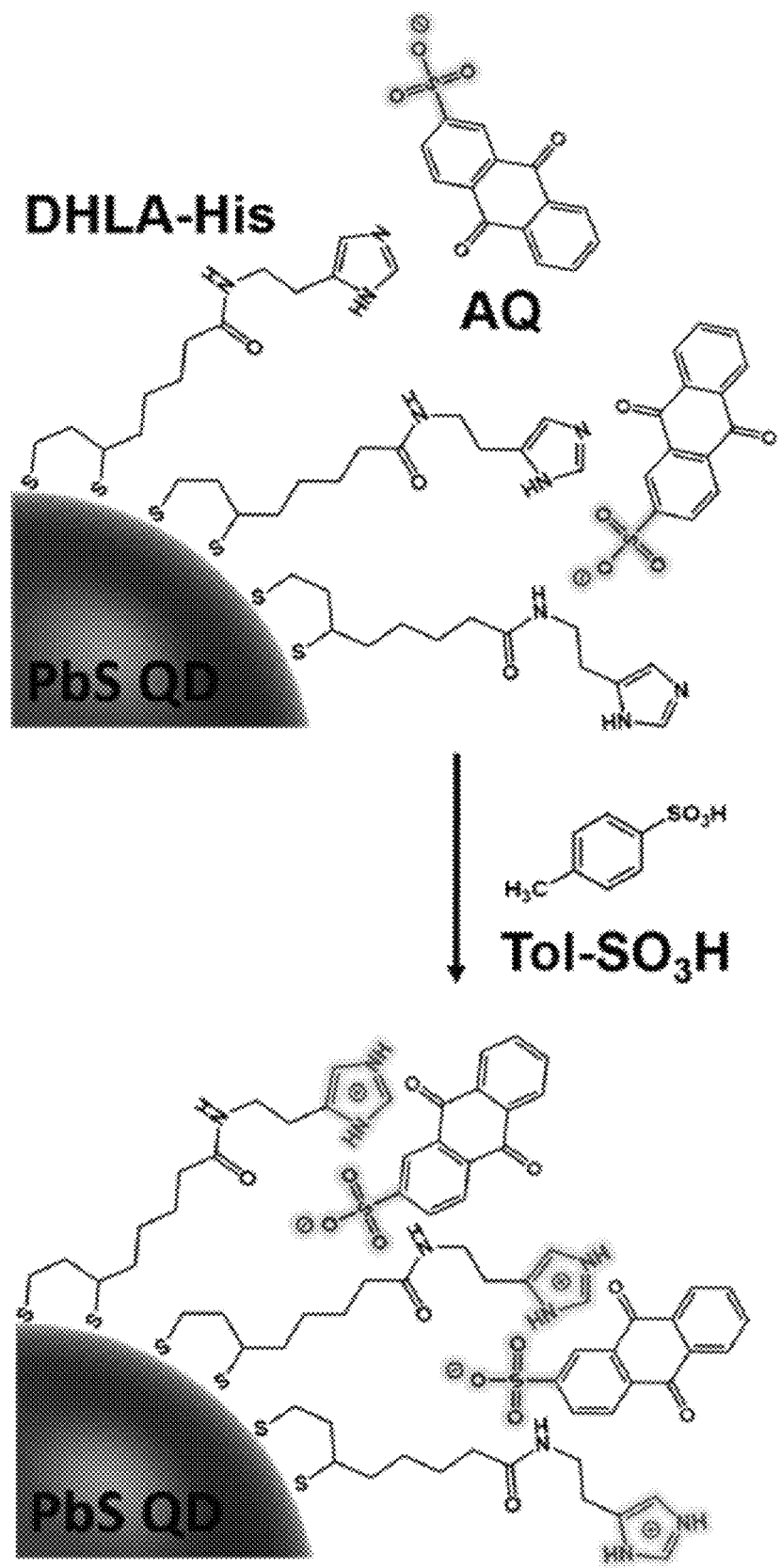
FIG. 8 shows a schematic Representation of Protonation of the Imidazole Tail Groups of the DHLA-His Ligand Shell of a PbS QD by Tol-$SO_3H$, and the Effect of This Protonation on the Permeability of the Ligand Shell to AQ, a Negatively Charged Electron Acceptor.

Representative Photoluminescence Spectra of MHA-Capped QDs upon Mixing with Increasing Molar Equivalents of NR$_4^+$ Chloride Salts. We prepared the samples for PL measurements using the procedures described above. This series of samples have no AQ added and serve as the blank controls. All the samples were contained in a 10 mm/2 mm dual path length quartz cuvette and photoexcited with an 800-nm beam along the 10-mm axis, and the corresponding PL spectra were collected in a right-angle geometry, FIG. 8. The integrated PL intensity, which we define as "PL$_0$" in the main text, FIG. 2A, is calculated from integrating each spectrum after baseline subtraction. In some cases, the PL intensity of PbS QDs is slightly enhanced upon addition of NR$_4^+$ chloride salts. This enhancement in PL quantum yield potentially results from the passivation of surface electron trap states by Cl$^-$ anions.

Representative Photoluminescence Spectra of MHA-Capped QDs upon Mixing with Increasing Molar Equivalents of NR$_4^+$ Chloride Salts and 1000 equiv. AQ. We recorded the PL spectra of these samples using the same setup described earlier. The integrated PL intensity, which we define as "PL", is calculated from integrating each spectrum after baseline subtraction, and normalized to the integrated PL intensity of their respective blank samples, "PL$_0$", to divide out the minor fluctuations in PL intensity caused by NR$_4^+$ chlorides alone.

Diffusion-Ordered Spectroscopy (DOSY) NMR determines the hydrodynamic radii of NR$_4^+$ cations. We recorded DOSY spectra of NR$_4^+$ chloride salts (TMA, TEA, TPA and TBA, 0.1 M) in D$_2$O using a double stimulated echo experiment with bipolar gradients ("dstebpgp3s" sequence) on a Bruker Avance-III 600 MHz NMR spectrometer. We used a diffusion delay, Δ, of 0.2 s, a gradient length, δ, of 2000 μs, and chose 16 gradient strength values from 5% to 60% for all our measurements. In order to determine the diffusion coefficients and hydrodynamic radii of these species, we plotted the dependence of the integrated $^1$H signal of the methylene/methyl protons alpha to N (3.10 ppm) as a function of the gradient function, G$^2$, given by eq 1, $$G^2 = (\gamma g \delta)^2 \left(\Delta - \frac{\delta}{3}\right) \quad (1)$$

where $\gamma$ is the gyromagnetic ratio of a proton ($2.68 \times 10^4$ s$^{-1}$G$^{-1}$) and g is the gradient strength (G/cm). We performed a fit of these curves using eq 2, $$I(G^2) = I_0 e^{-DG^2} = I_0 e^{-G^2/m} \quad (2)$$

to determine the diffusion coefficients, D, and calculated the hydrodynamic radii, r, using the Stokes-Einstein equation, eq 3, $$r = \frac{k_B T}{6\pi \eta D} = \frac{k_B T m}{6\pi \eta} \quad (3)$$

where $k_B$ is the Boltzmann constant ($1.38 \times 10^{-23}$ J/K), T is the temperature (298 K), $\eta$ is the viscosity of D$_2$O (0.89 mPa·s), and m=1/D. The fitting results can be found in Table 3.

TABLE 3

Fitting Parameters for DOSY Experiments on Tetraalkylammonium Cations.

| Name of species | 1/Diffusion Coefficient (m, s/cm$^2$)[a] | Diffusion Coefficient (D, × 10$^{-6}$ cm$^2$/s) | Hydrodynamic Radius (r, nm)[b] |
|---|---|---|---|
| TMA | 96443 ± 1389 | 10.4 | 0.237 ± 0.003 |
| TEA | 130929 ± 390 | 7.64 | 0.321 ± 0.001 |
| TPA | 184517 ± 520 | 5.42 | 0.453 ± 0.001 |
| TBA | 224341 ± 945 | 4.46 | 0.550 ± 0.002 |

[a]Error bars are fitting errors.
[b]Errors are propagated directly from the fitting errors in m using the equation
$\Delta r = \frac{k_B T}{6\pi \eta} \times \Delta m$.

NR$_4^+$ cations are in fast exchange between the fully-solvated state and the ion pair state when mixed with oppositely charged QDs. We prepared two samples where TBA chloride salt is either dissolved in pure D$_2$O or mixed with a 2.63 µM sample of MHA-capped PbS QDs (TBA:QD=50:1). We recorded DOSY spectra on these samples using the procedures described above, and applied eqs 2 and 3 to extract the diffusion coefficient and hydrodynamic radius of TBA cations. We observe that both spectra are well-fit by a single-exponential function, which indicates that there's consistently one single population of TBA cations in solution; ii) the hydrodynamic radius of TBA mixed with QDs shows an increase of up to 12% compared to the sample without any added QDs, see Table 4. We therefore conclude that TBA cations are in fast exchange on and off the QD surface, a process that cannot be deconvolved within the temporal resolution of NMR and contributes to a weighted-average of hydrodynamic radii between the two states.

TABLE 4

Fitting Parameters for DOSY Experiments on TBA Chloride in Aqueous Solution.

| Name of sample | 1/Diffusion Coefficient[a] (m, s/cm$^2$) | Diffusion Coefficient (D, × 10$^{-6}$ cm$^2$/s) | Hydrodynamic Radius[b] (r, nm) |
|---|---|---|---|
| QD + 50 TBA | 250843 ± 3338 | 3.99 | 0.615 ± 0.008 |
| TBA only | 224341 ± 945 | 4.46 | 0.550 ± 0.002 |

[a]Error bars are fitting errors.
[b]Errors are propagated directly from fitting errors in m using the equation
$\Delta r = \frac{k_B T}{6\pi \eta} \times \Delta m$.

Figure 1A:
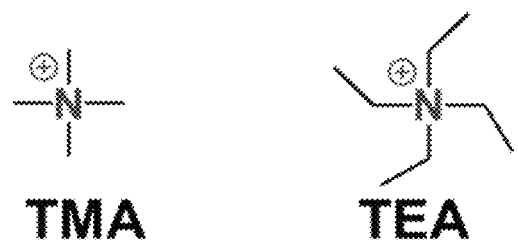
FIG. 1A shows structures of the $NR_4^+$ cations, which we add to the QDs as chloride salts: R=—$CH_3$, tetramethylammonium (TMA); R=—$CH_2CH_3$, tetraethylammonium (TEA); R=—$(CH_2)_2CH_3$, tetrapropylammonium (TPA); and R=—$(CH_2)_3CH_3$, tetrabutylammonium (TBA) cations.
Figure 1A:
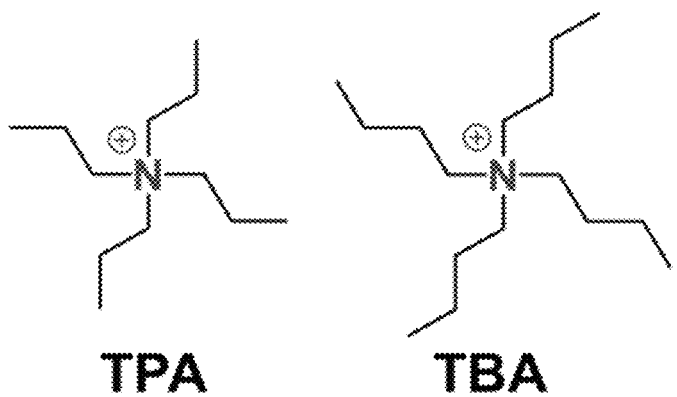
Figure 1B:
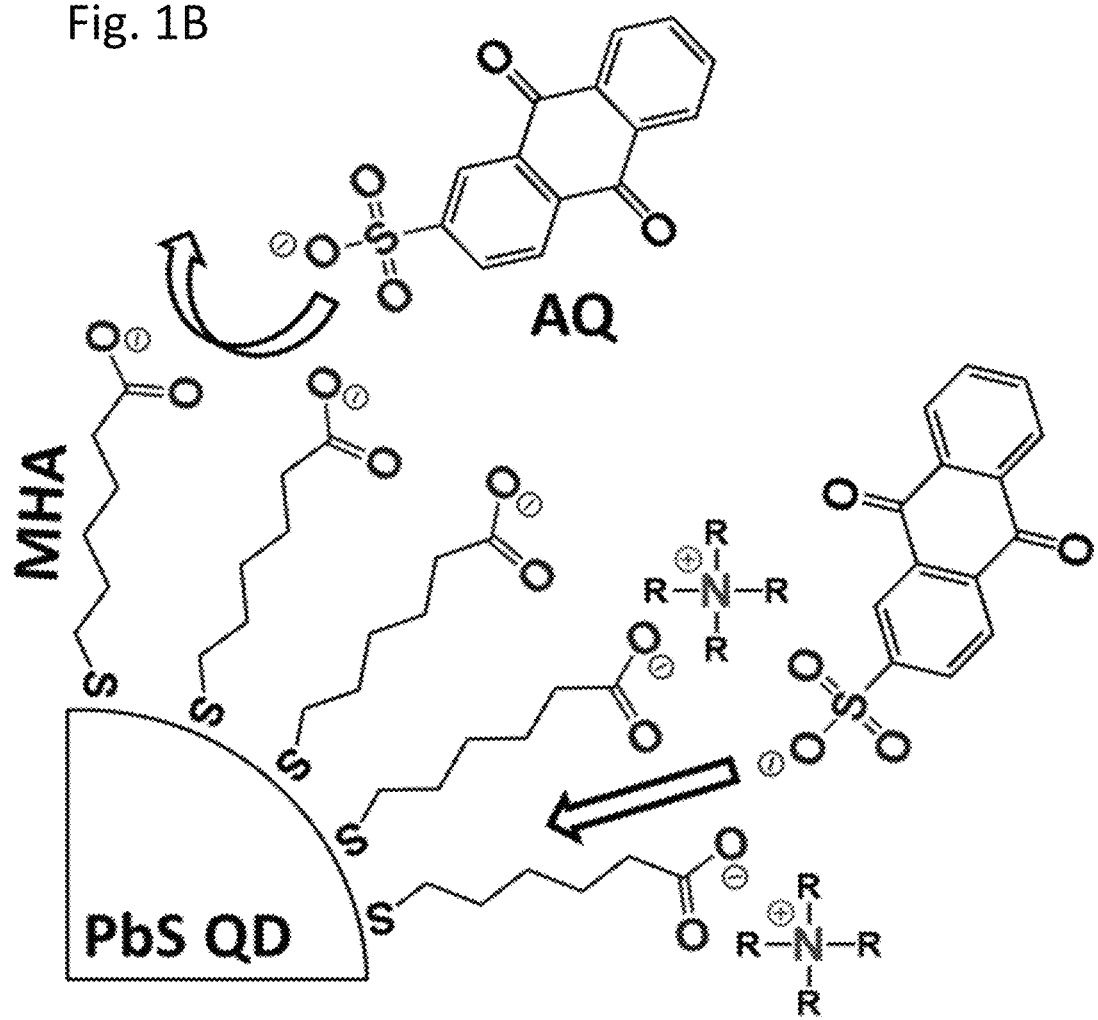
FIG. 1B shows a chematic representation of $NR_4^+$ forming ion pairs with the carboxylate tail groups of 6-mercaptohexanoate (MHA) ligands, thereby enhancing the permeability of this anionic ligand shell toward 9,10-anthraquinone-2-sulfonate (AQ), the electron acceptor. The positive and negative charge centers are highlighted in red and blue, respectively. We added AQ to the QDs as a sodium salt.
Figure 3:
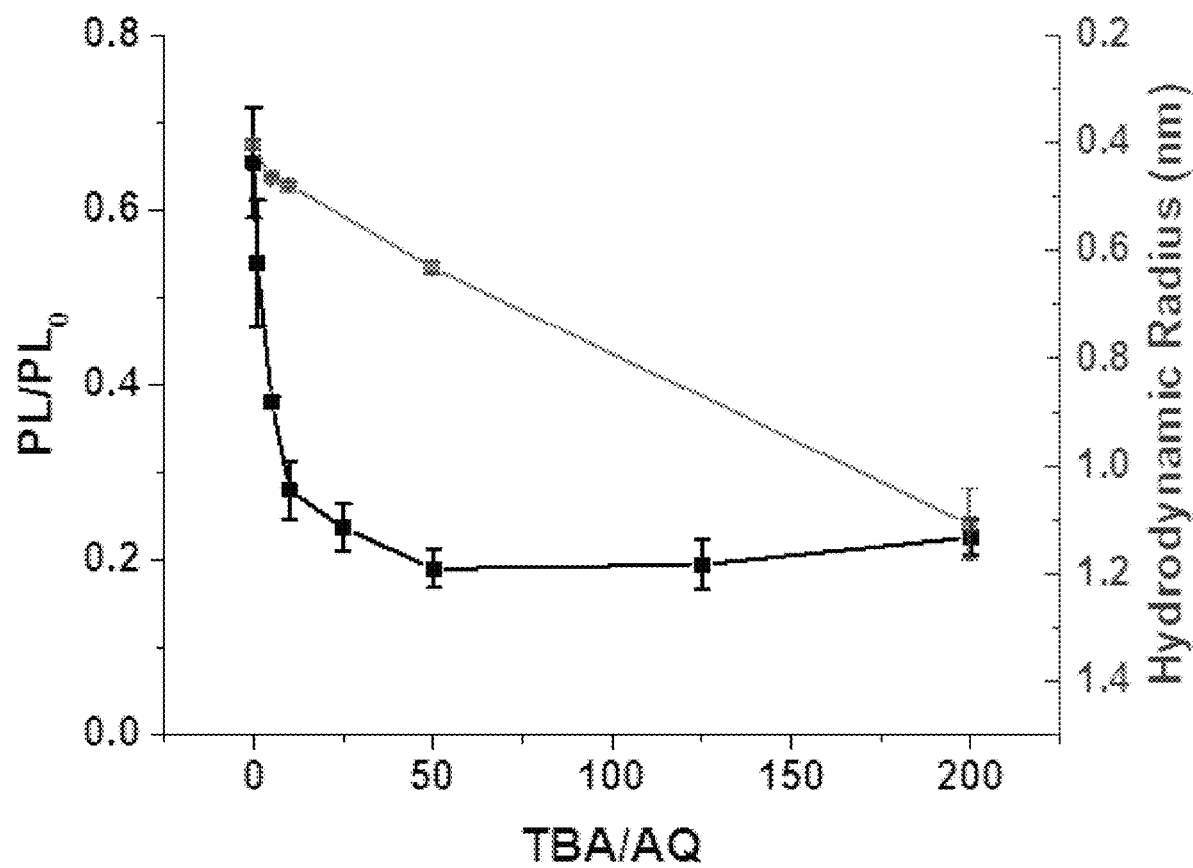
FIG. 3 shows $PL/PL_0$ of a 2.63 µM solution of MHA-capped PbS QDs mixed with 1000 equiv. of AQ and increasing equiv. of TBA, plotted as a function of increasing TBA/AQ ratio (curved plot), and hydrodynamic radius of AQ calculated from DOSY and plotted as a function of increasing TBA/AQ ratio (linear plot). While $PL/PL_0$ saturates from 0.75 to 0.2 drastically as TBA/AQ increases from 0 to 50, the hydrodynamic radius of AQ only increased gradually by a factor of 1.6; the two-fold increase in hydrodynamic radius when TBA/AQ increases from 50 to 200, however, seems to have no effect on the yield of PL quenching.

The ion-pairing effect between AQ and NR$_4^+$ is not the major contributor to the increasing yield of PL quenching in FIG. 1A. We recorded DOSY spectra on five 2.63 mM samples of AQ mixed with increasing equiv. (0-200 per AQ) of TBA chloride salt in D$_2$O using the same pulse sequence described above, and calculated the diffusion coefficient and hydrodynamic radius of AQ in each sample using eqs 2 and 3, see Table 5. Here we note that the concentration of AQ and the range of concentrations for TBA are the same as those samples we used for PL measurements. The hydrodynamic radii of AQ are plotted with PL/PL$_0$ (from FIG. 2A), as a function of the TBA/AQ ratio, see FIG. 3. The lack of resemblance between these two curves suggests that it is the ion-pairing effect between the QD ligand shell and NR$_4^+$, not the ion-pairing effect between AQ and NR$_4^+$, that results in the enhanced yield of electron transfer between PbS QDs and AQ.

TABLE 5

Fitting Parameters for DOSY Experiments on a 2.63 mM Solution of AQ Mixed with Increasing Equiv. of TBA Chloride.

| Name of sample | 1/Diffusion Coefficient[a] (m, s/cm$^2$) | Diffusion Coefficient (D, × 10$^{-6}$ cm$^2$/s) | Hydrodynamic Radius[b] (r, nm) |
|---|---|---|---|
| AQ only | 165639 ± 3842 | 6.04 | 0.406 ± 0.009 |
| AQ + 5 TBA | 190424 ± 2112 | 5.25 | 0.467 ± 0.005 |
| AQ + 10 TBA | 195676 ± 1817 | 5.11 | 0.480 ± 0.004 |
| AQ + 50 TBA | 258552 ± 4484 | 3.87 | 0.634 ± 0.011 |
| AQ + 200 TBA | 454235 ± 27021 | 2.20 | 1.11 ± 0.066 |

[a]Error bars are fitting errors.
[b]Errors are propagated directly from the fitting errors in m using the equation
$\Delta r = \frac{k_B T}{6\pi \eta} \times \Delta m$.

Transient Absorption Measurements. Picosecond-to-nanosecond Transient Absorption Spectroscopy. We split the 2.5-mJ output of a commercial amplified Ti-sapphire laser (Solstice, 1 kHz, 100 fs, Spectra Physics), and guided 95% to an optical parametric amplifier (TOPAS-C, Light Conversion) used to produce the pump wavelength (850 nm) for sample excitation, and 5% to a commercial TA spectrometer (HELIOS, Ultrafast Systems) for use as the probe for TA experiments with pump-probe delay times up to 3200 ps. Within the spectrometer, a single filament broadband continuum of probe wavelengths from 900 to 1400 nm was generated in a 1.2-cm thick sapphire plate and then passed through a long-wave pass filter to isolate near-infrared wavelengths above 850 nm. The probe light was then split into sample and reference beams. We combined the sample beam with the pump light at the sample, which was contained in a 2-mm quartz cuvette. The transmitted probe signal was collected into an optical fiber and dispersed onto an array detector. Dividing the signal from the sample beam by the signal from the reference beam allowed us to divide out any fluctuations in the probe beam intensity during the experiment. The output differential absorption spectrum (□A) was obtained through active background subtraction of the ground state spectrum by chopping the pump at 500 Hz. The pump light was depolarized to prevent unintentional photoselection so that measurements reflect only population dynamics, and we adjusted the power to 100 µW to avoid any multi-exciton effects. The solution was stirred with a magnetic stir bar to minimize local heating.

Nanosecond-to-microsecond Transient Absorption Spectroscopy. We used a commercial spectrometer (EOS, Ultrafast Systems) to collect TA spectra for pump-probe delay times from 0.5 ns-10 µs. The excitation beam was generated by the same method and followed the same beam path as the excitation used for the picosecond-to-nanosecond TA experiment described above. The proprietary EOS light source generates a super-continuum (400-1700 nm) probe pulse by focusing a diode laser into a photonic crystal fiber. The repetition rate of the probe pulse is 2 kHz, which is twice the repetition rate of the pump pulse, and it is triggered in sync with the pump pulse. The pump-probe delay is electronically generated and measured by an electronic timer-counter-analyzer (Pendulum). After the probe pulse passes through an 850-nm long pass filter, it is split by a beam-splitter into sample and reference beams. The sample beam was sent onto the sample, which was contained in a 2-mm quartz cuvette, and focused to a spot size of ~200 µm. The reference and sample beams are then collected in optical fibers and dispersed onto array detectors. In order to achieve reasonable signal to noise, the incident power of pump light was adjusted to 2 mW. The solution was stirred with a magnetic stir bar to minimize local heating.

We performed transient absorption experiments, as described above, on a set of separately prepared 6.58 µM PbS QDs. The compositions of these samples are described in the main text. These samples were allowed to equilibrate in the dark overnight before we took measurements. We applied a sum of exponentials convoluted with an instrument response function (in this case, a Gaussian pulse) to fit the kinetic traces of the ground state bleach (extracted at 1014 nm) and determine the relaxation dynamics of photo-excited carriers on both ultrafast and nanosecond-to-microsecond timescales, eq 4.

$$y = IRF \otimes \sum_{1}^{n} A_n e^{\frac{-(t-t_0)}{\tau_n}} \quad (4)$$

Here n is the minimal number of exponential functions required to adequately fit the data, that is, to yield a symmetric, random distribution of residuals around the zero line.

For QD samples with no added AQ, the kinetic traces of the ground state bleach on a picosecond-to-nanosecond time scale are fit with a sum of three exponentials. These three time constants are fixed when we fit the kinetics from the same QD samples mixed with AQ (while their amplitudes are allowed to vary), and a fourth exponential is added to account for the accelerated decay of QD excitons induced by electron transfer. The fitting parameters are summarized in Table 6.

The nanosecond-to-microsecond kinetic traces of the ground state bleach for QDs mixed with $NR_4^+$ counterions and AQ are fit with a sum of two exponential functions. We also fit the kinetic traces extracted from the TA spectra of QD samples with no added AQ, and the fitting parameters are tabulated in Table 6. These data show that the presence of $NR_4^+$ counterions alone has negligible effects on the exciton dynamics of QDs, and the excited state life time of these QDs is consistently ~1 µs.

TABLE 6

Time Constants for Decay of the QD Exciton on a Pico-to-nanosecond Time Scale.

| Sample | $\tau_1$ (ps)[a,b] ($A_1$) | $\tau_2$ (ps)[a,b] ($A_2$) | $\tau_3$ (ps)[a,c] ($A_3$) | $\tau_4 = \tau_{eT}$ (ns)[a,d] ($A_4$) |
|---|---|---|---|---|
| PbS QD | 2.5 ± 0.7 (−0.07) | 38.3 ± 8.9 (−0.06) | >3000 (−0.87) | — |
| PbS QD + AQ | 2.5 ± 0.7 (−0.03) | 38.3 ± 8.9 (−0.05) | >3000 (−0.66) | 2.2 ± 0.3 (0.23) |
| PbS QD + TMA | 3.4 ± 1.3 (−0.05) | 31.3 ± 10.3 (−0.04) | >3000 (−0.90) | — |
| PbS QD + AQ + TMA | 3.4 ± 1.3 (−0.03) | 31.3 ± 10.3 (−0.06) | >3000 (−0.67) | 1.4 ± 0.1 (0.23) |
| PbS QD + TBA | 3.4 ± 0.9 (−0.06) | 50.0 ± 14.0 (−0.05) | >3000 (−0.88) | — |
| PbS QD + AQ + TBA | 3.4 ± 0.9 (−0.04) | 50.0 ± 14.0 (−0.07) | >3000 (−0.65) | 1.3 ± 0.1 (0.22) |

[a]Error bars are fitting errors.
[b]These small-amplitude components correspond to surface-mediated charge trapping processes.
[c]This component is well beyond the measurable time window (3 ns) of our TA set up and cannot be fit accurately, but is required to make the fittings converge.
[d]This component corresponds to the electron exchange process (marked by eT) between photoexcited QDs and AQ, the rate and magnitude of which is not sensitive to the presence and structure of $NR_4^+$ counterions. Here we note that this component could contain contributions from both the charge separation (electron transfer from the conduction band of QD to the LUMO of AQ) and the charge recombination (recombination between the electron on AQ and the hole in the valence band of QD) processes, but we are not able to deconvolve them.

Calculations of Amplitude-Weighted Average Time Constants. The amplitude-weighted average time constants, τ, for decay of the QD exciton on a nano-to-microsecond time scale are calculated using the following equation:

$$\tau = \frac{\Sigma A_i \tau_i}{\Sigma A_i} \quad (5)$$

where $A_i$ and $\tau_i$ are the amplitude (%) and individual time constant for each component of excitonic decay (see Table 1 and Table 7), which we obtained from fitting the kinetic traces of TA spectra with a sum of exponential functions.

TABLE 7

Time Constants for Decay of the QD Exciton on a Nano-to-microsecond Time Scale.

| Sample | $\tau_1$ (ns)[a,b] ($A_1$) | $\tau_2$ (µs)[a] ($A_2$) | Amplitude-weighted Average Time Constant, $\tau^c$ (µs) |
|---|---|---|---|
| PbS QD | 184 ± 35 (−0.15) | 1.14 ± 0.03 (−0.86) | 1.01 |
| PbS QD + TMA | 158 ± 52 (−0.14) | 1.06 ± 0.02 (−0.86) | 0.93 |
| PbS QD + TBA | 85 ± 18 (−0.10) | 1.03 ± 0.02 (−0.90) | 0.94 |

[a]Error bars are fitting errors.
[b]Correspond to surface-mediated charge trapping processes.
[c]Calculated.

Control of Redox Activity by Tuning the Electrostatic Interactions at the Nanoparticle-Solvent Interface Herein we report the relationship between a controlled electrostatic charge density within the organic adlayer of a colloidal PbS quantum dot (QD) and the permeability of that adlayer to a negatively charged small molecule, 9,10-anthraquinone-2-sulfonic acid sodium salt (AQ). We coat the PbS QDs with mixed monolayers of neutral ligands (6-mercaptohexanol, MHO) and ligands with a negatively charged tail group (6-mercaptohexanoate, MHA), and change the ratio of MHO to MHA within the monolayer to tune the Coulomb repulsion between the outer surface of the ligand shell and the charged sulfonate substituent on AQ. These nanoscale electrostatic interactions control the permeability of the ligand shell to AQ, and the probability of photoinduced electron transfer (eT) from the QD to AQ.

Measurement of the yield of photoinduced eT between the QD and AQ is a sensitive probe of adlayer permeability. The yield of eT upon mixing, for example, 200 molar equivalents of AQ with the QDs ranges from 10% at a charge density of 1.1 charges/nm$^2$ to 98% at a charge density of 0.29 charges/nm$^2$. The basis of this technique is that eT between a QD and a small molecule acceptor does not occur on a timescale competitive with other relaxation mechanisms of the QD unless the small molecule has permeated through the ligand shell and is at (or very near) the inorganic surface of the particle. The probability of eT is therefore directly correlated with the probability of permeation. The use of photoinduced interfacial eT, rather than cyclic voltammetry (which is commonly used to probe the structure of monolayers on planar metal and metal nanoparticles) for this measurement is necessary because applied static potentials typically induce irreversible redox processes on QD surfaces, whereas eT from the photoexcited state of the QD is reversible and non-destructive.

This work allows us to rationally design monolayers of photoactive, electroactive, semiconductor QDs for nanoscale molecular recognition based on electrostatic interactions.

Synthesis of Water-Soluble PbS QDs. Oleate-capped PbS QDs with a first excitonic peak at ~985 nm and radius of 1.6 nm were synthesized using a procedure adapted from that of Hines and Scholes, *Adv. Mater.* 2003, 15, 1844-1849. We prepared water-soluble PbS QDs capped with mixed monolayers of 6-mercaptohexanoate (MHA) and 6-mercaptohexanol (MHO) through ligand exchange using a method adapted from those of Hyun et al., *J. Phys. Chem. B* 2007, 111, 5726-5730 and Kalsin et al., *J. Am. Chem. Soc.* 2007, 129, 6664-6665. We added 400 equivalents of thiols per QD in total, with various MHO/MHA ratios, to a 5 mL sample of 40 µM oleate-capped PbS QDs dispersed in CHCl$_3$, and shook the mixture rigorously for 1 min until the QDs flocculated. We then added between 96 and 480 equivalents of NaOH per QD (NaOH/MHA=1.2:1) to the mixture to deprotonate the —COOH groups (pK$_a$≈4.8), and make the QDs negatively charged and water-soluble. The QDs precipitated out of solution as we added NaOH, and transferred to the aqueous layer as we added 4 mL of water on top of the chloroform and gently shook the mixture. We then centrifuged this mixture at 7000 rpm for 10 min to facilitate the separation between aqueous and organic layers, which are sometimes emulsified due to the presence of surfactants. The optically clear aqueous layer was separated and washed with 10 mL chloroform to eliminate displaced oleate species, and this aqueous layer served as a stock solution of MHA/MHO-capped PbS QDs. The range of pH for all QD samples (2.63 µM) we investigated was 9.6-10.3. $^1$H NMR spectra of the aqueous QD dispersions show that all the oleate ligands that were initially bound to the QDs are displaced upon addition of 400 equivalents of thiols.

Quantification of MHA/MHO Mixed-monolayer Ligand Shell. We prepared water-soluble PbS QDs capped with mixed monolayers of MHO/MHA of six different compositions using the procedures described above, and determined their concentrations from the intensity of their ground state absorption spectra at 400 nm. We then prepared a 13.2 µM sample of each type of QD in D$_2$O and quantified the compositions of the ligand shells of the QDs in each sample by $^1$H NMR spectroscopy, with 800 equivalents of sodium formate added as the internal integration standard (sharp singlet at 8.33 ppm, 1H). We set the acquisition time to 27 s and the relaxation time to be 90 s to allow for complete collection of FID signal and sufficient relaxation of $^1$H nuclei between measurements, performed 8 scans of each sample (except for samples 5 and 6, for which we took 32 scans in order to improve the S/N ratio), and used a sum of 5 Lorentzian functions to fit the acquired spectra.

The NMR spectra of the MHO/MHA-capped QDs contain a broad peak centered at ~2.07 ppm corresponding to the protons alpha to the —COO$^-$ in bound MHA and a sharp triplet centered at ~2.03 ppm corresponding to those protons on freely diffusing MHA. A weak singlet at ~2.08 ppm is assigned to an unknown impurity; the intensity of this peak does not scale with the concentration of MHA, and we subtract this feature from the spectrum before integrating any peaks. The total number of MHA (bound plus free) per QD in solution is calculated by integrating the portion of the spectrum containing both peaks. In order to deconvolute the bound and free MHA signals, we integrate the broad feature and sharp triplet from 1.96 to 2.20 ppm separately against the sodium formate internal standard, and assign these two numbers as the number of bound and free MHA per QD, respectively. Table 8 lists the results of our quantitative NMR analysis for all six samples of MHA/MHO-capped PbS QDs with different mixed monolayer compositions. We note that the total number of MHA ligands per PbS QD, as measured by NMR, is in a few cases slightly (up to 9.6%) larger than the total equivalents of MHA we added, a discrepancy that can be accounted for by (i) the systematic error of our NMR measurement (~+8%), and (ii) incomplete phase transfer: up to 15% of oleate-capped QDs, either unreacted or only partially exchanged by MHA, are not present in the final aqueous solution, which increases the MHA:QD ratio.

TABLE 8

Compositions of the Mixed Organic Adlayers of MHA/MHO-Capped PbS QDs.

| No. of sample | Eq. of MHA/MHO Added to PbS QDs | Eq. of MHA (Bound + Free) Measured$^{a,b}$ | Eq. Bound MHA Measured (x)$^{a,c}$ | Eq. Free MHA Measured$^{a,d}$ | Eq. Bound MHO Estimated$^{a,e}$ |
|---|---|---|---|---|---|
| 1 | 400/0   | 438 ± 36 | 115 ± 9 | 323 ± 27 | 0 |
| 2 | 320/80  | 311 ± 26 | 100 ± 8 | 210 ± 17 | 80 |
| 3 | 280/120 | 286 ± 24 | 94 ± 8  | 192 ± 16 | 116 ± 8 |
| 4 | 240/160 | 263 ± 22 | 81 ± 7  | 182 ± 15 | 139 ± 7 |
| 5 | 160/240 | 170 ± 14 | 67 ± 6  | 104 ± 9  | 153 ± 6 |
| 6 | 80/320  | 86 ± 7   | 31 ± 3  | 55 ± 5   | 189 ± 3 |

$^a$The errors are propagated from systematic error in the NMR measurement using the calibration plot.
$^b$Calculated from the sum of the bound (~2.07 ppm, broad feature) and free (~2.03 ppm, sharp triplet) MHA signals.
$^c$Calculated from the broad feature centered at ~2.07 ppm.
$^d$Calculated from the triplet centered at ~2.03 ppm.
$^e$Estimated as (220-no. of bound MHA). If fewer than (220-no. of bound MHA) MHO ligands were added, eq. of MHO bound = eq. of MHO added.

The number of MHO ligands bound per QD is more difficult to determine from their NMR spectra, because the MHO molecules are in fast exchange with the QD surface, and therefore present a single broad feature at ~3.5 ppm. We estimate the number of bound MHO ligands per QD by subtracting the number of bound MHA ligands per QD from 220, the total number of thiol binding sites per QD, which we measured by titrating the oleate-capped QDs with hexanethiol and counting the number of displaced oleates. This method of ligand counting is indirect, but only the number of bound MHA per QD (and not the number of bound MHO per QD) determines the charge density at the QD surface, so the absolute number of MHO per QD is not critical to the analysis that follows. There are no detectable oleate ligands bound to the surfaces of the QDs after phase transfer.

Figure 4A:
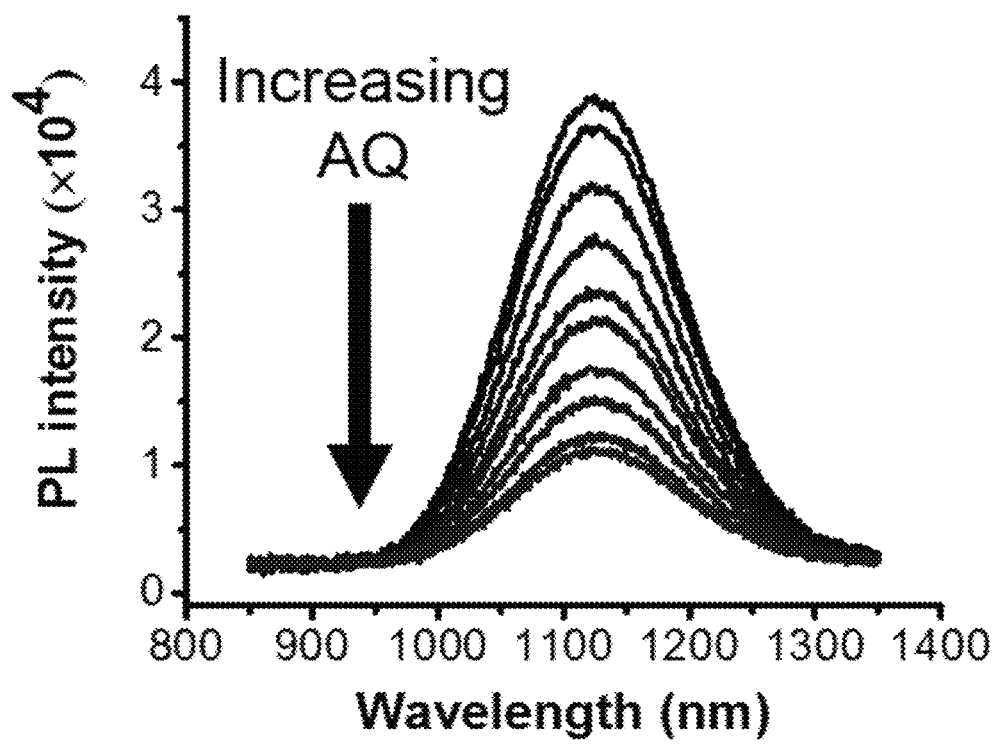
FIG. 4A shows PL spectra of sample 1 (see Table 8), 2.63 µM PbS QDs each capped by 115 MHA ligands, mixed with increasing equivalents of AQ. The decreasing intensity of PL indicates a growing eT yield as we increase the number of electron acceptors adsorbed per QD.

Photoinduced Electron Transfer Occurs from PbS QDs to Adsorbed AQs. We added a series of equivalents of AQ (20 eq.-6000 eq.), which has one negative charge on its sulfonate group ($pK_a$=−1.8[33]), to 2.63 μM of PbS QDs, and allowed all of the samples to sit in the dark for four hours to equilibrate. The PL of the QDs decreased monotonically with increasing equivalents of AQ added, FIG. 4A. Based on the electrochemical potentials of AQ and the measured conduction and valence band-edges of PbS QDs of this size, measured using photoemission spectroscopy, electron transfer from the conduction band-edge (or LUMO) of the QD to the LUMO of AQ is the most likely mechanism for quenching of the QDs' PL. Electron transfer has a driving force of −0.3 eV, but both hole transfer and energy transfer from the QD to AQ are energetically uphill and do not occur.

Figure 5A:
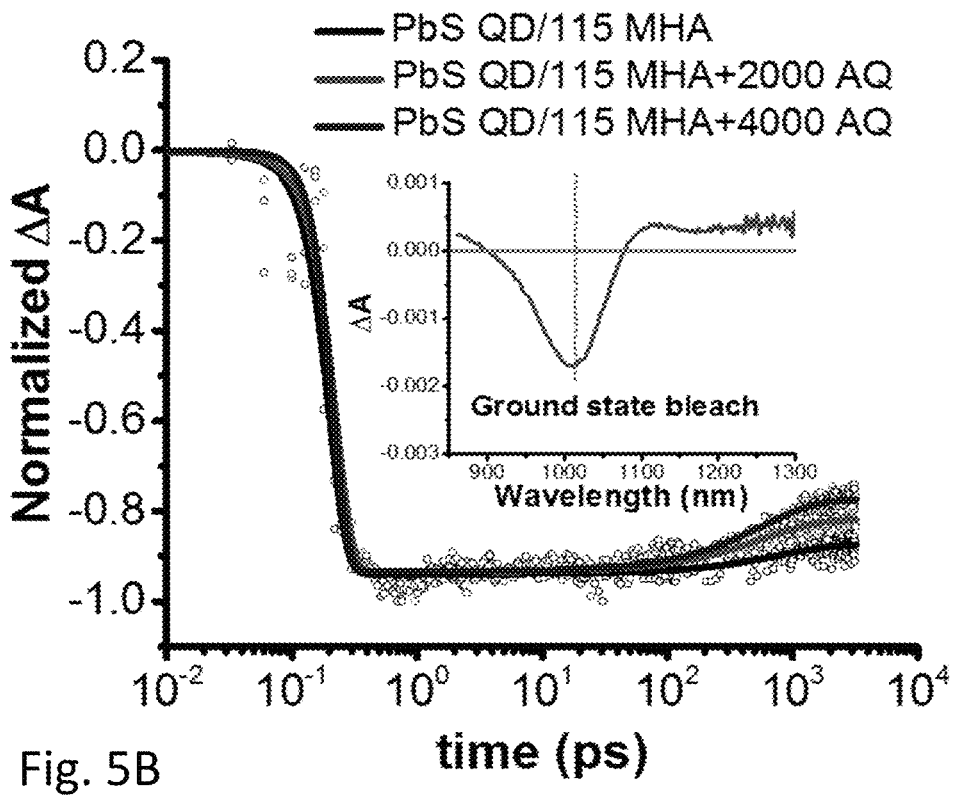
FIG. 5A shows normalized kinetic traces extracted at the ground state bleach (1014 nm, inset) from the TA spectrum of a 6.58 µM sample of 115-MHA capped PbS QDs mixed with 0 eq. (black), 2000 eq. (red) and 4000 eq. (blue) of AQ. The solid lines in FIG. 5A are multi-exponential fits of the traces with parameters summarized in Table 10.
Figure 5B:
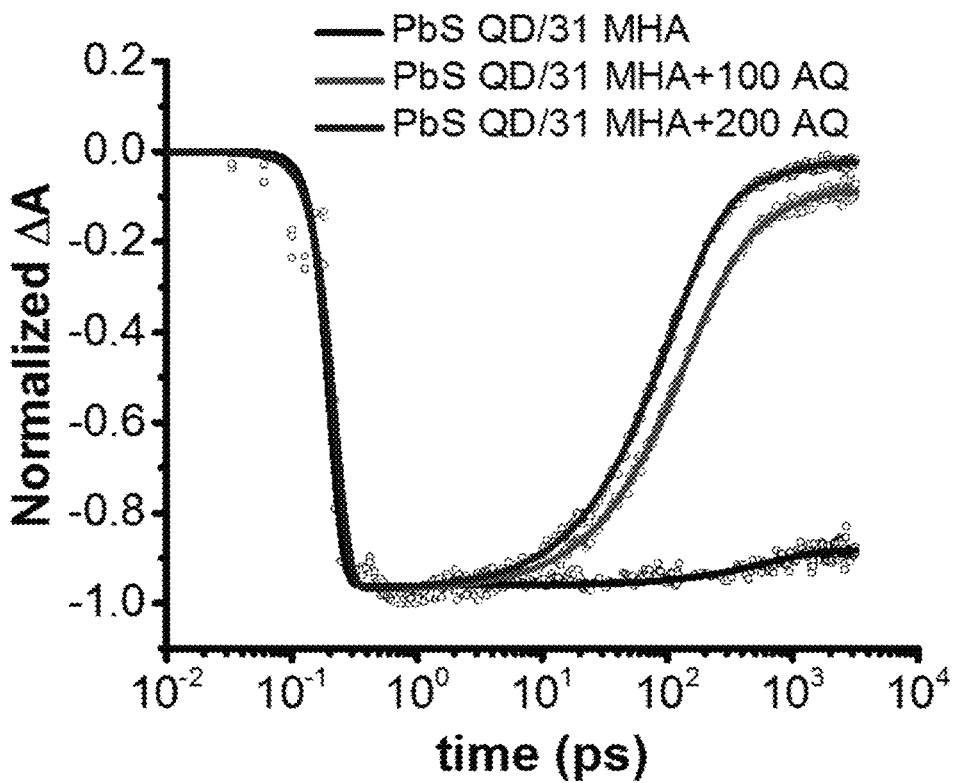
FIG. 5B shows normalized kinetic traces extracted (at 1039 nm) from the TA spectrum of a 6.58 µM sample of 31 MHA-capped PbS QDs mixed with 0 eq. (black), 100 eq. (red) and 200 eq. (blue) of AQ. The solid lines in FIG. 5B are multi-exponential fits of the traces with parameters summarized in Table 10.

Transient absorption (TA) measurements on the QD/AQ mixtures confirm that the PL quenching upon addition of AQ is due to photoinduced electron transfer from the QD to AQ. We performed TA on the picosecond-to-nanosecond timescale on two samples of QDs with different surface compositions, one with QDs capped with 115 MHA/QD (sample 1) and one with QDs capped with 31 MHA/QD (sample 6), each mixed with two different concentrations of AQ, as shown in FIGS. 5A and 5B. We also performed the same measurements for these two QD samples with no added AQ. The inset of FIG. 5A shows a representative TA spectrum of 115 MHA-capped PbS QDs, at 2 ps after excitation with a 850-nm pump pulse. The large negative feature is the ground state bleach, and we monitor its evolution in time to measure the dynamics of exciton decay in the absence and presence of AQ. FIGS. 5A and 5B show these dynamics on the picosecond-to-nanosecond timescale for the QDs with different surface compositions. Addition of AQ to the QDs induces additional decay pathways on the 100-ps timescale, and this new decay gets faster (and results in a larger bleach recovery) as the number of equivalents of AQ increases. These observations are consistent with the PL quenching data (FIG. 4A), and are characteristic of depopulation of the excited state by electron transfer (eT) from the exciton of the QD to the LUMO of statically adsorbed AQ, as we and others have seen for many QD-molecule combinations. The observed rate constant for eT scales linearly with the number of adsorbed molecular acceptors. The intrinsic eT rate within each QD-AQ pair was calculated to be $2.4\pm0.2\times10^9$ s$^{-1}$ from fitting a plot of the observed eT rate vs. the number of bound AQs, λ, with a line.

Figure 4B:
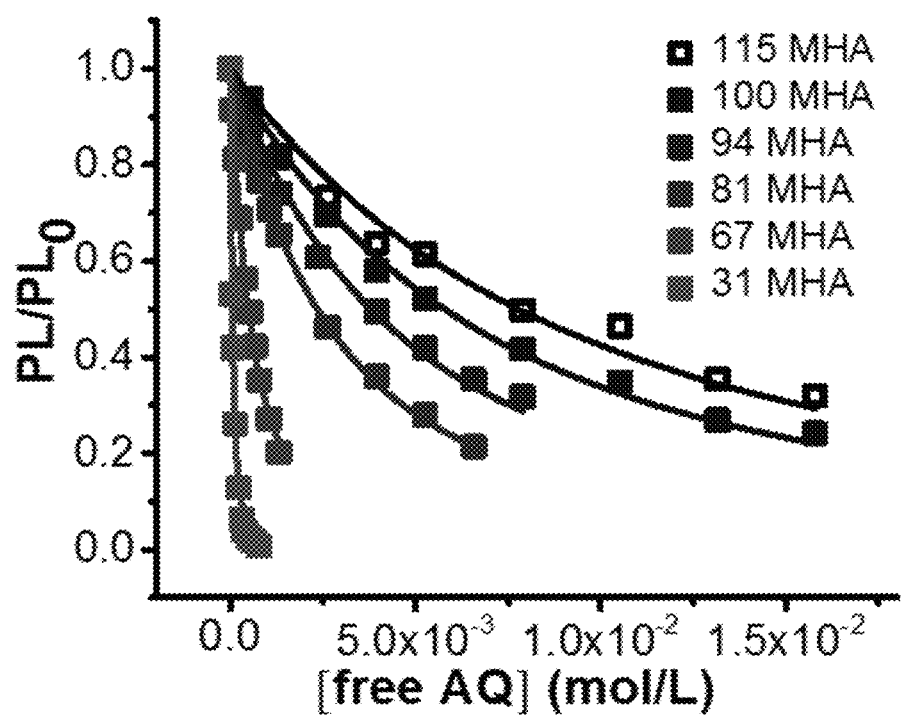
FIG. 4B shows plots of $PL/PL_0$, the fraction of originally emissive QDs that remain emissive after addition of AQ, vs. concentration of free AQ in solution. The lower the surface coverage of the negatively charged MHA ligand on the QDs, the more efficiently AQ quenches the PL of the QDs. The PL quenching for the sample of the QDs capped with 115 MHA ligands (shown in open symbols) has a contribution from collisional eT between freely diffusing species, in addition to the quenching within static QD-AQ complexes.

The Yield of Photoinduced Electron Transfer is a Probe of the Permeability of the Charged Organic Adlayer to AQ. FIG. 4B contains plots of the ratio $PL/PL_0$—the fraction of emissive QDs in a sample that remain emissive after addition of AQ—vs. the concentration of free AQ in the sample, for QDs with the six surface compositions that we studied with NMR. For a given concentration of added AQ, $PL/PL_0$ increases with increasing coverage of the charged MHA ligand; therefore, the yield of eT to the charged AQ molecule (which is inversely proportional to $PL/PL_0$) decreases with increasing negative charge density on the QD surface. This conclusion is supported by the data in FIGS. 5A, 5B, which show that exciton decay is accelerated much more dramatically in the QDs with fewer surface charges, despite the fact that more highly charged QDs were mixed with a factor of 20 more AQ than the less-charged QDs. This decrease is not due to a change in the energetics of the charge transfer reaction (changing the density of charges that are more than 1 nm from the QD surface has a negligible effect on the energy of the photoexcited electron), but rather reflects a decrease in the average number of AQ molecules adsorbed to each QD surface, i.e., the number of donor-acceptor complexes formed. The probability of forming a QD-AQ donor-acceptor complex is related to the permeability of the MHA/MHO ligand shell to AQ.

In summary, we fabricated a series of water-soluble PbS QDs capped by mixed monolayers of charged mercaptohexanoate and neutral mercaptohexanol, with a controllable interfacial charge density, and demonstrated the differential permeability of these monolayers to a charged small-molecule, a sulfonate-functionalized anthraquinone, using photoinduced electron transfer between the QD and the anthraquinone as a probe of their interaction. Our results demonstrate the sensitivity of photoinduced charge transfer as a probe of not only the local chemical environment of a colloid, but also the intermolecular structure of its surfactant layer, which is difficult to characterize using traditional analytical tools. By embedding electrostatic interactions within QD-molecule assemblies, we could construct a highly selective recognition/reaction platform for ionic species based on their charges, and the use of water as the medium for this system makes these results an exciting step towards potential applications of water-soluble QDs in biological imaging, environmental sensing and photocatalysis.

Synthetic Procedures for Oleate-capped PbS QDs. We synthesized 1.6 nm oleate-capped PbS QDs using a procedure adapted from that of Hines, M. A.; Scholes, G. D., *Adv. Mater.* 2003, 15, 1844-1849. We mixed 0.36 g PbO and 2.0 mL oleic acid (OA) with 18.0 mL 1-octadecene (ODE) in a 50-mL three-neck round bottom flask at room temperature. Heating the mixture up to 150° C. with constant stirring under $N_2$ flow for an hour produced a clear and colorless solution. We cooled the mixture to 110° C., and injected 0.17 mL of hexamethyldisilathiane dissolved in 8 mL of ODE. The solution turned from orange to brown within 3 seconds. After 10 minutes, we used an ice bath to cool the reaction mixture to room temperature. The product was separated into four 50-mL centrifuge tubes for further purification, as is described in the main text. We purified the QDs by first washing the reaction mixture with acetone (6:1 by volume), and centrifuging it at 3500 rpm for 20 min. We then decanted the supernatant, dried the QD pellet, redispersed the QDs in 5 mL hexanes, and precipitated the QDs two additional times, as described above, using 12.5 mL methanol and acetone, respectively, as the non-solvents. The cleaned PbS QDs were finally dispersed in a minimal amount of hexanes to form the stock solution.

Sizing of PbS QDs via UV-vis Ground State Absorption and Transmission Electron Microscopy. All ground state absorption spectra of solutions of oleate-capped PbS QDs were obtained on a Varian Cary 5000 spectrometer using a 2 mm/10 mm dual pathlength quartz cuvette (in which we excite along the 2 mm axis). We corrected the baselines of all spectra with hexanes prior to measurement, and determined the size of the synthesized PbS QDs (and their respective extinction coefficient) from the position of the first excitonic peak (~985 nm) using the calibration curve published by Moreels, I. et al., ACS Nano 2009, 3, 3023-3030. All concentrations of QDs were calculated from the absorbance of QDs at 400 nm. In order to verify the accuracy of this technique, we performed transmission electron microscopy experiments using a JEOL JEM-2100F FAST TEM. We prepared TEM samples by drop-casting a ~12 μM solution of PbS QDs in hexanes onto a Carbon Type B film (Ted Pella, Inc). We analyzed 101 PbS QDs using the ImageJ[3] software package, and determined that the average diameter of these particles is 3.6±0.4 nm. The 1.6 nm radius for oleate-capped QDs that we predicted from UV-Vis spectroscopy is within the error of our TEM measurement.

Cyclic Voltammetric (CV) and Ground State Absorption Study of 9,10-Anthraquinone-2-Sulfonic Acid Sodium Salt (AQ). In order to determine the redox potential of AQ, we first performed cyclic voltammetry experiments using a three-electrode cell with a 3-mm radius glassy carbon electrode as the working electrode, saturated Ag/AgCl as the reference electrode, and platinum wire as the counter electrode. Measurements were taken with Princeton applied research potentiostats using 0.5 mM deaerated solutions of AQ, with 0.25 M $NaNO_3$ added as the supporting electrolyte. The pH of the solution is adjusted to 10.0 using NaOH to mimic the actual condition for PL quenching experiments (pH=9.6~10.3).

Cyclic voltammogram shows quasi-reversible reduction of AQ under various scanning rates (0.05 V/s, 0.1 V/s, 0.25 V/s and 0.5 V/s). The observed reduction potential is −0.59 V vs. Ag/AgCl reference electrode, which, after correction using eq 6, corresponds to ~−4.1 eV for the LUMO energy of AQ relative to vacuum.

$$E(\text{vs.vacuum}) = -E(\text{vs.}NHE) - 4.43 \text{ eV} = \quad (6)$$
$$-[E(\text{vs.saturated Ag/AgCl}) + 0.199 \text{ eV}] - 4.43 \text{ eV} =$$
$$-[E_{reduction\ peak\ potential} + 0.0285 \text{ eV} + 0.199 \text{ eV}] - 4.43 \text{ eV}$$

UV-Vis ground state absorption spectrum of AQ (collected at a concentration of 260 μM) shows that the optical transition with the minimal energy is centered at ~330 nm, which translates into a 3.8 eV excitation energy between the HOMO and the LUMO. Therefore, we subtract this energy from the LUMO energy that we measured using CV, and determine that the HOMO energy of AQ is ~−7.9 eV.

Ground state absorption spectra show that up to 15% of PbS QDs are lost during the preparation of MHA/MHO-capped PbS QDs. We used UV-Vis spectrophotometer to determine the concentration of PbS QDs by the amplitude of their ground state absorbance at 400 nm. Then we compared the total amount of PbS QDs present in solution before and after ligand exchange, and calculated the percentage of PbS QDs lost to be between 14.4% and 0.0% for samples 1-6.

Figure 6A:
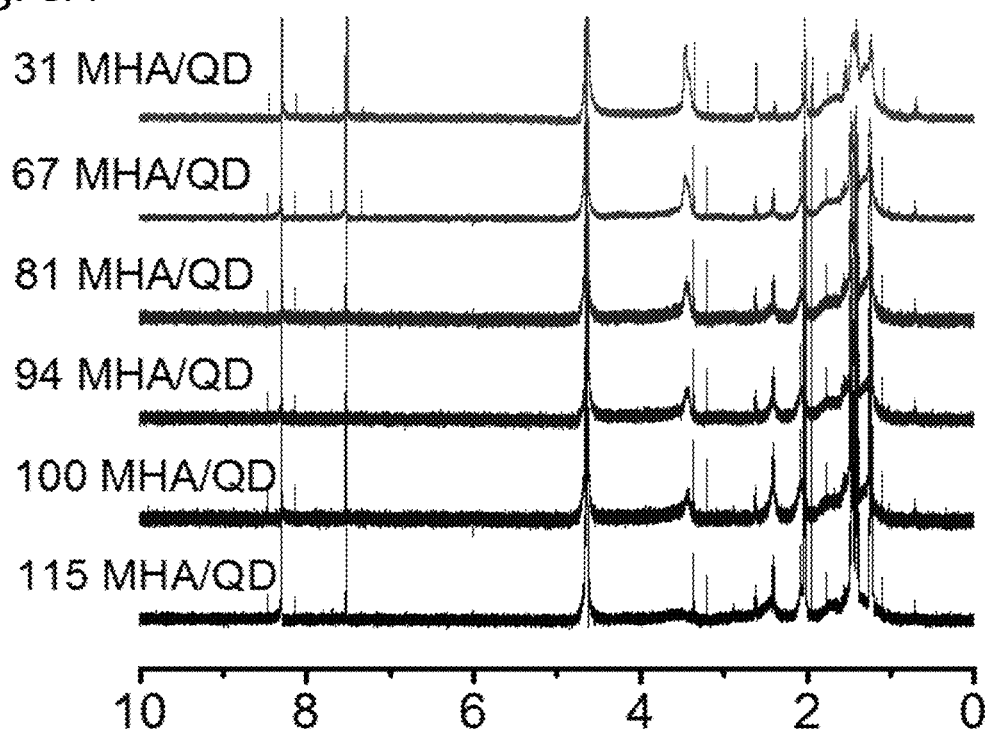
FIG. 6A shows full $^1H$ NMR spectra for Samples 1-6 in $D_2O$. The sharp singlets at 8.33 ppm, 7.53 ppm, and 4.65 ppm correspond to sodium formate (added as an internal standard for integration, see next section), chloroform residue, and $H_2O$ impurity, respectively.
Figure 6B:
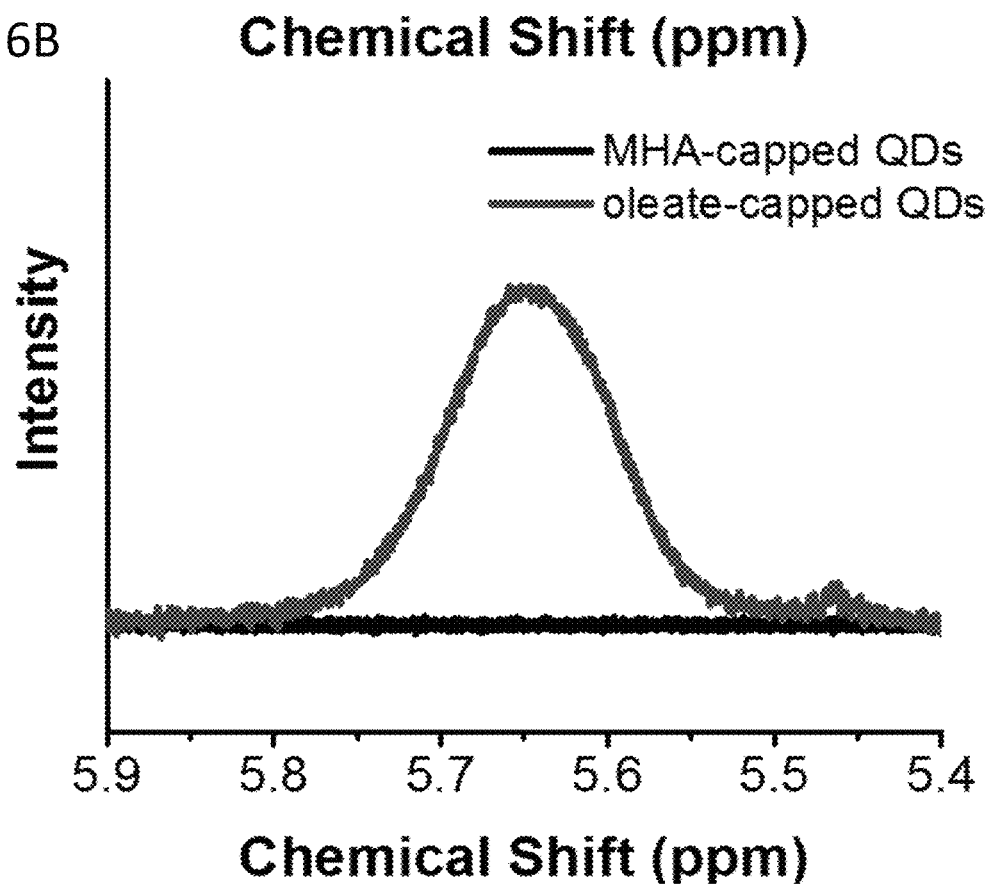
FIG. 6B shows $^1H$ NMR spectra for 13.2 µM MHA- and oleate-capped PbS QDs.

All of the native oleate ligands are displaced upon adding 400 eq. of thiols to PbS QDs during the ligand exchange. FIG. 6A shows the full spectra of MHA/MHO-capped water-soluble PbS QDs (13.2 with six different compositions in their ligand shells. FIG. 6B compares the representative NMR spectrum of water-soluble QDs (after exchange) with oleate-capped QDs (before ligand exchange). For QDs that are dispersed in aqueous solution, the absence of signal from bound oleate (broad feature centered at 5.69 ppm) indicates that all the native oleate ligands are completely displaced upon adding 400 eq. of thiols.

Quantification of MHA and MHO within the Mixed Monolayer Ligand Shell of Water-soluble PbS QDs. The $^1$H NMR spectrum shows the signals from vinyl protons of bound oleate (5.69 ppm, broad) and free oleate species (5.50 ppm, sharp multiplet) of oleate-coated QDs treated with different concentrations of hexanethiol (HT). As the amount of added HT increases, the signal from the vinyl protons of bound oleate decreases, and the signal from the vinyl protons for freely-diffusing oleate species increases. The sum of the integrated signals corresponding to bound and free populations of oleate species (measured relative to an internal biphenyl standard with a signal at 7.45 ppm) is between 200 and 230 ligands per QD at all points in the titration, see Table 9 (the errors arise from the discrepancy between integrating the whole peak vs. 2×integrating half the peak). We therefore estimate the maximum number of bound oleate per PbS QD (which equals the total number of oleate per QD minus the number of free oleate with zero HT added) to be 190-220. This number is used to approximate the number of bound MHO per QD.

TABLE 9

The Number of Bound and Free Oleate (OA) per QD and the Total Number of Binding Sites on the Surface of PbS QDs.

| Eq. of HT added to PbS QDs | No. of Free OA/QD[a] | No. of Bound OA/QD[a] | Total No. of OA/QD[b] | Total No. of binding sites[c] |
|---|---|---|---|---|
| 0 HT | 10 | 200-220 | 210-230 | 200-220 |
| 200 HT | 140 | 80 | 220 | 210 |
| 400 HT | 160 | 40 | 200 | 190 |
| 800 HT | 180-200 | 20 | 200-220 | 190-210 |

[a]Calculated by integrating the signals of OA vinyl protons in $^1$H NMR spectra as described in the text.
[b]Estimated as the sum of the number of free and bound OA per QD.
[c]Calculated by subtracting the number of free OA (with no HT added) from the total number of OA per QD estimated from b.

We acquired $^1$H NMR spectra for all the six water-soluble PbS QD samples (13.2 μM) after ligand exchange and concentration calibration, as we described in the previous section, and used a sum of five Lorentzian functions to fit and quantify the bound (one broad peak centered at ~2.07 ppm) and free (sharp triplet centered at ~2.03 ppm) MHA species as well as the singlet impurity located at ~2.08 ppm. We only observe a broad feature of MHO for all QD samples, with no clear distinction between bound and free populations, which suggests that either all the MHO ligands are bound to the surface of QD, or there's a fast exchange between bound and free populations of MHO. The poor resolution of spectra also made it difficult to integrate these peaks accurately. We therefore chose to approximate the upper limit of the number of bound MHO per QD using the technique described above.

AQ is stable in aqueous solutions with the presence of water-soluble PbS QDs. We prepared four samples of 2.63 μM MHA-capped PbS QDs with 6000 equivalents of AQ/QD added. All the samples were stored under the same protection of $N_2$ with different treatments of light. $^1$H-NMR spectra show that: (i) there's no spontaneous reaction between MHA-capped PbS QDs and AQ in the dark, (ii) when exposed to light, PbS QDs and AQ undergo a photochemical redox reaction and create a long-living paramagnetic AQ radical anion, which could be inferred from the broadened peaks in NMR spectra, (iii) the broad features of AQ radical anion resharpen when the sample we expose to light beforehand is put back in the dark overnight, which may indicate a charge-recombination process between AQ radical anions and oxidized QDs, and (iv) we observed no new peaks in NMR spectra for any of these samples. We conclude that there's no spontaneous reaction between AQ and water-soluble PbS QDs without light, and we therefore chose to store all the samples in the dark for four hours to equilibrate before taking PL measurements in order to eliminate photochemical reactions that can be driven by room light.

PbS QD-AQ complexes could reach equilibrium of adsorption in four hours. We performed a time-dependent PL study on a separately prepared sample, using the same set-up described in last section (2.63 μM MHA-capped PbS QDs with 6000 equivalents of AQ/QD added). We took 17 measurements consecutively with a 30-min interval, and our result shows that the integrated PL intensity saturates in four hours after we add AQ to the QD sample, which indicates that the adsorption of AQ on the surface of QD has reached equilibrium.

Transient Absorption Spectra as A Proof for Electron Transfer and Extraction of Globally-shared Intrinsic eT Rate for Each eT-active PbS QD-AQ Pair. Ultrafast Transient Absorption Spectroscopy. We split the 2.5-mJ output of a commercial amplified Ti-sapphire laser (Solstice, 1 kHz, 100 fs, Spectra Physics), and guided 95% to an optical parametric amplifier (TOPAS-C, Light Conversion) used to produce the pump wavelength (850 nm) for sample excitation, and 5% to a commercial TA spectrometer (HELIOS, Ultrafast Systems) for use as the probe for TA experiments with pump-probe delay times up to 3200 ps. Within the spectrometer, a single filament broadband continuum of probe wavelengths from 900-1400 nm was generated in a 1.2 cm thick sapphire plate and then passed through a long-wave pass filter to isolate near-infrared wavelengths above 850 nm. The probe light was then split into sample and reference beams. We combined the sample beam with the pump light at the sample, which was contained in a 2-mm quartz cuvette. The pump spot size was expanded to at least twice the size of the probe spot to compensate for any imperfections in translation stage alignment. The transmitted probe signal was collected into an optical fiber and dispersed onto an array detector. Dividing the signal from the sample beam by the signal from the reference beam allowed us to divide out any fluctuations in the probe beam intensity during the experiment. The output differential absorption spectrum (□A) was obtained through active background subtraction of the ground state spectrum by chopping the pump at 500 Hz. The pump light was depolarized to prevent unintentional photoselection so that measurements reflect only population dynamics, and we adjusted the power to 100 μW to ensure an expectation value (<N>) of ~0.2 in the first excitonic state of the QDs and avoid any multi-exciton effects. The solution was stirred with a magnetic stir bar to minimize local heating.

Microsecond Transient Absorption Spectroscopy. We used a commercial spectrometer (EOS, Ultrafast Systems) to collect TA spectra for pump-probe delay times from 0.5 ns-25 μs. The excitation beam was generated by the same method and followed the same beam path as the excitation used for the picosecond TA experiment described above. The proprietary EOS light source generates a super-continuum (400-1700 nm) probe pulse by focusing a diode laser into a photonic crystal fiber. The repetition rate of the probe pulse is 2 kHz, which is twice the repetition rate of the pump pulse, and it is triggered in sync with the pump pulse. The pump-probe delay is electronically generated and measured by an electronic timer-counter-analyzer (Pendulum). After the probe pulse passes through an 850-nm long pass filter, it is split by a beam-splitter into sample and reference beams. The sample beam was sent onto the sample, which was contained in a 2-mm quartz cuvette, and focused to a spot size of ~200 μm. The reference and sample beams are then collected in optical fibers and dispersed onto array detectors. In order to achieve reasonable signal to noise, the incident power of pump light was adjusted to be 2 mW. The solution was stirred with a magnetic stir bar to minimize local heating. We performed transient absorption experiments, as described above, on a set of separately prepared 6.58 μM PbS QDs with two different surface charge densities and various amounts of AQ added, which we listed in Tables 10 and 11. The samples were allowed to equilibrate in dark for four hours before we took measurements. We applied a sum of exponentials convoluted with an instrument response function (in this case, a Gaussian pulse) to fit the kinetic trace of the ground state bleach and determine the life time and relaxation dynamics of photo-excited electrons and holes on both the ultrafast and the microsecond timescale, eq 7:

$$y = IRF \otimes \sum_{1}^{n} A_n e^{\frac{-(t-t_0)}{\tau_n}} \quad (7)$$

Figure 7A:
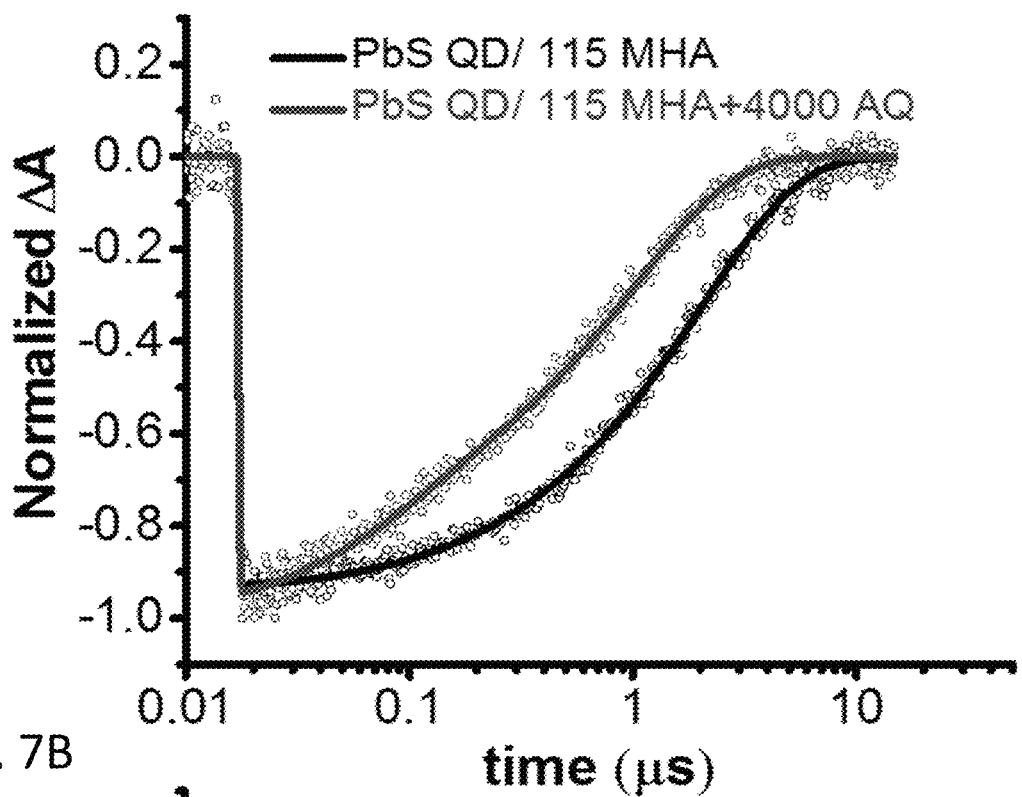
FIG. 7A shows normalized kinetic traces extracted (at 1014 nm) from the TA spectrum of a 6.58 µM sample of 115 MHA-capped PbS QDs mixed with 0 eq. (black; bottom) and 4000 eq. (red; top) of AQ.
Figure 7B:
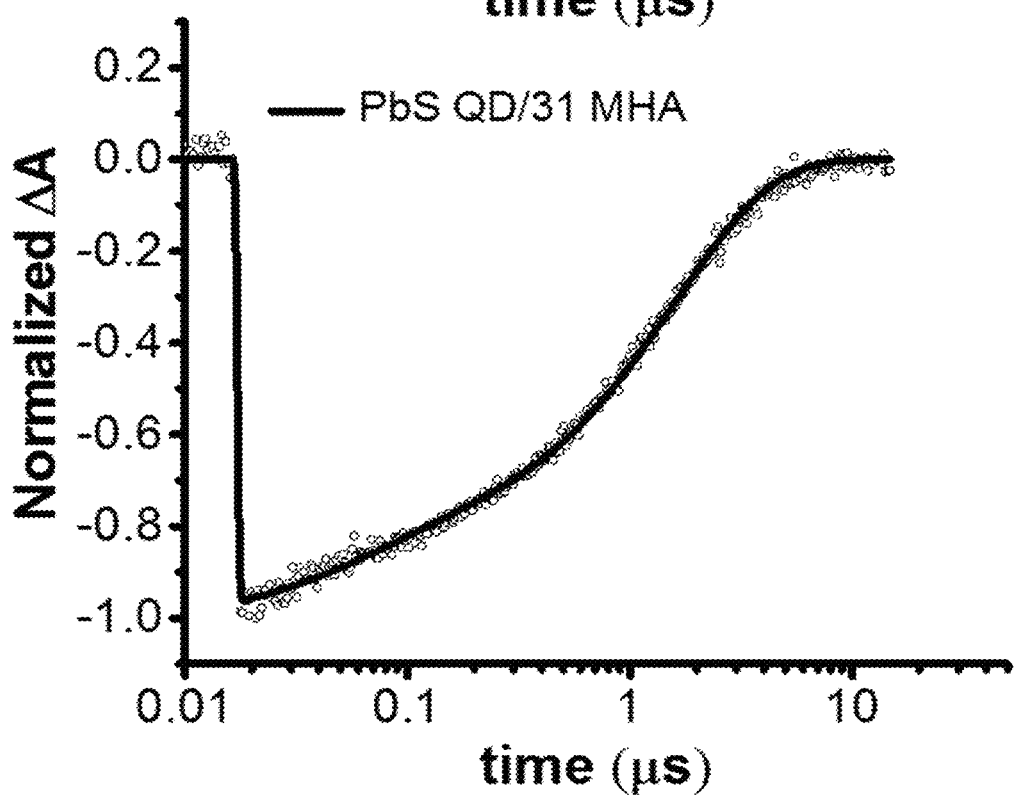
FIG. 7B shows normalized kinetic traces extracted (at 1039 nm) from the TA spectrum of a 6.58 µM sample of 31 MHA-capped PbS QDs.

Here we choose n to be the minimal integer that can make the fitting converge. FIG. 7 shows the microsecond TA kinetic traces of 115 MHA-capped and 31 MHA-capped PbS QDs extracted at 1014 nm and 1039 nm, respectively, while the ultrafast TA kinetics are described in FIG. 5, main text. The fitting parameters of these kinetic traces are listed in Table 10 and 11.

TABLE 10

Time Constants for Decay of the QD Exciton for QD-AQ Complexes on Ultrafast Time Scale.

| No. of Sample | No. of bound MHA ligands per QD | Eq. of AQ bound/QD[a] | PL/PL$_0$ | $\tau_1 = \tau_{eT}$ (ps) (A3)[b,c] | $\tau_2$ (ps) (A2)[b,d] | $\tau_3$ (μs) (A1)[b,e] |
|---|---|---|---|---|---|---|
| 1 | ~115 | 0 | 1 | — | 793 ± 244 (−0.06) | 2.06 ± 0.04 (−0.87) |
|  |  | 0.60 | 0.55 | 576 ± 84 (−0.11) | — | 2.06 ± 0.04 (−0.82) |
|  |  | 0.86 | 0.42 | 574 ± 56 (−0.16) | — | 2.06 ± 0.04 (−0.77) |
| 6 | ~31 | 0 | 1 | — | 590 ± 105 (−0.08) | 1.61 ± 0.02 (−0.88) |
|  |  | 2.68 | 0.07 | 129 ± 4 (−0.70) | 590 ± 105 (−0.18) | 1.61 ± 0.02 (−0.09) |
|  |  | 4.42 | 0.01 | 102 ± 2 (−0.84) | 590 ± 105 (−0.11) | 1.61 ± 0.02 (−0.02) |

[a]Calculated from the normalized PL intensity (PL/PL$_0$) of the same samples.
[b]Error bars are fitting errors.
[c]Corresponds to the charge separation process (electron transfer from QD conduction band to the LUMO of AQ). The rate of charge recombination (recombination of the electron on AQ with the hole in the QD valence band) could not be deconvolved from the component corresponding to the charge trapping process, $\tau_2$.
[d]Corresponds to an electron or hole trapping process. For QD samples with 31 bound MHA ligands, this time constant was fixed to the value extracted from the fit of the QD-only sample. For QD samples with 115 bound MHA per QD, however, $\tau_1$ and $\tau_2$ could not be deconvolved in samples with added AQ.
[e]Obtained from fits of the microsecond-timescale TA kinetic traces, and fixed to these values when we fit the picosecond-timescale TA kinetic traces.

TABLE 11

Time Constants for Decay of the QD Exciton
for QD-AQ Complexes on Microsecond Timescale.

| No. of Sample | Eq. of MHA bound/QD | Eq. of AQ added/QD | $\tau_1$ (μs) $(A_1)^a$ | $\tau_2$ (μs) $(A_2)^b$ |
|---|---|---|---|---|
| 1 | ~115 | 0 | 2.06 ± 0.04 (−0.86) | 0.19 ± 0.07 (−0.07) |
|   |      | 4000 | 1.05 ± 0.03 (−0.73) | 0.08 ± 0.01 (−0.21) |
| 6 | ~31 | 0 | 1.61 ± 0.02 (−0.83) | 0.06 ± 0.01 (−0.13) |

[a]corresponds to the radiative lifetime of PbS QDs
[b]corresponds to the surface-mediated charge trapping processes.

Conversion of No. of bound MHA to Interfacial Charge Density. Assuming that the charged MHA ligands are evenly distributed on the surface of a QD and the ligand shell is, therefore, spherically symmetric, we apply eq 8 to convert the average number of bound MHA to interfacial charge density (charges/nm²):

$$\text{interfacial charge density (charges/nm}^2) = \frac{\text{No. of bound } MHA \text{ per } QD}{\text{total surface area of a charged ligand shell}} \quad (8)$$

The total surface area of a charged QD ligand shell can be calculated using eq 9, where $$\text{total surface area} = 4 \times \pi \times [r(QD) + d(MHA)]^2 \quad (9)$$

r(QD)=1.6 nm is the radius of the inorganic core of a QD, and d(MHA)=1.3 nm[13] is the reported length of the MHA ligand. The calculated interfacial charge densities as well as the representative yields of eT upon mixing a 2.63 μM QD sample with 200 eq. of AQ are listed in Table 12.

TABLE 12

Conversion of No. of bound MHA to Interfacial
Charge Density and the Correponding Yield of eT
upon Adding 200 Eq. of AQ to a 2.63 μM QD sample.

| No. of Sample | No. of bound MHA per QD[a] | Interfacial Charge Density (charges/nm²)[b] | Yield of eT upon Adding 200 Eq. of AQ[c] |
|---|---|---|---|
| 1 | 115 ± 9 | 1.09 | 9.5 |
| 2 | 100 ± 8 | 0.95 | 6.1 |
| 3 | 94 ± 8 | 0.89 | 12.0 |
| 4 | 81 ± 7 | 0.76 | 16.8 |
| 5 | 67 ± 6 | 0.63 | 50.7 |
| 6 | 31 ± 3 | 0.29 | 97.6 |

[a]Equal to the average number of bound MHA ligands per QD listed in Table 1.
[b]Calculated using eqs S12 and S13.
[c]Extracted from FIG. 5B. The lower yield of eT for sample 2 compared to sample 1 (presumably caused by experimental error) is against the general trend of our data, but this discrepancy between sample 1 and 2 no longer shows up as we increase the concentration of AQ.

Reversible Modulation of the Electrostatic Potential of a Colloidal Quantum Dot Through the Protonation Equilibrium of its Ligands We demonstrate a precise method to control the photoluminescence (PL) intensity of a colloidal quantum dot (QD) through the acidity/basicity of its environment, using protons to regulate the permeability of the QD's ligand shell to a charged molecular quencher. The near-IR light-emitting PbS QDs are passivated by an adlayer of histamine-derivatized dihydrolipoic acid (DHLA-His, FIG. 8). The imidazole moieties at the outer boundary of this ligand shell capture freely diffusing protons and switch from a neutral to positively charged state, such that the electrostatic field at the QD/solvent interface is controllable through the acidity of the solution. 1H NMR spectroscopy yields the average degree of protonation of the QDs' ligand shells, and steady-state and time-resolved optical spectroscopies allow us to relate this degree of protonation to the permeability of the ligand shell to a charged small-molecule electron acceptor, 9,10-anthraquinone-2-sulfonate (AQ), through the yield and rate of photoinduced electron transfer (eT) from the QD to AQ.

We previously described control over the electrostatic potential of a colloidal QD and its PL in the presence of a charged quencher with charged, covalently bound ligands, and then more precisely with these ligands plus noncovalently bound counterions. Our introduction here of a mechanism to reversibly tune the PL intensity of a QD via the protonation equilibrium of its ligands suggests additional functionality, specifically sensing of dynamic properties of a chemical environment with a changing proton concentration, which could involve local proton fluxes or vesicle formation and expulsion. The DHLA-functionalized PbS QD system is especially translatable to in vitro biological applications because the emission of PbS QDs is tunable throughout biological windows I and II (650-1350 nm; the QDs used here emit at ~1050 nm), and because the imidazolium group on DHLA has a physiologically relevant p$K_a$ (~7.0) in water.

DHLA has a larger binding affinity for divalent metal cations and better stability under acidic conditions (down to pH 3) than its monothiolate analogues. We synthesized DHLA-His molecules via a published peptide coupling reaction. We synthesized oleate-capped PbS QDs using an adapted literature procedure and prepared PbS QDs capped by a monolayer of DHLA-His by adding ~400 equiv of DHLA-His ligands per QD to a 2-mL sample of 400 μM oleatecapped PbS QDs dispersed in degassed hexanes and shaking the mixture gently until the QDs flocculated. We diluted the reaction mixture with 4 mL of degassed methanol and then centrifuged it at 7000 rpm for 5 min to precipitate the QDs. We washed the pellet with 6 mL of ethyl acetate twice by centrifuging the suspension at 7000 rpm for 5 min and decanting the clear supernatant. The cleaned QDs were redispersed in 4 mL of degassed ethylene glycol (for optical characterization) or methanol-d4 (for NMR measurements), and any insoluble QD aggregates were separated by centrifuging this solution at 7000 rpm for 10 min. We collected the optically clear supernatant and used it as the stock solution for subsequent experiments. No bound oleate was detected on the surfaces of these QDs.

FIG. 9A shows the aromatic regions of ¹H NMR spectra of a series of 0.132 mM solutions (in methanol-d4) of DHLA-His-capped PbS QDs mixed with increasing molar equivalents (0-200 per QD) of p-toluenesulfonic acid (Tol-SO3H, p$K_a$≈−3 in water21). With no acid added (black trace at the bottom), we observe (i) two sharp singlets located at ~7.7 ppm (for Ha) and ~6.9 ppm (for Hb), which correspond to the aromatic protons on freely diffusing DHLA-His molecules in solution, and (ii) two broad features located at ~7.6 ppm (Ha) and ~6.8 ppm (Hb), which correspond to the same protons on DHLA-His molecules that are bound to the surface of QDs. Assignment of these two (bound and free) populations of DHLA-His molecules has been confirmed by NMR spin—spinmediated relaxation (T2) measurements. Each QD has an average of 76±8 DHLA-His ligands bound to its surface, and the ratio between freely diffusing and surface bound DHLA-His species is consistently 0.15±0.02.

As we add increasing amounts of Tol-SO$_3$H to the QD dispersion, the protonation of the imidazole leads to a more pronounced electron-withdrawing effect on the aromatic ring and results in a progressively downfield shift in the signals of these two aromatic protons in both surface-bound and freely diffusing DHLA-His species FIG. 9A.

FIG. 9B is a plot of the peak position of H$_a$ (in ppm), as a function of Tol-SO$_3$H added, for both the bound (black; lower trace) and free (red; upper trace) populations of DHLA-His. The chemical shift of these peaks is a weighted average of the chemical shifts of the fully protonated ($\delta_p$) and fully deprotonated ($\delta_{dp}$) DHLA-His species. Assuming that (i) DHLA-His is 100% deprotonated before we introduce any Tol-SO$_3$H to the system, such that $\delta_{dp}$=7.63 ppm, and (ii) DHLA-His is 100% protonated as the chemical shift saturates (the equilibrium constant for protonation of imidazole groups by Tol-SO$_3$H is ~10$^{10}$), such that $\delta_p$=8.71 ppm (marked by the black dashed line in FIG. 9B), the degree of protonation, p (0≤p≤1), for the imidazole moieties within the QD ligand shell is given by eq 10. We use eq 10 to translate the chemical shift of the aromatic proton signal to the percentage of protonated imidazolium groups at the QD surface, FIG. 9B (inset).

$$p = \frac{\delta_{obs} - \delta_{dp}}{\delta_p - \delta_{dp}} \times 100\% = (0.926 \times \delta_{obs} - 7.06) \times 100\% \quad (10)$$

In all experiments that follow, we limit the amount of Tol-SO$_3$H to 75 equiv per QD because when we add more than 75 equiv DHLA-His ligands begin to desorb from the surface of the QD (presumably due to the protonation of dithiolate anchoring groups).

We then split a batch of 6.58 μM QDs into four samples in ethylene glycol and added either 0, 25, 50, or 75 mol equiv of Tol-SO$_3$H to each sample to achieve a different concentration of protons at the ligand/solvent interface (p=0, 31, 64, or 92%, respectively; see FIG. 9B). We split each of these four samples into seven samples, to which we added increasing molar equivalents (0-50 per QD) of AQ, a negatively charged electron acceptor with respect to photoexcited PbS QDs.1,2 As we have shown previously,28-32 the probability of eT from the photoexcited QD to a negatively charged AQ reflects the number of AQs within a few Ångstroms of the QD surface, in the form of either statically bound or transiently associated adsorbates. The photoinduced eT process results in a charge separated state that undergoes nonradiative recombination; therefore, the degree to which the PL of QDs is quenched in the presence of AQ is a sensitive measure of the permeability of the QD ligand shell to the molecular probe, here, negatively charged AQ. We allowed all 28 samples to equilibrate in the dark (to avoid any potential photochemistry1,33,34) under N2 overnight before performing any optical measurements. We then collected the PL spectra (850-1350 nm) of the samples in a 2 mm/10 mm dual path length quartz cuvette, photoexcited along the 10 mm axis at 800 nm.

FIG. 10A is a plot of "PL/PL0", the integrated PL intensity for each QD-AQ mixture ("PL") divided by the integrated PL intensity of the same sample with no added AQ ("PL0") vs the equiv of AQ added to the QDs for four series of QDs with different degrees of protonation (p). For each series of QDs, the yield of PL quenching□ that is, the yield of eT□increases as we increase the molar equivalents of AQ added, as expected (FIG. 10A, inset). The key result is that as p increases from 0 to 92% the yield of eT is progressively enhanced for a given amount of AQ added. This change is not due to the shift in the reduction potential of AQ as a function of proton concentration in the solution (the driving force for eT from the QD to AQ changes negligibly) or to irreversible photooxidation of QDs, as evidenced by cyclic voltammetry and continuous illumination experiments. This enhancement is therefore caused exclusively by an increase in the average number of AQs adsorbed, statically or transiently, to each QD, due to enhanced permeability of the increasingly positively charged ligand shell to negatively charged AQ.

To support this conclusion, we performed a series of transient absorption (TA) measurements on QD solutions and QD-AQ mixtures ([AQ]/[QD]=10:1) titrated with 0 (p=0), 25 (p=31%), or 75 (p=92%) molar equiv of Tol-SO$_3$H. The eT and subsequent charge recombination (CR), evidenced by an acceleration of the recovery of the ground-state bleach of the QDs upon addition of AQ, occur on both picosecond-to-single nanosecond (FIG. 10B) and nanosecond-to-microsecond (FIG. 10C) time scales. We assign the dynamics on the faster time scale to eT and CR within statically bound QD-AQ complexes and the dynamics on the slower time scale to the diffusion-controlled, collision-gated eT process within transiently associated QD and AQ species. The kinetic traces in FIGS. 10B and 10C show that addition of increasing amounts of Tol-SO$_3$H in the presence of a fixed amount of AQ progressively increases the rate of eT on both time scales that we monitor, while addition of Tol-SO$_3$H alone (no AQ) has negligible impact on the exciton dynamics of the QD. These results are consistent with the trend of increasing PL quenching upon progressive protonation of the QD ligand shell.

We determined the time constants for eT within static QD-AQ complexes by globally fitting the picosecond-to-nanosecond kinetic traces in FIG. 10B with eq 11

$$\Delta A(t) = IRF \otimes [-A_{CS} e^{-\lambda}(\exp(\lambda e^{-t/\tau_{CS,static}})-1) - A_{CR}(1-e^{-\lambda})e^{-t/\tau_{CR,static}} - e^{-\lambda}e^{-t/\tau_1}]$$

where IRF is the instrument response function of the laser, τCS,static is the time constant for charge separation between a photoexcited QD and a single absorbed AQ, τCR,static is the time constant for CR of the ion pair resulting from that charge separation, ACS and ACR account for the relative contributions of electrons and holes, respectively, to the total amplitude of the bleach signal, λ, is the Poisson-averaged number of statically adsorbed AQs per QD, and τ1 is the lifetime of excitons within QDs that have no statically adsorbed AQs. In fitting the kinetic traces in FIG. 10B, we fixed the values of τ1 to those measured by the longer time scale TA experiment (see FIG. 10C and Table 13) because they cannot be measured accurately within the time window of ~3 ns. We also fixed the value of λ for each trace to λ=−ln(B/B0), where B/B0 is the fraction of QDs with zero adsorbed AQ molecules, measured from the amplitude of the ground-state bleach at delay times of 1800-3200 ps (well after the CR process within static QD-AQ complexes).

TABLE 13

Charge Separation and Recombination Dynamics for PbS QD-AQ Complexes with Different Degrees of Protonation in Their Ligand Shells

| Sample | τCS, static (ps) (ACS) | τCR, static (ps) (ACR)[a] | avg. no. of AQ/QD, λ[b] | τ1 (ns) (A1) | τ2 (ns) (A2) | τ3 (μs) (A3) | avg. (μs)[d] |
|---|---|---|---|---|---|---|---|
| PbS QDs (p = 0) + 10 equiv AQ | | | 0.44 | 12 ± 0.6 (−0.09 ± 0.02) | 240 ± 88 (−0.15 ± 0.05) | 1.1 ± 0.07 (−0.76 ± 0.05) | 0.87 |
| PbS QDs (p = 31%) + 10 equiv AQ | 9 ± 1 (0.11 ± 0.01) | 240 ± 12 (0.29 ± 0.01) | 0.93 | 5.4 ± 0.2 (−0.44 ± 0.03) | 110 ± 29 (−0.22 ± 0.03) | 0.79 ± 0.09 (−0.34 ± 0.04) | 0.30 |
| PbS QDs (p = 92%) + 10 equiv AQ | | | 1.4 | 4.2 ± 0.2 (−0.65 ± 0.05) | 100 ± 42 (−0.22 ± 0.06) | 0.70 ± 0.34 (−0.13 ± 0.06) | 0.12 |

[a]These fitting parameters are shared among all three kinetic traces. Error bars are fitting errors from the kinetic traces extracted (at the ground-state bleach) from the picosecond-to-nanosecond TA spectrum of each sample, FIG. 10B.
[b]The value of λ is fixed for each kinetic trace to the value of −ln(B/B0) for that trace, as explained in the text.
[c]Error bars are fitting errors from the kinetic traces extracted (at the ground-state bleach) from the nanosecond-to-microsecond TA spectrum of each sample, FIG. 10C.
[d]Amplitude-weighted averages of τ1, τ2, and τ3.

To first approximation, that is, if we assume that the protonation state of the ligand shell only influences the number of AQ molecules that adsorb to each QD surface and not the electronic coupling or driving force for eT between the QDs and these adsorbed acceptors—the value of p influences λ but not the intrinsic, single-donor, single-acceptor rate constants τCS,static and τCR,static. We indeed find that λ, calculated as described above, increases from 0.44 to 1.4 AQs adsorbed per QD as p increases from 0 to 92%, Table 13. Fixing these values of λ and sharing the values of τCS,static and τCR,static in fits of all three traces in FIG. 10B with eq 11, we find τCS,static=9 ps and τCR,static=240 ps. These rates are faster, by up to a factor of 5, than those we measured for the same acceptor but larger QDs as donors (radius of 1.6 nm instead of 1.3 nm). The difference is reasonable since the driving force for eT in our current system is ~0.3 eV larger than that for the previous system. The protonation state of the ligand shell should also increase the average rate of diffusion-controlled eT from the QD to AQ by increasing the diffusion constant of AQ within the ligand shell. We observe this increase by fitting the nanosecond-to-microsecond kinetic traces that describe diffusion-controlled eT dynamics (FIG. 10C) with a sum of three exponential functions convoluted with the IRF to obtain the time constants listed in Table 13. The increasing rates of exciton decay on single-to-tens-of-ns (τ1), hundreds-of-ns (τ2), and single-ps (τ3) time scales upon progressive protonation of the QD ligand shell suggest that attractive forces between the ligand shell and AQ enhance the rate of eT through a continuum of diffusion-controlled pathways.

Finally, we demonstrate acidity/basicity-controlled reversible cycling of the permeability of the QD's ligand shell. We prepared two 3 mL, 10.0 μM samples of DHLA-His-capped PbS QDs and pretreated one of the samples with 10 equiv of AQ, while the other sample served as the "blank" control. We then alternately mixed 75 equiv of Tol-SO₃H and 75 equiv of tetramethylammonium hydroxide (NMe₄OH) into each sample to cycle the ligand shell between protonated and deprotonated states and collected the steady-state PL spectra immediately after each addition, FIG. 11. The protonation/deprotonation process takes place instantaneously. When no AQ is added, the PL intensity of the QD ensemble remains stable upon sequential additions of acid/base (FIG. 11, red trace), which suggests that 75 equiv of acid/base alone does not impact the surface passivation of these QDs, consistent with the results from NMR. The PL intensity of the QDs however shows dramatic, reversible oscillation, with an average ratio of PL (p=0)/PL (p=92%) of 6.7 (a maximum observed ratio of 28), which confirms that both AQ and surface-bound DHLA-His ligands do not degrade during the cycling of acid-base titrations, and demonstrates that the QD-AQ system is a sensitive, robust optical probe of the proton concentration in solution. We suspect that the slight enhancement in the PL intensity of these QDs, in both acidic and basic conditions, over the course of the cycling is due to the increasing ionic strength of the solution, which lowers the probability that AQ will diffuse to the QD surface by stabilizing it in bulk solution.

In summary, we have utilized the protonation equilibrium of the ligands on a PbS QD to reversibly modulate its PL and exciton lifetime. By increasing the positive charge density at the outer boundary of a PbS QD from 0 to 70 charges per QD, we decreased the PL of the QD sample by a factor of 6.7 and decreased the average exciton lifetime of the QDs by a factor of 7 by increasing the permeability of the QD's ligand shell to a charged molecular electron acceptor, AQ. These changes in electrostatic potential are reversible through sequential additions of acid and base to the QD dispersion. Our analysis treats the enhanced permeability of the QD ligand shell upon protonation exclusively as an electrostatic effect and neglects possible contributions from changes in the morphology of the ligands upon their protonation. We believe that our focus on electrostatics is justified, however, because most analyses of these morphological changes predict that the permeability of the monolayer should increase (due to formation of patches, ridges, or thin regions) as the degree of protonation decreases due to competing electrostatic and van der Waals interactions. This trend is the opposite of what we see.

This work also demonstrates the use of an interfacial redox process as a highly sensitive probe for the local chemical and electrostatic environment of an emissive nanoparticle. Our results suggest applications in not only steady state but also dynamic proton sensing, with a response time limited by diffusion of the quencher to the surface of the QD, a process that could be sped up by tethering it to the QD surface with a flexible linker. We could also measure the pH of an aqueous system by first experimentally determining the $pK_a$ of the imidazolium group in the bound DHLA-His molecules (via NMR, potentiometric, or spectrophotometric titration of the sample with an acid or base of known p$K_a$) and then translating the degree of protonation within the ligand shell, p, into the concentration of freely diffusing protons in solution. Furthermore, we could accomplish sensing of other ions by incorporating specific binding sites into the QD's ligands.

Synthesis of Histamine-Derivatized Lipoic Acid (LA-His) and Histamine-Derivatized Dihydrolipoic Acid (DHLA-His). We synthesized histamine-derivatized lipoic acid (LA-His) using a well-established peptide coupling reaction, see Scheme 1. We dissolved 4.5 g (21.8 mmol, 1 equiv.) of lipoic acid, 4.0 g (21.8 mmol, 1 equiv.) of histamine dihydrochloride, and 15 mL (87.0 mmol, 4 equiv.) of N,N-diisopropylethylamine (DIPEA) in 75 mL N,N-dimethylacetamide. We then initiated the coupling reaction by adding 11.5 g (26.1 mmol, 1.2 equiv.) of benzotriazole-1-yl-oxy-tris-(dimethylamino)-phosphonium hexafluorophosphate ("BOP reagent") to the solution, and allowed the reaction to proceed under room temperature for at least 60 hours. The reaction mixture was then diluted with 200 mL deionized water and the product was extracted six times with ethyl acetate (100 mL per extraction). The organic layer was dried over anhydrous sodium sulfate, and the filtrate was concentrated under reduced pressure and chromatographed on a silica gel column using $CH_2Cl_2/CH_3OH$ (9:1) as eluent. Yield: 2.2 g (34%); $R_f$=0.5 ($CH_2Cl_2/CH_3OH$ (9:1)). $^1$H NMR (Methanol-$d_4$, 600 MHz): δ 7.80 (s, 1H), 6.93 (s, 1H), 3.55 (dq, J=9.0 Hz, 6.3 Hz, 1H), 3.43 (t, J=7.1 Hz, 2H), 3.19-3.06 (m, 2H), 2.79 (t, J=7.1 Hz, 2H), 2.45 (dq, J=12.5 Hz, 6.4 Hz, 1H), 2.17 (t, J=7.4 Hz, 2H), 1.87 (dq, J=13.5 Hz, 6.8 Hz, 1H), 1.74-1.43 (m, 4H), 1.49-1.33 (m, 2H); MS-ESI: m/z=300.16 ([M+H]$^+$, predicted: 300.46), 322.15 ([M+Na]$^+$, predicted: 322.45).

We prepared DHLA-His by reducing LA-His with $NaBH_4$, a procedure well-described in the literature [Uyeda et al., Synthesis of Compact Multidentate Ligands to Prepare Stable Hydrophilic Quantum Dot Fluorophores. J. Am. Chem. Soc. 2005, 127, 3870-3878; Liu et al., Compact Biocompatible Quantum Dots Functionalized for Cellular Imaging. J. Am. Chem. Soc. 2008, 130, 1274-1284; Muro et al., Small and Stable Sulfobetaine Zwitterionic Quantum Dots for Functional Live-Cell Imaging. J. Am. Chem. Soc. 2010, 132, 4556-7]. In a typical synthesis, we first dissolved 2.2 g (7.5 mmol, 1 equiv.) LA-His with 40 mL methanol in a 500-mL round-bottom flask, and cooled down the solution with an ice bath. We added 1.13 g $NaBH_4$ (30.0 mmol, 4 equiv.) slowly to this solution under constant stirring. After 30 min, we diluted the colorless reaction mixture with 200 mL deionized water, and extracted the product six times with ethyl acetate (100 mL per extraction). The organic layer was dried over anhydrous sodium sulfate, and the solvent was evaporated under reduced pressure to yield the product as a clear, colorless oil. Yield: 2.0 g (90%). $^1$H NMR (Methanol-$d_4$, 600 MHz): δ 7.58 (s, 1H), 6.84 (s, 1H), 3.41 (t, J=7.2 Hz, 2H), 2.91-2.84 (m, 1H), 2.77 (t, J=7.2 Hz, 2H), 2.72-2.60 (m, 2H), 2.17 (t, J=7.4 Hz, 2H), 1.92-1.84 (m, 1H), 1.75-1.35 (m, 7H); MS-ESI: m/z=302.06 ([M+H]$^+$, predicted: 302.47).

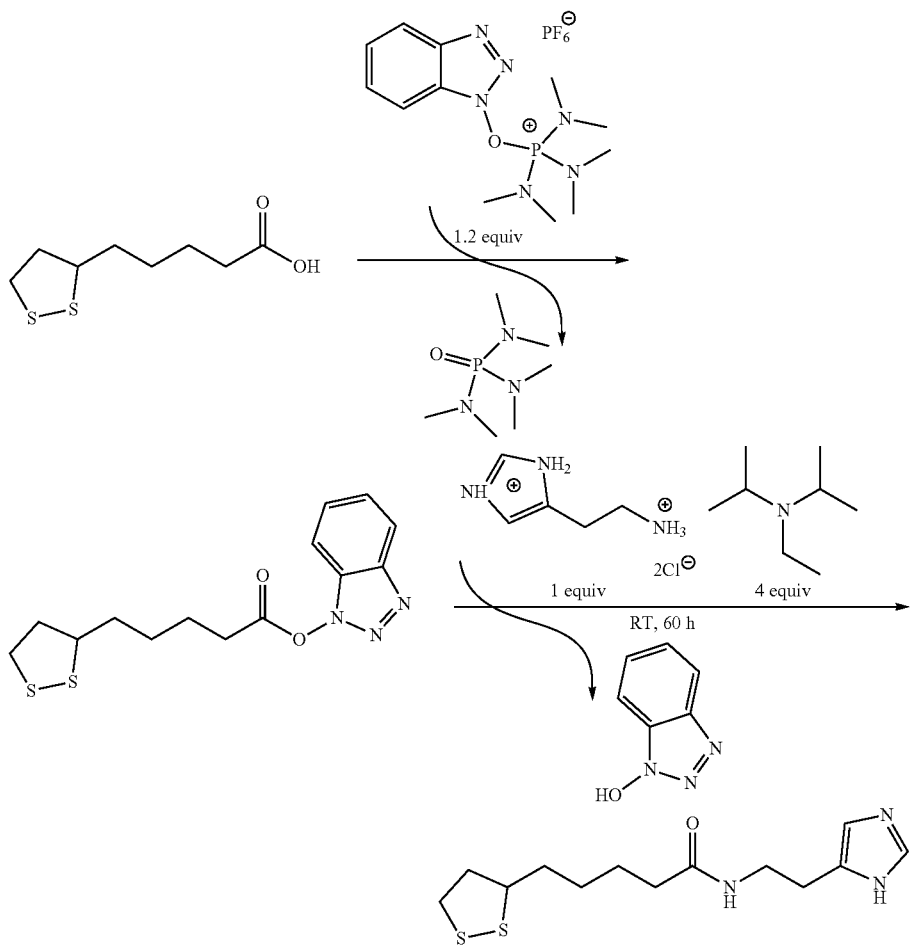

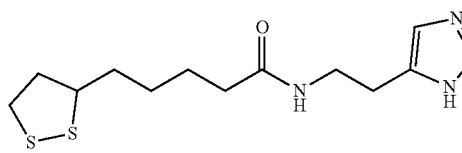 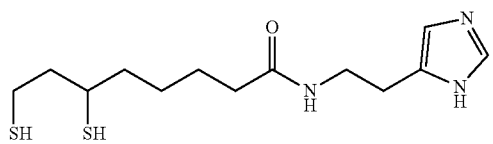

Synthesis and Purification of Oleate-capped PbS QDs. We synthesized oleate-capped PbS QDs with a radius of ~1.3 nm and a first excitonic peak at 800-860 nm using an adapted literature procedure [Hines and Scholes, Colloidal PbS Nanocrystals with Size-Tunable near-Infrared Emission: Observation of Post-Synthesis Self-Narrowing of the Particle Size Distribution. Adv. Mater. 2003, 15, 1844-1849]. Briefly, we mixed 0.36 g PbO and 1.0 mL oleic acid with 19.0 mL 1-octadecene (ODE) in a 50-mL three-neck round bottom flask at room temperature. Heating the mixture up to 150° C. with constant stirring under $N_2$ flow for an hour produced a clear and colorless solution. We cooled the mixture to 110° C., and injected 0.17 mL of hexamethyldisilathiane dissolved in 8 mL of degassed ODE. The solution turned from orange to brown within 3 seconds. After 4 minutes, we remove the heating mantle and allow the reaction mixture to cool down naturally to room temperature. The product was separated into four 50-mL centrifuge tubes for further purification. We purified the QDs by first washing the reaction mixture with acetone (6:1 by volume), and centrifuging it at 3500 rpm for 5 min. We then decanted the supernatant, dried the QD pellet, redispersed the QDs in 5 mL hexanes, and precipitated the QDs two additional times, as described above, using 12.5 mL methanol and acetone, respectively, as the non-solvents. The purified PbS QDs were finally dispersed in 20 mL of hexanes to form the stock solution.

Assignment of Surface-bound and Freely Diffusing DHLA-His Species via Spin-spin-mediated Relaxation (T2) Measurements. We recorded $^1H$ NMR spectra of a 0.132 mM sample of DHLA-His-capped PbS QDs, pretreated with 75 equiv. of p-toluenesulfonic acid (Tol-$SO_3H$), on an Agilent DD2 600-MHz NMR spectrometer. We chose a spin-echo pulse sequence for $T_2$ relaxation measurement, set the relaxation delay between scans to be 10 s, and arrayed the dephasing time, t, between 0.01 and 6.4 s. Figure S2 shows two kinetic traces of $T_2$ decay of the $H_a$ proton signal (see FIG. 9A). Each kinetic trace fits to a single-exponential function, eq 12.

$$I=I_0 \times e^{-t/T_2} \tag{12}$$

The $T_2$ lifetime of the broad feature (black trace) is shorter than the sharp feature (red trace) by a factor of 7 (1.2 s vs. 0.18 s). This more efficient transversal relaxation for the broad $H_a$ signal is predominantly caused by the restricted rotational mobility of DHLA-His ligands that are bound to the surface of QDs, and has been observed by both our group[8] and others[9]. We therefore assign the sharp and broad features in FIG. 9A to freely diffusing and surface-bound ligands, respectively.

Quantification of DHLA-His Ligands within the Ligand Shell of PbS QDs. We prepared DHLA-His-capped PbS QDs using the procedures described in the main text, and applied $^1H$ NMR to quantify the number of bound DHLA-His ligands per QD. The NMR samples were 0.132 mM solutions of QDs in methanol-$d_4$, with 100 equiv. of sodium formate as an internal integration standard (singlet at 8.56 ppm, 1H). Experiments were performed on an Agilent DD2 600-MHz NMR spectrometer. We set the acquisition time to 27 s and the relaxation time to 90 s, respectively, to allow for complete collection of the free induction decay signal and sufficient relaxation of proton nuclei between measurements, and performed 8 scans to get a spectrum with satisfactory signal-to-noise ratio. The 6.5-7.1 ppm region of the resulting spectra, which contains the aromatic proton signal ($H_b$, see FIG. 9A) of DHLA-His, is fit with a sum of two Lorentzian functions, and the broad feature centered at ~6.8 ppm, which corresponds to those protons of surface-bound DHLA-His ligands, is integrated against the sodium formate internal standard. The fitting results of $^1H$ NMR spectra were acquired from three separately prepared samples. There are, on average, 76±8 DHLA-His ligands bound to the surface of each QD.

Full NMR Spectrum of DHLA-His-capped PbS QDs. The full NMR spectrum collected from a methanol-$d_4$ solution of 0.132 mM DHLA-His-capped PbS QDs (data not shown). Sharp peaks and broad features were buried underneath correspond to DHLA-His ligands that are freely diffusing or bound to the surface of QDs, respectively. The absence of features at ~5.5 ppm indicates that all the native oleate ligands are displaced during the ligand exchange.

DHLA-His ligands begin to desorb from the surface of QD upon mixing with ≥100 equiv. of Tol-$SO_3H$. We calculate the ratio between freely diffusing and surface-bound DHLA-His ligands through dividing the area of the sharp singlet ($H_a$, see FIG. 9A) by the area of the corresponding broad feature. FIG. 13 contains a plot of this ratio as a function of the equiv. of acid we mix into the QDs. When 0-75 equiv. acid was added, this ratio remains relatively constant (0.16±0.04); when more than 100 equiv. of acid was added instead, however, this ratio starts to increase dramatically, as we described in the main text, presumably due to the protonation and desorption of the surface-bound DHLA-His molecules. We therefore limited the equiv. of acid up to 75 equiv. for all our photophysical characterizations to make sure that QDs with different degrees of protonation at their ligand shells have a comparable coverage of ligands on their surface.

The PL intensity of the QDs saturates within 2 h upon mixing with AQ. We prepared a 3-mL, 10 μM ethylene glycol solution of DHLA-His-capped PbS QDs, contained in a 1 cm×1 cm air-tight quartz cuvette and pretreated with 10 equiv. of AQ, and performed a time-dependent PL study using the same set-up described in the main text. We took 10 measurements consecutively, and our result (see FIG. 14) shows that the integrated PL intensity saturates within two hours of adding AQ to the QD sample, which indicates that the adsorption of AQ on the surface of QD has reached equilibrium.

Ground-state Absorption Spectra of DHLA-His-capped PbS QDs with Increasing Degree of Protonation in Their Ligand Shells. We superimposed ground-state absorption spectra of 13.2 μM ethylene glycol solutions of DHLA-His-capped PbS QDs, pretreated with 0, 25, 50 or 75 equiv. Tol-$SO_3H$ (FIG. 15). The peak position of these spectra stay constant, which suggests that these QDs do not degrade upon addition of up to 75 equiv. acid, in line with our observation from NMR, see FIG. 13. The slight decrease (<10%) in the absorbance, however, is likely caused by the surface reconstruction upon addition of acid into the solution.

Continuous Illumination Experiments of DHLA-His-capped QDs. In order to prove that the enhanced PL quenching in FIG. 10A upon addition of acid is not a result of irreversible photooxidation of QDs by AQ in the presence of protons, we prepared a 3-mL, 10.0 µM sample of DHLA-His-capped PbS QDs, pretreated with 75 equiv. Tol-SO$_3$H and 5 equiv. AQ, in a 1 cm×1 cm air-tight quartz cuvette, and illuminated this sample with a 5-mW, 532-nm laser pointer under constant stirring overnight. FIGS. 16A and 16B contains the ground-state absorption and PL spectra of this sample before and after the illumination. The negligible change in both spectra over time suggests that QDs remain stable throughout the illumination experiment, and irreversible photooxidation is, therefore, not the cause of increased PL quenching.

Cyclic Voltammetry (CV). In order to determine whether, in our case, the reduction potential of AQ changes as the acidity of the solution increases, we performed cyclic voltammetry experiments using a three-electrode cell with a 3-mm radius glassy carbon electrode as the working electrode, silver wire as the pseudo reference electrode, and platinum wire as the counter electrode. Measurements were taken with Princeton applied research potentiostats using 1 mM degassed ethylene glycol solutions of AQ, with 0.25 M NH$_4$PF$_6$ added as the supporting electrolyte and 2 mM ferrocene added as the internal standard.

The cyclic voltammogram in FIG. 17 shows the reduction of AQ under a scanning rate of 0.1 V/s. The observed reduction potential of AQ is consistently ~−0.8 V vs. Fc/Fc$^+$ redox couple, as the concentration of Tol-SO$_3$H increases from 0 to 0.49 mM (the maximum concentration of acid we used in our PL studies). We suspect that Tol-SO$_3$H cannot fully dissociate into freely diffusing protons and Tol-SO$_3^-$ anions in ethylene glycol, so its impact on the acidity of the solution may not be as dramatic as the case in water, which explains the insensitivity of the reduction potential of AQ to the concentration of acid added. Furthermore, we have approximately 70 imidazole groups per QD, and we add a maximum of 75 equivalents of acid per QD, so in the presence of QDs, protons are mostly adsorbed at the outermost boundary of the QD ligand shell, in the form of imidazolium, instead of freely diffusing in solution as they would be in water, and the actual activity of protons is, therefore, much smaller than in water.

We therefore conclude that the increasing yield of PL quenching that we observe in FIG. 10A is not a result of the change in driving force for eT due to the presence of protons in solution, and can be treated as an electrostatic effect.

Transient Absorption Measurements. Picosecond-to-nanosecond Transient Absorption Spectroscopy. We split the 2.5-mJ output of a commercial amplified Ti-sapphire laser (Solstice, 1 kHz, 100 fs, Spectra Physics), and guided 95% to an optical parametric amplifier (TOPAS-C, Light Conversion) used to produce the pump wavelength (810 nm) for sample excitation, and 5% to a commercial TA spectrometer (HELIOS, Ultrafast Systems) for use as the probe for TA experiments with pump-probe delay times up to 3200 ps. Within the spectrometer, a single filament broadband continuum of probe wavelengths from 900 to 1400 nm was generated in a 1.2-cm thick sapphire plate and then passed through a long-wave pass filter to isolate near-infrared wavelengths above 850 nm. The probe light was then split into sample and reference beams. We combined the sample beam with the pump light at the sample, which was contained in a 2-mm quartz cuvette. The transmitted probe signal was collected into an optical fiber and dispersed onto an array detector. Dividing the signal from the sample beam by the signal from the reference beam allowed us to divide out any fluctuations in the probe beam intensity during the experiment. The output differential absorption spectrum (☐A) was obtained through active background subtraction of the ground state spectrum by chopping the pump at 500 Hz. The pump light was depolarized to prevent unintentional photoselection so that measurements reflect only population dynamics, and we adjusted the power to 100 µW to avoid any multi-exciton effects. The solution was stirred with a magnetic stir bar to minimize local heating.

Nanosecond-to-microsecond Transient Absorption Spectroscopy. We used a commercial spectrometer (EOS, Ultrafast Systems) to collect TA spectra for pump-probe delay times from 0.5 ns-15 µs. The excitation beam was generated by the same method and followed the same beam path as the excitation used for the picosecond-to-nanosecond TA experiment described above. The proprietary EOS light source generates a super-continuum (400-1700 nm) probe pulse by focusing a diode laser into a photonic crystal fiber. The repetition rate of the probe pulse is 2 kHz, which is twice the repetition rate of the pump pulse, and it is triggered in sync with the pump pulse. The pump-probe delay is electronically generated and measured by an electronic timer-counter-analyzer (Pendulum). After the probe pulse passes through an 850-nm long pass filter, it is split by a beam-splitter into sample and reference beams. The sample beam was sent onto the sample, which was contained in a 2-mm quartz cuvette, and focused to a spot size of ~200 µm. The reference and sample beams are then collected in optical fibers and dispersed onto array detectors. In order to achieve reasonable signal to noise, the incident power of pump light was adjusted to 2 mW. The solution was stirred with a magnetic stir bar to minimize local heating.

We performed TA experiments, as described above, on a set of separately prepared ethylene glycol solutions of 13.2 µM PbS QDs. The compositions of these samples are described in the main text. All samples were allowed to equilibrate in the dark overnight before we took TA measurements. FIG. 18A contains a representative spectrum (extracted at 2 ps) of our TA measurements. The kinetic traces are extracted at the ground state bleach for all TA spectra. While the kinetic traces for ps-to-ns TA were fit using eq 10 in the main text, the kinetic traces for ns-to-µs TA were simply fit with a sum of three exponentials convoluted with an instrument response function (IRF), see eq 13, since the rate constant for diffusion-controlled eT does not depend $$\Delta A(t) = IRF \otimes \sum_{n=1}^{3} A_n e^{\frac{-(t-t_0)}{\tau_n}} \tag{13}$$

directly on the number of AQs that simultaneously interact with each QD.

We also performed the same experiments on the same samples with no AQ added, which we used as the "blank" controls. FIGS. 18B and 18C contains the kinetic traces (extracted at the ground-state bleach) of the control samples for both ps-to-ns and ns-to-µs TA. Our results show that the addition of Tol-SO$_3$H has negligible impact on the exciton dynamics of QDs: only up to 8% recovery, presumably due to surface-mediated charge trapping processes, shows up in the kinetics of ps-to-ns TA of QD-Tol-SO$_3$H mixtures, and completes within 5 ps, while the kinetic traces extracted from the ns-to-μs TA of QDs with different degrees of protonation satisfactorily overlay with each other. Here we simply fit the ns-to-μs kinetic traces with a sum of two exponentials convoluted with the IRF, eq 14 (see the respective fitting parameters in Table 14).

$$\Delta A(t) = IRF \otimes \left[ A_1 e^{\frac{-(t-t_0)}{\tau_1}} + A_2 e^{\frac{-(t-t_0)}{\tau_2}} \right] \quad (14)$$

TABLE 14

Fitting Parameters for the Kinetic Traces Extracted from Nano-to-Microsecond TA Spectra of PbS QDs with Different Degrees of Protonation in Their Ligand Shells.

| Sample | Nanosecond-to-Microsecond TA Kinetics | |
|---|---|---|
| | $\tau_2$ (μs) $(A_1)^a$ | $\tau_3$ (μs) $(A_2)^a$ |
| PbS QDs + 0 equiv. acid | 0.16 ± 0.04 0.16 ± 0.04 | 1.4 ± 0.04 (−0.89 ± 0.02) |
| PbS QDs + 25 equiv. acid | 0.17 ± 0.05 (−0.11 ± 0.02) | 1.5 ± 0.03 (−0.89 ± 0.02) |
| PbS QDs + 75 equiv. acid | 0.19 ± 0.06 (−0.15 ± 0.03) | 1.5 ± 0.06 (−0.85 ± 0.03) |

$^a$Error bars are fitting errors from the kinetic traces extracted (at 901 nm) from the nanosecond-to-microsecond TA spectrum of each sample, FIG. 18C.

Calculations of the Amplitude-weighted Average of Excited-state Lifetimes. We applied eq 15 to calculate the amplitude-weighted average of excited-state lifetime of the QD exciton using $$\bar{\tau} = \frac{\sum_{i=1}^{3} A_i \tau_i}{\sum_{i=1}^{3} A_i} \quad (15)$$

the time constants we measured by nanosecond to microsecond TA (see Table 13).

Calculation of the Average Number of Statically Adsorbed AQs per QD, 1. As we and others have demonstrated in the previous work,11-13 within a homogeneous QD-AQ mixture, the probability of finding a QD within the ensemble with n adsorbed AQ molecules, p (n), is well-described by a Poisson distribution, eq 16. Given that the charge separation (CS) and charge $$p(n) = \frac{\lambda^n}{n!} \times e^{-\lambda} \quad (16)$$

recombination (CR) processes within statically bound QD-AQ complexes complete in hundreds of ps (see the main text, Table 13), and assuming that each static QD-AQ pair will necessarily participate in eT upon photoexcitation (the rate of static eT typically outcompetes the rate of radiative recombination by a factor of at least 4000$_{12}$), the fraction of photoexcited QDs that have no adsorbed AQ, i.e., the fraction of these QDs that do not participate in static eT, should be equal to the fraction of the ground-state beach signal left at the end of the picosecond-to-nanosecond TA, eq 17. We normalize the kinetic trace extracted at the ground-state bleach (878 nm) to its $$p(n=0) = e^{-\lambda} = B/b_0 \quad (17)$$

minimum, B$_0$, and average the bleach signal between the time delay of 1800-3200 ps (well after CR) to obtain the value of B/B$_0$. The average number of statically adsorbed AQs per QD, λ, could therefore be calculated using eq 18. We chose to fix the value of λ in our global fits of the $$\lambda = -\ln(B/B_0) \quad (18)$$

picosecond-to-nanosecond TA kinetics (see FIG. 10B and Table 13 in the main text) in order to constrain the fits and minimize the codependence between the parameters.

Time-dependent Study of the Acid/Base Cycling Experiment. FIG. 19 contains a plot of the integrated PL intensity of the QD sample (3-mL, 10.0 μM in ethylene glycol with 10 equiv. AQ added, see FIG. 11) as a function of time after addition of acid/base. The PL intensity remains relatively constant over an hour for both cases, which suggests that the protonation/deprotonation of the QD ligand shell and the resulting change in its permeability to AQ takes place instantaneously.

The presence of electrolyte contributes to the slight enhancement in the PL of QDs. To test our hypothesis that the enhanced PL of QDs over the cycling experiment in FIG. 11 is caused by the increasing ionic strength of the solution, we tracked the integrated PL intensity of two 3-mL, 10.0 μM PbS QD samples (p=0 and p=92%, respectively, with 10 equiv. AQ added), mixed with increasing molar equivalents (0-300 per QD) of tetramethylammonium chloride (NMe$_4$Cl) salt, which we added 75 equiv. at a time, see FIG. 20. All the PL spectra are normalized to the PL of the same sample with no AQ added. The plot clearly shows that, for both fully protonated and fully deprotonated QDs, the PL intensity gradually recovers upon introducing an electrolyte at the relevant concentration.

Electrostatic-Based Proton and Acetylation Sensing Using Quantum Dots (QDs)

Many chemical/biological processes can be monitored by tracing the change of the state of electrostatic charges. We developed a general methodology for designing quantum dot (QD) probes based on mediating the charge transfer process via the electrostatic interaction between the QD surface and the acceptors. The surface of this nanoprobe is covered with three types of ligands: 1) passivating ligands that protect the QD surface and make the sensor soluble in aqueous environment, 2) ligands that can vary in their electrostatic charge in response to changes of chemical environment, 3) photoluminescence mediators that are anchored to QDs via flexible linkers and are attracted/repelled by QDs depending on their surface electrostatic potential. Based on this strategy, a probe of either pH or acetylation (it works for both) was fabricated using mercaptoalkylamine-capped QDs by decorating their surface with five equivalents of tethered electron acceptors, methyl propyl viologen (MPV$^{2+}$) (FIG. 21 and FIG. 22). Specifically, the sensor is prepared from 155 eq. polyethylene glycol thiol (PEG-thiol MW 2000), 80 eq. 6-amino-1-hexanethiol or 1-amino-8-octanethiol, and 5 eq MPV-PEG-thiol (MW 2000).

The change of the pH in the solution induces the protonation/deprotonation of the amine groups and varies the electrostatic potential of the surface. The electrostatic interaction between the MPV$^{2+}$ and the QD surface determines the average distance between them, and hence governs the rate of photoinduced electron transfer from the QD to MPV$^{2+}$, which mediates the intensity of the photoluminescence of QDs. The same sensor can also respond to the acetylation reaction of the amine groups on the QD surface. Titrating the QD sensors with sulfo-NHS-acetate in a MOPS buffer solution (pH=7.2) diminishes the PL intensity because the acetylation reaction blocks the positively-charged amine groups (FIG. 21 and FIG. 23). By replacing the mercaptoalkylamine ligands with peptides substrates which mimic the proteins in a biological system that undergo acetylation, these probes can be used to monitor the real-time level of protein acylation in vivo.

Electrostatic-Based Proton Sensing Using Quantum Dots (QDs)

We coat QDs using a mixed monolayer of dithiolate ligands with pH-responsive imidazole and electron-accepting rhodamine B (RhB) moieties, see FIG. 24. Upon protonating/deprotonating the pH-responsive imidazole groups ($pK_a$=7 in water), we modulate the electrostatic potential at the surface of QDs and, therefore, the desorption/adsorption of the electron-accepting RhB moieties, which determines the fluorescence intensity of the QD ensemble as a function of the pH of the solution. The response time of this process can potentially bypass the limit of diffusion (which is on the order of tens of nanosecond to microsecond), since the electron acceptors are covalently tethered to the surface of QDs. Modulation of the fluorescence intensity of a PbS QD via tuning the electrostatic potential at the ligand shell-solvent interface. The third component of the QD ligand shell, which consists of mercaptopolyethylene glycol 2000 or polyethylene glycol-2000-derivatized dihydrolipoic acid, solubilizes the QDs in water, and is omitted for clarity.

We claim:

1. An environmental sensor comprising:
   (a) a photoluminescence quencher and
   (b) a nanoparticle comprising a photoluminescent core and plurality of charged ligands bound to the core and forming a quencher permeable ligand shell surrounding the core
   wherein each of the charged ligands comprises a charged moiety capable of being modulated between a first state and a second state and an anchoring group for binding the ligand to the core, and
   wherein the permeability of the ligand shell is determined by the proportion of the ligands in a first state and a second state.

2. The sensor of claim 1, wherein the first state is a first protonation state and the second state is a second protonation state.

3. The sensor of claim 1, wherein the first state is an acetylated state and the second state is a deacetylated state.

4. The sensor of claim 1, wherein the first state is an ion-paired state and the second state ion-unpaired state.

5. A method for environmental monitoring, the method comprising:
   (a) contacting an environmental sensor with a molecular environment, the sensor comprising:
      (i) a photoluminescence quencher and
      (ii) a nanoparticle comprising a photoluminescent core and plurality of ligands bound to the core and forming a quencher permeable ligand shell surrounding the core
         wherein each of the ligands comprises a charged moiety or a reactive moiety capable of being modulated between a first state and a second state and an anchoring group for binding the ligand to the core, and
         wherein the permeability of the ligand shell is determined by the proportion of the ligands in a first state and a second state,
   (b) irradiating the sensor, and
   (c) detecting a photoluminescent signal.

6. The method of claim 5, wherein the molecular environment comprises a reactant capable of generating a product and wherein the product is capable of reacting with the reactive moiety to modulate the reactive moiety between the first state and the second state.

7. The method of claim 6, wherein the product is $H^+$, $OH^-$, an acid, or a base.

8. The method of claim 5, wherein the molecular environment comprises a reactant capable of generating a product and wherein the reactant is capable of reacting with the reactive moiety to modulate the reactive moiety between the first state and the second state.

9. The method of claim 8, wherein the reactant comprises $H^+$, $OH^-$, an acid, a base, an acetyl, a methyl, a phosphoryl, carboxyl, hydroxyl, or amine.

10. The method of claim 5, wherein the molecular environment comprises an ion capable of pairing with the charged moiety to modulate the charged moiety between the first state and the second state.

11. The method of claim 10, wherein the ion comprises a member selected from the group consisting of ammonium, imidazolium, pryidinium, pyrrolidinium, phosphonium, sulfonium, and any combination thereof.

12. The sensor of claim 1, wherein the nanoparticle further comprises a diluent ligand, a solubilizing ligand, or both the diluent ligand and the solubilizing ligand.

13. The sensor of claim 1, wherein the reactive ligand comprises a radical of formula A-T-R,
   wherein A comprises the anchoring group and the anchoring group is selected from the group consisting of a alkylmonothiolate, a alkyldithiolate, or an alkyl trithiolate,
   wherein R comprises the charged moiety selected from the group consisting of a carboxyl, a hydroxyl, a sulfo, a sulfhydryl, a phosphoryl, a phosphate, and a conjugate base thereof or the charged moiety selected from the group consisting of a substituted or unsubstituted amine or alkylamine, a substituted or unsubstituted imidazole, a substituted or unsubstituted benzimidazole, a substituted or unsubstituted pyrimidine, a substituted or unsubstituted purine, a substituted or unsubstituted pyridine, a substituted or unsubstituted pyrrolidine, and a conjugate acid thereof, and
   wherein T comprises a tether comprising —$(CH_2)_n$— where n is an integer and n=1-15, —$(CH_2)_n(CONH)(CH_2)_m$— where n and m are integers and n+m=1-15, or —$(OCH_2CH)_n$— where n is an integer and n=1-100.

14. The sensor of claim 1, wherein the sensor further comprises a flexible tether for tethering the quencher to the nanoparticle.

15. The sensor of claim 1, wherein the quencher comprises an anionic charge or cationic charge.

16. The sensor of claim 1, wherein the quencher comprises 9,10-anthraquinone-2-sulfonate, rhodamine B, or methyl propyl viologen.

17. The sensor of claim 1, wherein the quencher comprises a radical of formula A-T-Q,
   wherein A comprises the anchoring group and the anchoring group is selected from the group consisting of a alkylmonothiolate, a alkyldithiolate, or an alkyl trithiolate, wherein Q comprises an aromatic moiety capable of accepting an electron from the core, and wherein T comprises a tether comprising $-(CH_2)_n-$ where n is an integer and n=1-15 $-(CH_2)_n-,-(CH_2)_n(CONH)(CH_2)_m-$ where n and m are integers and n+m=1-15, or $-(OCH_2CH_2)_n-$ where n is an integer and n=1-100.

18. The sensor of claim 17, wherein the aromatic moiety comprises 9,10-anthraquinone-2-sulfonate, rhodamine B, or methyl propyl viologen.

* * * * *